US005675382A

United States Patent [19]

Bauchspies

[11] Patent Number: 5,675,382

[45] Date of Patent: Oct. 7, 1997

[54] SPATIAL COMPRESSION AND DECOMPRESSION FOR VIDEO

[75] Inventor: Roger A. Bauchspies, San Mateo, Calif.

[73] Assignee: Connectix Corporation, San Mateo, Calif.

[21] Appl. No.: 630,431

[22] Filed: Apr. 8, 1996

[51] Int. Cl.[6] .......... H04N 1/419

[52] U.S. Cl. .......... 348/390; 348/384; 348/391; 348/393; 348/386; 358/261.1; 375/240; 382/166; 382/246

[58] Field of Search .......... 348/384, 387, 348/390, 393, 394, 397, 405; 358/261.1, 427, 523, 524; 382/166, 232, 246, 281

[56] References Cited

U.S. PATENT DOCUMENTS

| | | | |
|---|---|---|---|
| 4,598,372 | 7/1986 | McRoberts | 364/514 A |
| 4,785,349 | 11/1988 | Keith et al. | 348/390 |
| 4,835,607 | 5/1989 | Keith et al. | 348/390 |
| 4,868,653 | 9/1989 | Golin et al. | 348/390 |
| 4,939,583 | 7/1990 | Tsuboi et al. | 358/261.1 |
| 5,123,059 | 6/1992 | Hirosawa et al. | 382/272 |
| 5,220,325 | 6/1993 | Ackland et al. | 341/67 |
| 5,389,965 | 2/1995 | Kuzma | 348/14 |
| 5,400,075 | 3/1995 | Savatier | 348/384 |
| 5,528,628 | 6/1996 | Park et al. | 375/240 |

*Primary Examiner*—Tommy P. Chin

*Assistant Examiner*—Frank Snow

*Attorney, Agent, or Firm*—Flehr Hohbach Test Albritton & Herbert LLP

[57] ABSTRACT

A spatial compression and decompression system for color video data wherein a video stream is generated by a charge-coupled device with red, green and blue pixel elements. In a first compression stage, the 5-bit color data from each element is processed in turn. This step involves reading out from a lookup memory a 3-bit category (or compressed value) and 5-bit output value based on the 5-bit color data, a 5-bit previous value that represents same color data for a neighboring pixel and a 1-bit table select signal that determines in which of two similar tables the lookup is performed. The 3-bit category data for a pixel's three elements are combined and used as a 9-bit index into a Huffman table that performs the second stage of compression. Each Huffman table entry includes a variable-length Huffman code that represents more common categories with fewer bits, which provides additional compression over the first stage. The Huffman table reads out the code of the particular 9-bit category used for the lookup. This code is packed into an output buffer and transmitted to the decompressor that will unpack for display or store the resulting compressed data stream. In the first decompression stage, each Huffman code in the compressed data stream is decoded using no more than two compares and one table lookup into an inverse Huffman decode table. The resulting 9-bit category is used as an index into one of two similar inverse lookup tables, which outputs the appropriate 16-bit uncompressed data value.

8 Claims, 12 Drawing Sheets

SPATIAL COMPRESSION AND DECOMPRESSION FOR VIDEO

The present invention relates generally to video compression systems, and particularly to systems that perform spatial video compression (i.e., compression within a single video frame) for color video data.

BACKGROUND OF THE INVENTION

It takes an enormous amount of bandwidth to process, store or transmit high-resolution, full-color digital video data at acceptable frame rates. For example, assuming a video source with a resolution of 320 by 240 pixels (corresponding to VGA resolution) and 16-bit pixel data, one frame of color video data takes up 1,228.8 Kbits (320×240×16). Assuming the video source provides 12 frames per second at this resolution, systems that display or store the video data must have a bandwidth of at least 14.746 Mbits per second. Common transmission systems (telephone lines and 28.8 Kbit per second modems) and storage media (hard disk drives with typical real-world storage rates of no more than 10 Mbits per second) do not have this capability. Consequently, there is a need for systems that compress high-resolution video data so that it can be stored and transmitted more easily.

There are two classes of video compression systems. Systems that perform temporal compression shrink the amount of video data by detecting similarities between corresponding pixels in subsequent video frames and encoding the redundant information so it takes up less space on transmission or storage. In contrast, systems that perform spatial compression reduce the amount of data needed to represent a single frame of video by detecting regions within the frame with similar pixel data and compressing the video data corresponding to those regions. The present invention does not perform temporal compression; therefore we will only address prior art spatial compression systems.

Prior art spatial compression systems take a variety of approaches to generating compressed video data. However, before performing any data compression, the vast majority of spatial compression systems first quantify the similarity between each pixel and its neighboring pixels (the neighboring pixels can be one or more pixels). When the video data is monochrome, this first step involves a simple comparison of the grey levels of the neighboring pixels. When the video being compressed is color, where each pixel is made up of three elements responsive to at least three complementary colors (e.g., red, green and blue), the prior art evaluates the similarities between individual element data rather than between pixels as a whole. These prior art systems then separately compress the element data based on the similarities between the individual elements.

For example, a class of video compression systems that perform run-length encoding (RLE) map the similarity data for each pixel element into an encoded value whose length is a function of the similarity data (i.e., similar elements are assigned encoded values with small lengths, resulting in data compression). Another class of compression systems use discrete cosine transforms (DCTs) to represent regions of elements with small frequencies (i.e., regions where there is little change across elements) with small values that generally have fewer bits than the same regions in the uncompressed image.

One problem with these prior art systems is that they tend to produce compressed data streams that, when decoded and displayed, result in images that have pronounced color banding. This is because the prior art spatial compression systems force groups of neighboring pixels to the same color, even if there is a color gradient across those pixels. This is partly because the prior art systems use only one function or table to encode each element's similarity data. Therefore, there is also a need for a color video compression system that does not produce color banding in images displayed from decompressed data.

Another problem with the prior compression systems (especially the RLE systems) is that for random images (i.e., images with little or no correlation between neighboring pixel elements), they are likely to produce a "compressed" video stream that is actually longer than the original video stream. This is the case because the lack of similarity between random neighboring elements causes the RLE systems to generate uniformly long codes for all of the elements. This can even occur in RLE systems for real-world data. Therefore, there is also a need for a video compression system that is guaranteed to produce compressed data streams that are no bigger than the initial video stream for all possible images.

Finally, even if the prior art systems were able to provide the aforementioned features, they would still be too slow to compress and then decode highly detailed video data at acceptable frame rates. This is because the encoded data provided by the prior art compression systems is structured so that it can only be decoded bit-by-bit or in time-consuming pattern matching (in the RLE case). For example, one prior art method of compressing data, called Huffman coding, relies on a statistical analysis of the similarity data to produce encoded (compressed) data where each encoded datum has a length that is related to the likelihood of occurrence of its associated similarity data. That is, if a certain piece of similarity data occurs frequently in a set of images, it would be associated with a Huffman code of relatively few bits. This Huffman coding process generates a compact compressed video stream that preserves much of the detail in the original images (even though it too can be longer than the original data stream for random images). However, systems that employ Huffman coding decode the stream of Huffman codes bit by bit, using a Huffman decode tree that represents the space of possible Huffman codes and their associated decoded values. Thus when a particular Huffman code happens to be many bits long (e.g. 16-bits), decoding that code using a tree approach would take equally many (e.g., 16) steps.

Therefore, there is also a need for a spatial compression and decompression system for color video that provides the aforementioned advantages and is also fast enough to provide the necessary decompression bandwidth.

SUMMARY OF THE INVENTION

The present invention is an improved system for compressing and decompressing color video data that meets the needs set out above. More particularly, the present invention is a video compression system for compressing a digital video stream of N-bit datums, each of which corresponds to one pixel in a video image with an associated column index (i) and row index (j) and including Q M-bit subcomponents representing respective source values of Q elements of the one pixel. The elements of the present invention include two lookup tables that are used to perform the first stage of data compression, an address circuit, an output circuit and a state machine that controls the other elements.

The first lookup table includes at least $2^{2M}$ entries, each of which stores a P-bit first category value and a M-bit first output value and is uniquely associated with a M-bit previous value and a M-bit source value. This table is configured to read out a first particular entry's first category and output values upon receiving a readout address assembled from the first particular entry's associated previous and source values and a first table select signal. The first category read out of the first lookup table represents a compressed version of the source value used in the lookup. Like the first table, the second lookup table has at least $2^{2M}$ entries, each of which stores a P-bit second category value and a M-bit second output value and is uniquely associated with a M-bit previous value and a M-bit source value. As with the first table, the second lookup table is configured to read out a second particular entry's second category and output values upon receiving as a readout address the second particular entry's associated previous and source values and a second table select signal. Note that the rows of the second lookup table are a reflection of corresponding rows of the first lookup table about the columns of those corresponding first table rows for which the first category is 0. The second category read out from the second table represents a compressed version of the associated source value used for the lookup.

The address circuit is coupled to the lookup tables and computes the previous value that is input to those tables as part of the lookup address. The address circuit computes the previous value as a function of the output values of selected, previously-processed pixel elements according to a first formula when the first table select signal is available and according to a second formula when the second table select signal is available. The output circuit is also coupled to the lookup tables and is configured to receive and store the P-bit category values for all of the Q elements of the one pixel currently being processed. This output circuit is also configured to output a single Q×P-bit combined category that encapsulates the Q category values for the current pixel. Given that Q×P is smaller than N, which is the size of one pixel's worth of video data, the combined category is guaranteed to be a compressed version of the original pixel.

These elements are controlled by the first state machine, which, among other things, provides the first table select signal and the second table select signal so that the first and second lookup tables and the first and second formulas are used to readout the category and output values for alternating pixels. This use of different lookup tables and formulas for alternating pixels reduces color banding in video images that are reconstructed from the combined category information. The first state machine also triggers the output circuit to store and output the Q×P-bit combined category for the one pixel being currently processed.

The video compression system of the present invention can also include a Huffman encode table having at least $2^{Q \times P}$ entries, which performs the second stage of data compression. Each of the Huffman encode table entries includes a Huffman data field for storing a variable-length Huffman value for one of the combined categories and a Huffman bits field for storing a Huffman bit count representing the total bits in the associated Huffman value. The Huffman encode table, which is coupled to the output circuit, reads out the Huffman value and Huffman bit count associated with the entry whose address matches the combined category output by the output circuit. The Huffman values are allocated to the combined categories so that the combined categories that are more likely to occur in a video frame are allocated to Huffman values having fewer bits. By reducing the size of the most likely combined categories in this fashion, the Huffman table is able to provide additional data compression of data above that provided by the first lookup table. Additionally, the Huffman encode table is structured so that it never outputs a Huffman value that is longer than the N-bits in a video stream datum, which ensures that the compressed video stream is no larger, even in the worst case of random images, than the original video stream.

The compressed data stream generated by the first and second compression stages is decompressed in two stages. The first stage of decompression is performed by a Huffman decode table that receives and decodes the compressed data stream in X-bit chunks, where X represents the number of bits in the longest possible Huffman value. The compressed data stream includes plural compressed datums, each of which corresponds to one of the Huffman values read out from the Huffman table in the second compression stage. Each chunk is structured so that it includes at least one of these Huffman values aligned with the most significant bit position of the chunk.

The Huffman decode table has at least $2^X$ entries, each including combined category and Huffman bits data associated with a Huffman value that is mapped to the entry's X-bit address. The Huffman decode table is configured to read out this combined category and Huffman bits data in whatever entry is indexed by the fixed-length chunk input to the Huffman decode table. The Huffman decode table is structured so that a set of Huffman decode table entries with X-bit addresses whose most significant Z bits match a Z-bit Huffman value includes the same combined category data and Huffman bits data. This same data is identical to the combined category and Huffman bits data associated with the Z-bit Huffman value in the Huffman table that performs the first stage of compression. Thus, the same data is read out from any one of the entries when the most significant Z bits of the fixed length chunk match the Z bits, thereby allowing Huffman data to be decoded in a single lookup.

The present invention also includes a final decompression stage wherein two inverse lookup tables are used to convert individually the Q, P-bit categories output by the Huffman decode table into a corresponding output value based on a previous pixel value. The two inverse lookup tables correspond to the two lookup tables used in the first stage of compression and are respectively used to decompress category data for alternating pixels.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
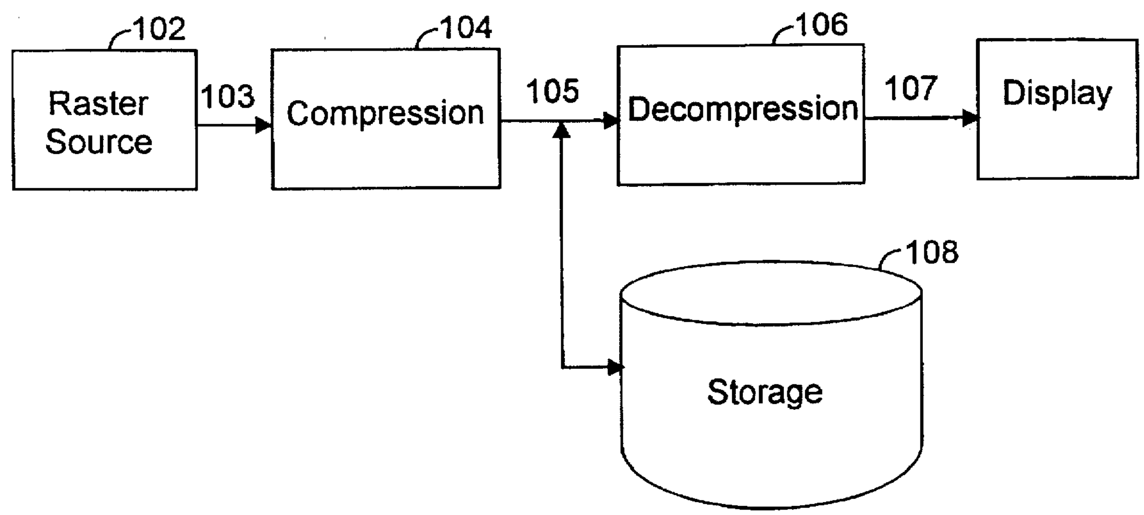
FIG. 1 is a block diagram of the video compression-decompression system of the present invention.

Referring to FIG. 1, there is shown a high-level block diagram that illustrates the environment in which the present invention operates. A conventional rasterizing video source 102 (such as a TV or video camera) generates a video data stream 103 that is input to a video compressor 104. The compressor 104 compresses the data in the data stream 103 (i.e., reduces the number of bits required to represent each frame of the original video image) and generates a corresponding compressed data stream 105 that can be transmitted or stored much more efficiently than the uncompressed video stream 103. For example, the compressed data stream 105 can be written to a storage device 108 for later use. The compressed stream 105 can also be transmitted to a decompressor 106 that reverses (to some extent) the compression process and generates a decompressed data stream 107 that approximates the original data stream 103. A display can make use of the decompressed data stream 107 to display an approximation of the original image scanned by the raster source 102.

Figure 2:
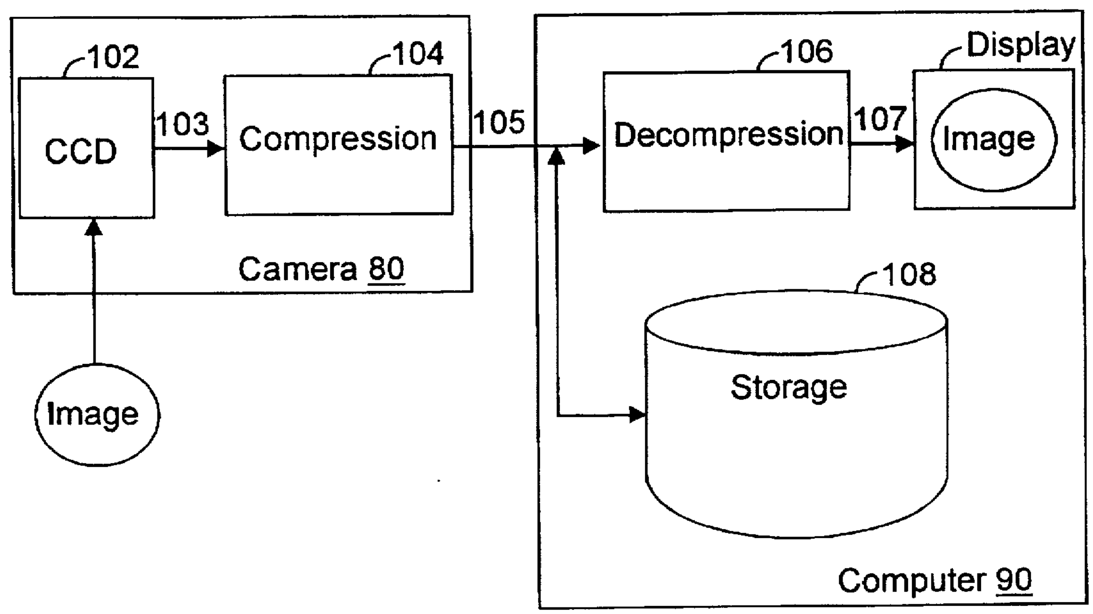
FIG. 2 is a block diagram of the video-compression-decompression system of the present invention as implemented in a digital video camera.

Referring to FIG. 2, there is shown a block diagram that illustrates a preferred embodiment of the present invention in which the raster source 102 is a charge-coupled device (CCD) and in which the video compressor 104 is combined with the CCD 102 in a video camera 80 and the optional storage 108, decompressor 106 and display are combined in a separate computer 90 coupled to the camera. In this embodiment, the CCD 102 scans an image (image) and outputs a corresponding 16-bit digital video stream 103 to the compressor 104. The operations of the CCD 102 and the structure of the 16-bit video stream 103 it generates are now described in greater detail in reference to FIG. 3.

Figure 3:
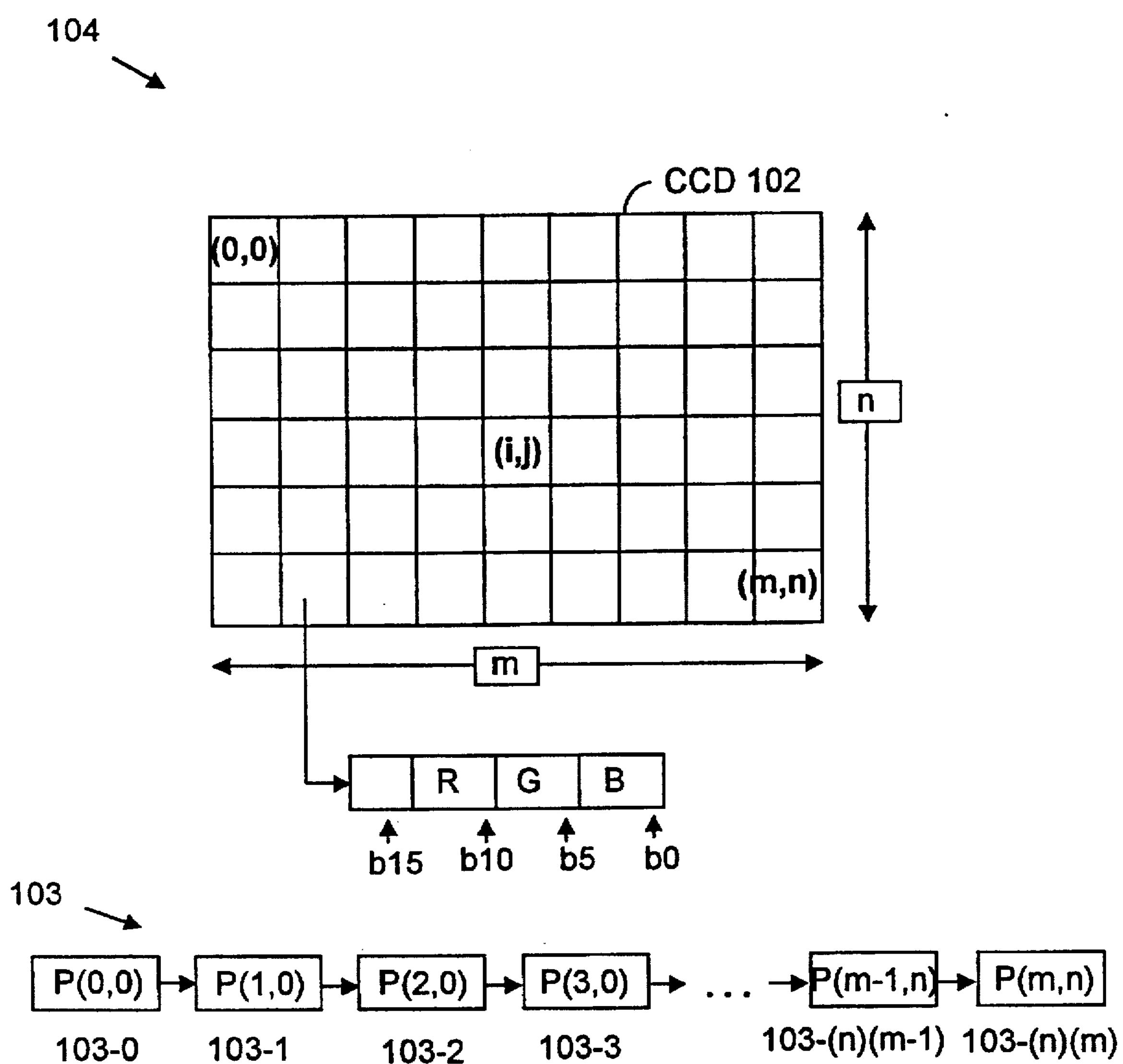
FIG. 3 depicts the structure of a typical video image and a corresponding video stream that is input to the video compression hardware.

As shown in FIG. 3, the CCD 102 scans an image using a grid of m by n pixels (short for picture cells), each of which has an associated index (i,j). For the purposes of this application, pixel(0,0) is in the top left corner of the CCD 102 and pixel(m,n) is in the lower right corner. Each of the pixels is made up of multiple elements, each sensing a different part of the visual spectrum. In the preferred embodiment, each pixel of the CCD 102 includes three pixel elements sensitive, respectively, to red (R), green (G) and blue (B) light. However, the present invention could function equally well with other types of CCDs, such as a CCD 102 having multiple pixel elements sensitive, respectively, to cyan (C), yellow (Y), and magenta (M) wavelengths; or a monochrome CCD.

The CCD 102 represents the signal detected at each pixel using a 16-bit video stream datum **103*i*. Five bits of each datum 103*i* are used to encode the signal strength from a particular pixel element (R, G or B). The final bit (b15) is reserved for other purposes and is not used in the present invention. The CCD 102 rasterizes the scanned image by generating a video stream 103 wherein the individual 16-bit video datums 103*i* appear in a fixed order. For example, in the preferred embodiment, the CCD 102 reads out its scanned data row by row starting from pixel(0,0), corresponding to a datum 103-0, and ending with pixel(m,n), corresponding to a datum 103-(m)(n). The CCD 102 repeatedly scans and reads out image data at a fixed frame rate (FR). However, because the present invention is concerned only with spatial video compression (i.e., intra-frame data compression), this application will not focus on frame to frame processing. Also, depending on the processing capacity of the end user, the resolution (i.e., n and m) of the CCD 102** can be varied.

Referring again to FIG. 2, from the video stream 103, the compressor 104 generates a compressed data stream 105 wherein each datum **105*i* comprises an indeterminate number of bits and corresponds to one of the 16-bit datums 103*i* from the video stream 103. Even for the worst case scenario (a image in which there is no correlation between adjacent datums 103*i*), the compressor 104 is guaranteed to generate a compressed data stream 105** that uses no more bits to represent a given video frame than the original video image, which is not the case in prior art video compression systems.

The compressed data stream 105 generated by the compressor 104 is output by the camera 80 to the computer 90, where it can be processed by the decompressor 106 and/or stored in the video storage unit 108. From the compressed data stream 105, the decompressor 106 generates a 16-bit decompressed video stream 107 that approximates the original video stream 103. Because of the structure of the individual datums **105*i*, which is a key feature of the present invention, the decompressor 106 is able to generate the decompressed video stream 107 with speed and efficiency that are not possible with prior art decompression techniques. Based on the decompressed video stream 107, the display can display a redisplayed image (image') that resembles the original image (image). How well the redisplayed image (image') resembles the original image (image) is inversely related to the level of compression performed by the compressor 104. I.e., high compression levels result in degraded image quality and vice-versa. However, high compression levels are also related to increased efficiencies in video stream transmission and storage. The compressor 104 of the present invention balances these opposing factors by providing the highest possible compression at the greatest possible speeds while retaining acceptable redisplayed image quality. For example, the compressor 104 of the present invention can achieve 50 percent compression levels with absolutely no loss of video quality, either perceived (meaning what the user sees) or actual (meaning the content of the decompressed video stream 107 as compared to the original video stream 103). The compressor 104** can also achieve even higher levels of compression (e.g., up to five to one) with little loss in apparent quality to the viewer of the reconstructed image (image'). How this is accomplished in the present invention is now described in reference to FIG. 4A.

Figure 4A:
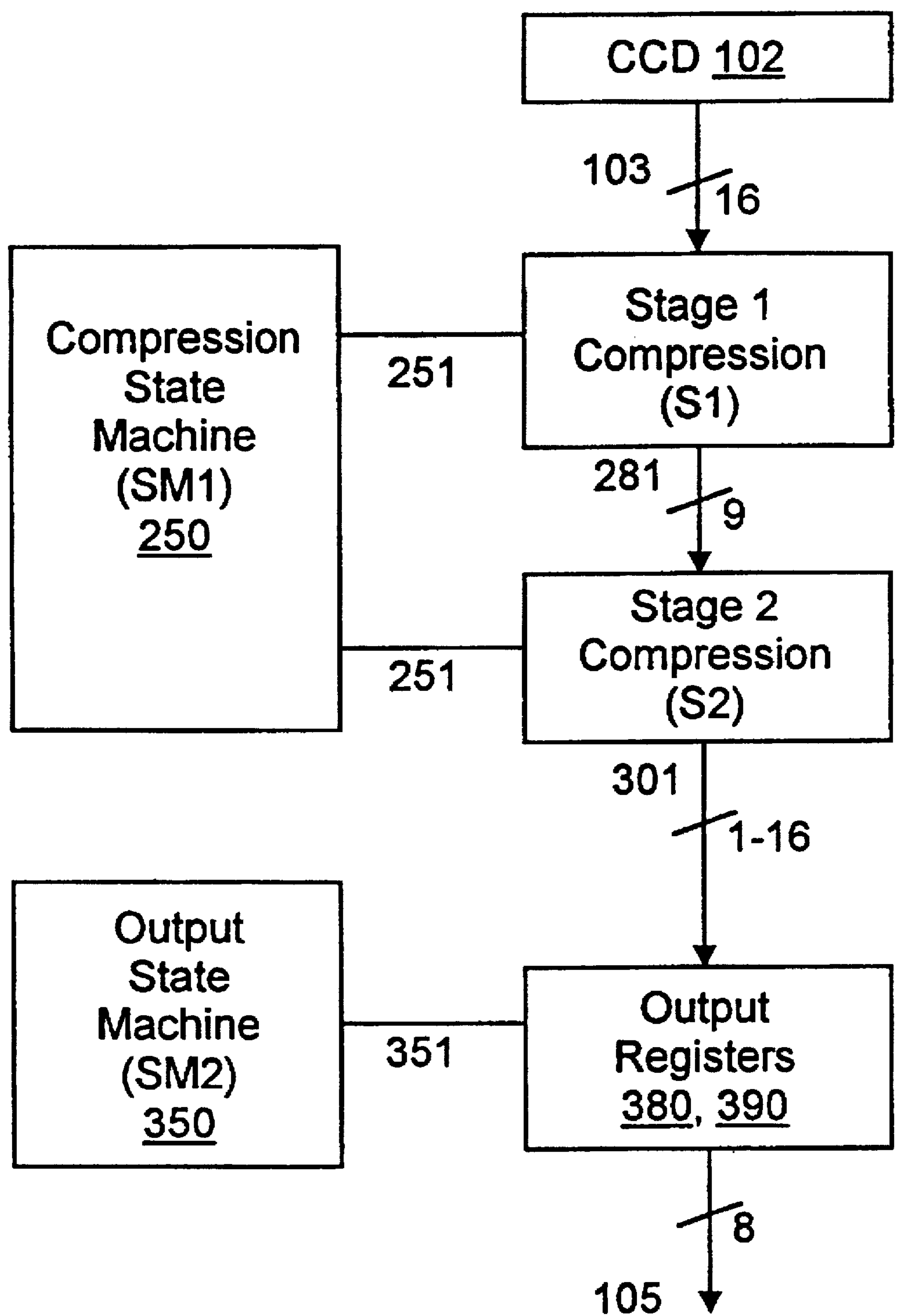
FIG. 4A is a functional block diagram of the video compression system of the present invention.

Referring to FIG. 4A, there is shown a functional block diagram of the compressor 104, which performs video compression in two stages. The first compression stage (S1) compresses the 16-bit data stream 103 from the CCD 102 into a stage 1-compressed stream 281 in which the datums 281*i* (each corresponding to one 16-bit datum 103*i*) are only 9-bits in length. Thus, the first stage S1 compresses the input data stream 103 by a ratio of 16 to 9 (16:9). In the second stage (S2), the 9-bit datums 281*i* are converted to Huffman datums 301*i* with a variable length that is inversely related to the likelihood of their occurrence. I.e., 9-bit datums 281*i* whose bit pattern occurs frequently are represented by S2 as Huffman datums 301*i* with a small number of bits (e.g. as few as 1 or 2 bits), and datums 281*i* whose content occurs infrequently are represented by S2 as Huffman datums 301*i* using a larger number of bits (e.g. as many as 13 to 16 bits). This means that some of the 9-bit datums 218*i* are actually expanded in the second compression stage (S2). However, because the most likely 9-bit patterns in the datums 281*i* are associated with Huffman datums 301*i* of very few bits, for typical images (where there is high degree of correlation between adjacent pixels) high levels of compression are achieved by stage 2 compression (S2). Moreover, because a Huffman datum 301*i* can have no more than 16 bits, it is guaranteed that the stage 2-compressed stream 301 generated by the second compression stage S2 will never be larger than the input data stream 103 for a given frame of video data. These two stages of video compression are performed under the control of a compression state machine (hereinafter referred to as SM1) 250 using multiple control signals 251.

The Huffman datums 301*i* are output to a set of output control registers 380, 390, which collectively pack the datums 301*i* into 8-bit chunks 105*i* that form the compressed output data stream 105. Under control of the output state machine (SM2) 350, these 8-bit chunks 105*i* are output to the decompressor 106 as needed. Because of the variability in length of the Huffman datums 301*i*, each 8-bit chunk could include multiple datums 301*i* (e.g., 4 datums 301, each 2 bits in length) or fewer than one datum (e.g., when the compressed datum 301*i* is longer than 8 bits). These functional blocks are now described in greater detail in reference to FIG. 4B.

Figure 4B:
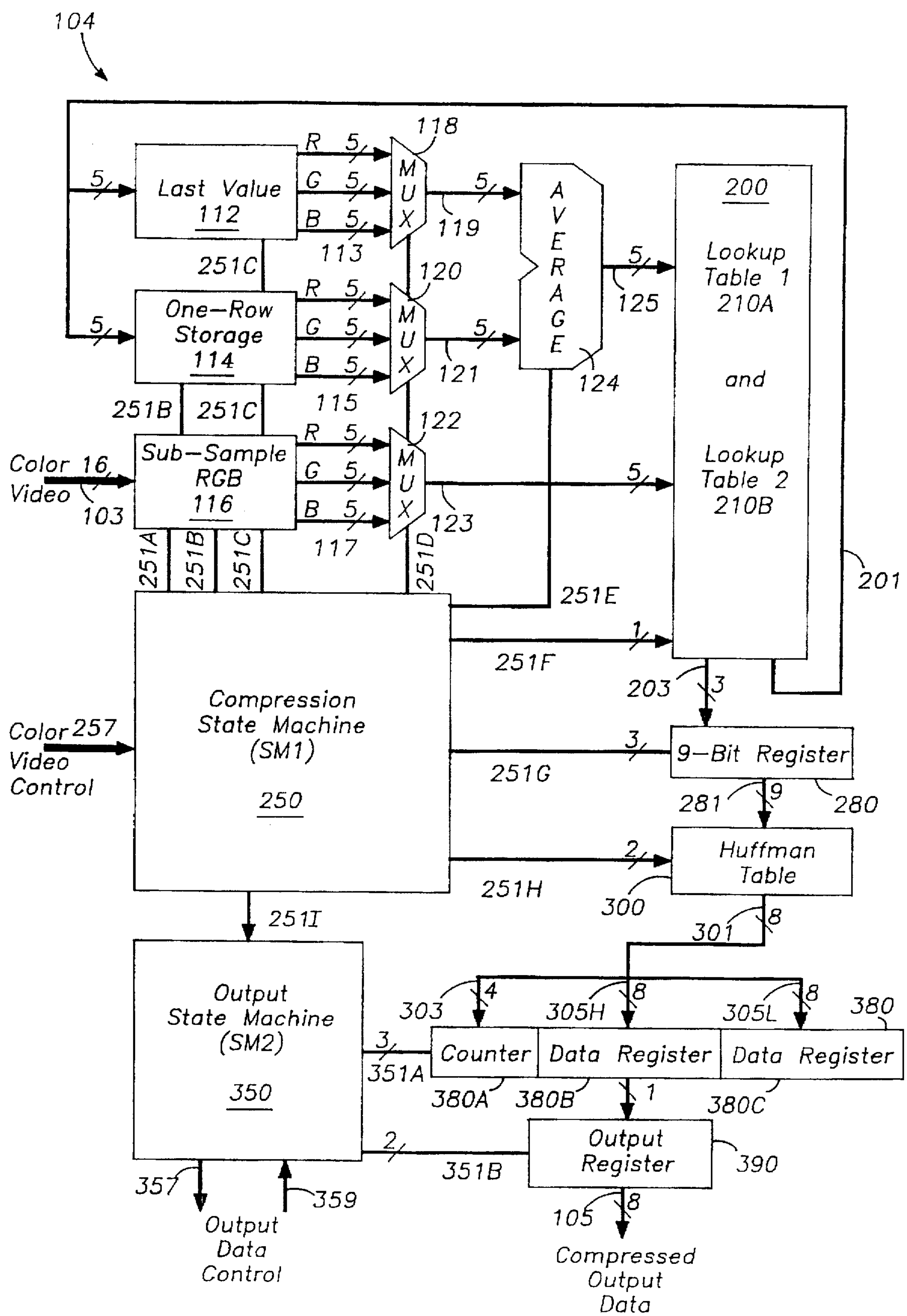
FIG. 4B is a hardware block diagram of the video compression system of the present invention.

Referring to FIG. 4B, there is shown a hardware block diagram of the compressor 104. The elements of FIG. 4B that carry out the stage 1 compression described in reference to FIG. 4A include a sub-sampler 116, one-row storage 114, last value storage 112, multiplexers 118, 120, 122, an averager 124, a lookup table memory 200 and a 9-bit register 280. The operation of these elements is controlled by the compression state machine SM1 250 using multiple control signals 251. These signals include the following:

| signal | output to | description |
|---|---|---|
| 251A | Sub-Sampler 116 | decimate (1-bit) |
| 251B | One-Row storage 114 | R/W address (9-bits) |
| 251C | One-Row storage 114<br>Last Value Register 112 | R/W strobe (3-bits) |
| 251D | MUXes 118–22 | RGB select (2-bits) |
| 251E | Averager 124 | carry-in (1-bit) |
| 251F | Lookup Table Mem. 200 | lookup table select (1-bit) |
| 251G | 9-Bit Register 280 | load red (1-bit)<br>load green (1-bit)<br>load blue (1-bit) |

External inputs supplied to the first stage elements include the video stream 103 to be compressed, which is coupled to the sub-sampler 116, and a color video control signal 257 from the CCD 102 controller (not shown) that indicates to the SM1 250 when a new video stream datum 103*i* is available from the CCD 102. Outputs supplied by the first stage elements include the 9-bit datums 281*i* from the 9-bit register 280. The operation of these first stage compression elements is now briefly described. A fuller description is provided below, in reference to FIGS. 5–8.

The sub-sampler 116 samples the 5-bit red, green and blue data for a particular video stream datum 103*i* (representing one pixel) and outputs the sampled data 117 to the multiplexer 122 as three selectable color groups 117R (red data), 117G (green data), 117B (blue data). The multiplexer 122 selects one of the groups 117R, 117G or 117B and outputs the 5-bits of selected data to the lookup table memory 200 as a 5-bit source value 123. This 5-bit source value 123 is combined with a 5-bit previous value 125 output by the averager 124 and a 1-bit table select signal 251F output by the SM1 to form an 11-bit address that is coupled to the address lines of the lookup table memory 200.

The lookup table memory 200 includes two lookup tables 210A and 210B, each storing $2^{10}$, 8-bit entries, each of which includes a 3-bit output category value 203 and a corresponding 5-bit output value 201. Upon receiving a new 11-bit address, the lookup table memory 200 selects the table 210A, or 210B designated by the 1-bit table select signal 251F and reads out from the selected table 210A or 210B the 5-bit output value 201 and 3-bit category value 203 stored in the entry addressed by the combined 5-bit source and previous values 123, 125.

The 3-bit category value 230 read out by the lookup memory 200 is output to the 9-bit register 280, which stores the 3-bit category 203 in a three bit segment designated by the red, green or blue register select signals 251G generated by the SM1 250.

The 5-bit output value 201 read out by the lookup memory 200 is output to the last value register 112 and the one-row storage 114. The last value register 112 is a 15-bit register with three 5-bit segments for storing red (R), green (G) and blue (B) data for a single pixel P(i,j). The last value register 112 stores the 5-bit output value 201 in the R, G or B segment designated by the SM1 in the 3-bit read/write strobe 251C. The last value register 112 reads out all 15 bits whenever the SM1 sets the read/write strobe 251 to all zeros.

The one-row storage 114 is a 15-bit memory with m entries (m=320 in the preferred embodiment), each of which stores the 5-bit red, green and blue output values 201 for the most recently processed row of pixels. For example, assuming that the latest sampled datum 117*i* corresponds to a pixel P(i,j), the row of pixels stored by the one-row storage 114 comprises all of the sampled datums 117*i* representing pixels between the pixel P(i,j−1) and the pixel P(i−1, j). The one-row storage 114 stores the 5-bit output value 201 at the location designated by the 9-bit address 251B output by the SM1. This 9-bit address 251B corresponds to the column index (i) of the latest sampled Pixel P(i,j). The 2-bit read/write strobe 251C asserted by the SM1 determines in which segment (R, G or B) of the addressed location the 5-bit output value 201 is stored. As with the last value storage register 112, the one row storage 114 outputs all 15-bits of the entry at the 9-bit address 251B when the SM1 sets the read/write strobe 251B to zero. The read is stored before the write so the old data is used before it is overwritten by the new 201.

The 15-bit value 115 read out by the one-row storage 114 provides the red, green and blue data for the previously scanned pixel that lies directly above (or as close to directly above as possible) the pixel whose video data 103*i* is being processed. For example, assuming every video datum 103*i* is sampled by the sub-sampler 116 and the pixel being processed is the pixel P(i,j), the data 115 output from the last value storage would be from the pixel P(i, j−1)). The 15-bit last value 113 read out by the last value register 112 corresponds to the red, green and blue data for the pixel processed immediately before the current pixel. For example, assuming the same scenario as above, the last value 113 would be from the pixel P(i−1, j) (i.e., the pixel to the immediate left of the pixel being processed). One color is selected from these 15-bit values by the MUXes 118, 120 in response to the color select signal 251D provided by the SM1. The resulting 5-bit values 119, 121 output by the MUXes are averaged (i.e., added and then divided by two) by the averager 124, which outputs the result as the 5-bit previous value 125. The averager 124 is also coupled to the carry-in signal 251E provided by the SM1 250. When the SM1 250 asserts the carry-in signal, instead of computing the simple average just described, the averager 124 adds 1 to the sum of the values 119 and 121 before dividing by two.

The Huffman table 300, under control of the SM1 250, carries out the stage 2 compression described in reference to FIG. 3A. The Huffman table 300 is a memory with $2^9$, 20-bit entries, each of which provides 4-bits for a Huffman bit count 303 and 16-bits for a Huffman value 305. The 4-bit count 303 indicates how many of the other 16-bits are actually used for the Huffman value 305. The address lines of the Huffman table 300 are coupled to the 9-bit category data 281, which provides the address of the 20-bit Huffman data to be read out by the Huffman table 300. The 20-bit Huffman data 303, 305 is read out in 8-bit chunks 301 to the holding register 380 in the order indicated by the 2-bit read control signal 251H, which is provided by the SM1 250. For example, the SM1 250 cycles the 2-bit read signal 251H through three different values that cause the Huffman table 300 to output the low eight bits of the Huffman data 305L, the high eight bits of the Huffman data 305H and finally the Huffman bit count 303. When the Huffman data 301 is about to be read out, the SM1 250 outputs a Huffman data ready signal 251I to the output state machine SM2 350 that tells the SM2 350 to initiate an output step.

The elements that perform the output step described in reference to FIG. 3A are the 20-bit holding register 380, which receives and stores the 8-bit Huffman data 301*i*, and the 8-bit output register 390, which packages the variable length Huffman values 305 for inclusion in the compressed video stream 105. The elements 380, 390 are controlled by the output state machine (SM2) 350 via the following control signals 351A, 351B:

| signal | output to | description |
|---|---|---|
| 351A | Holding Register 380 | HR load select (3-bits)<br>Shift-out strobe (1-bit)<br>Register empty strobe (1-bit) |
| 351B | Output Register | Shift-in strobe (1-bit)<br>Output full strobe (1-bit) |

External data control signals that flow between the SM2 350 and the microprocessor (not shown) that controls the camera 80 include a data_ready_signal 357 output by the SM2 and an acknowledge (ACK) signal 359 output by the microprocessor. When the output register 390 is full, the SM2 350 asserts the data_ready_signal 357. In response, after the data has been accepted, the microprocessor asserts the ACK signal 359, upon which the SM2 350 empties the output register 390.

The holding register 380 loads the 8-bit datum 301-*i* from the Huffman table into the register segment indicated in the 3-bits of the 3-bit holding register (HR) load select signal 351A. The HR load signals 351A are timed by the SM2 350 so the holding register 380 segments 380A, 380B, 380C are loaded in the same order that the 8-bit Huffman data chunks 301 are read out. I.e., the Huffman bit count 303 and the Huffman high and low segments 305H, 305L are respectively loaded into the holding register segments 380A, 380B and 380C. The SM2 350 uses the fourth bit of the HR load signal 351A to tell the holding register 380 to shift out one bit 181 of the Huffman value 305 stored in the segments 380B, 380C. The 8-bit output register 390 shifts-in the one bit 181 in response to the shift-in control signal 351B and outputs its contents as a compressed datum 105*i*.

Having generally described the functionality and interaction of the elements of FIG. 4B, additional details are now provided for certain of these elements, including the sub-sampler 116, the lookup tables 210A and 210B, the averager 124 and the Huffman table 300.

Sub-Sampler 116

The sub-sampler 116 samples the 16-bit video data stream 103 and outputs a 15-bit sampled datum 117*i* that includes the 15 low-order bits of a sampled video stream datum 103*i*. The 15-bits of the sampled datum 117*i* comprise three 5-bit color groups 117R, 117G and 117B that correspond, respectively, to the red, green and blue color data from the sampled datum 103*i*. The decimate signal 251A from the SM1 250 determines when the sub-sampler 116 samples the video stream 103. In the preferred embodiment, the SM1 250 uses this decimate signal 251A to achieve 100 percent, 50 percent and 25 percent sub-sampling where, respectively, every datum, every other datum, or every fourth datum 103*i* in the video stream are output by the sub-sampler 116 as a sampled datum 117*i*. A depiction of which image pixels from the CCD 102 are used by the compressor 104 in the 50 and 25 percent sub-sampling cases is shown in FIGS. 5A and 5B, respectively.

Figure 5A:
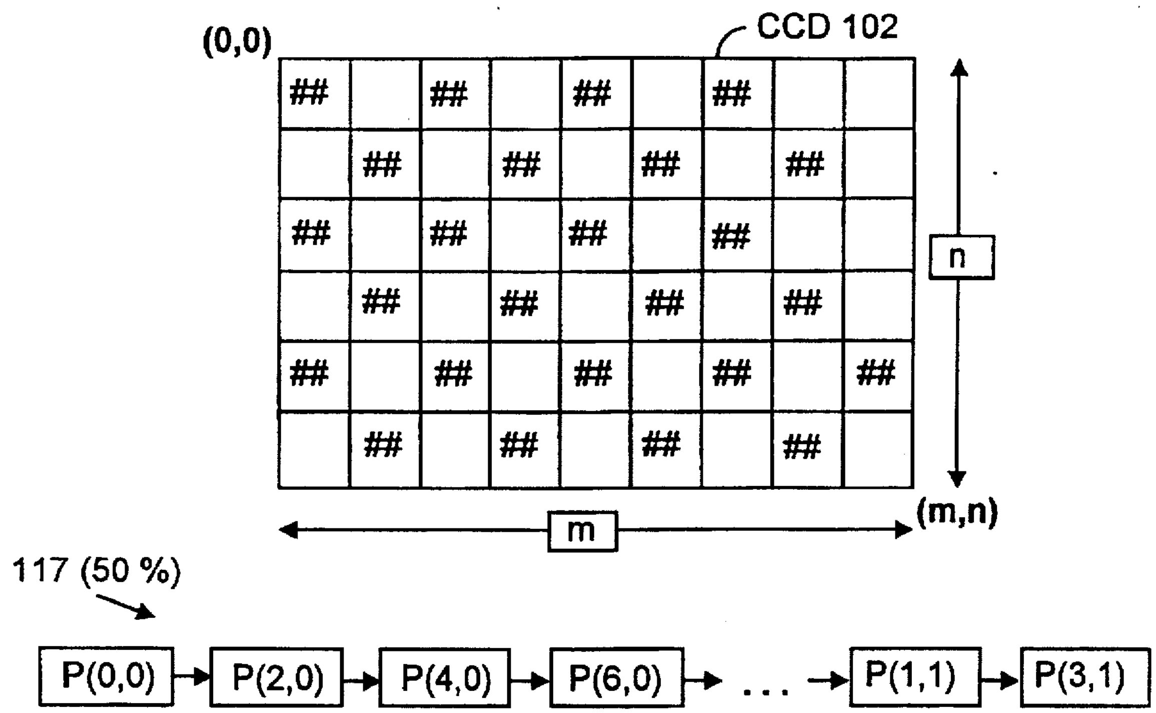
FIG. 5A illustrates the effects on the video stream of 50% sub-sampling.
Figure 5B:
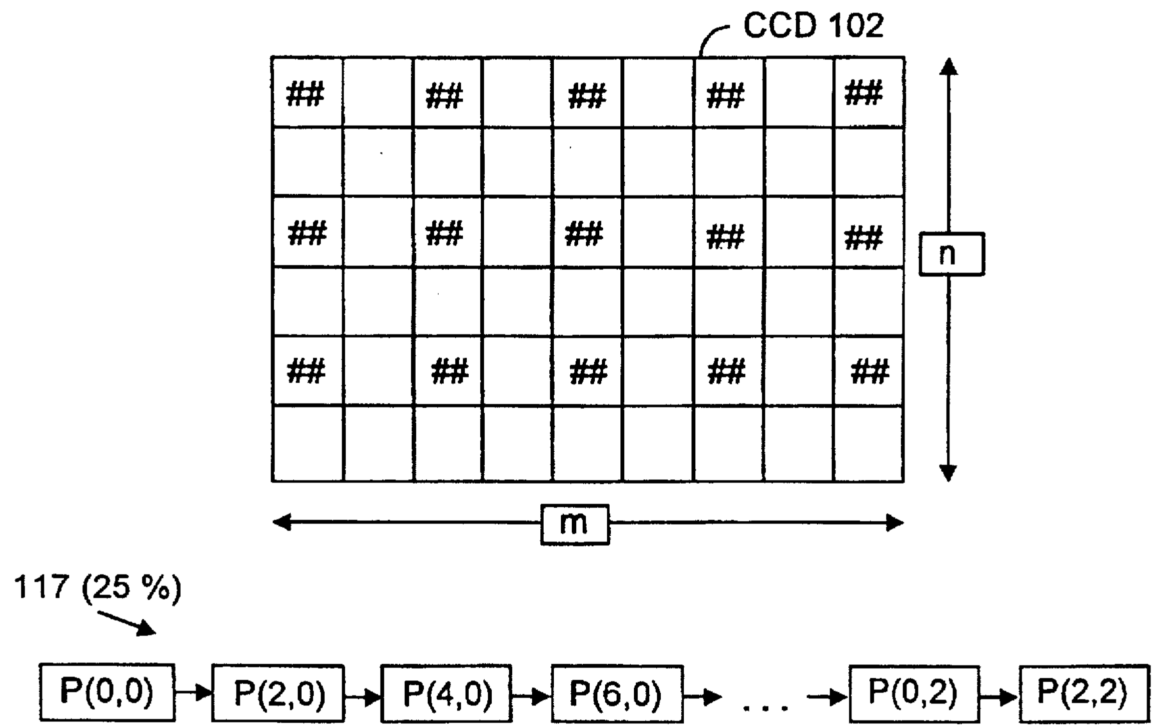
FIG. 5B illustrates the effects on the video stream of 25% sub-sampling.

FIG. 5A shows the set of CCD 102 pixels (indicated by the symbol "##") whose data is represented in the sub-sampled video stream 117 for 50 percent sub-sampling. Similarly, FIG. 5A shows the set of CCD 102 pixels (again indicated by the symbol "##") whose data is represented in the sub-sampled video stream 117 for 25 percent sub-sampling.

The color group data 117Ri, 117Bi, 117Gi output by the sub-sampler 116 are coupled to the MUX 122 as three selectable input groups. Based on the state of a color selection signal 251D provided by the SM1, the MUX 122 outputs data from one of the color groups 117Ri, 117Bi, 117Gi as a 5-bit source value 123*i* to be compressed (note: in the preferred embodiment, the processing sequence for each pixel is green, red and blue). The value 123*i* is coupled to the lookup table memory 200 as 5 bits of an 11-bit lookup address. As mentioned above, the other components of the lookup address are a 5-bit previous value 125*i*−1 output by the averager 124 and a 1-bit lookup table select value 251E output by the SM1.

Lookup Memory 200

Based on the 1-bit lookup table select value 251E provided by the SM1 250, the lookup table memory 200 selects one of its lookup tables 210A or 210B and then performs a lookup in the selected table 210 on the lookup table entry 210[p,s], where "p" represents the 5-bit previous value 125 output by the averager 124 and "s" represents the 5-bit source value 123 from the sub-sampler 116 via the MUX 122. The structure of a lookup table 210 is now described in reference to FIG. 6.

Figure 6:
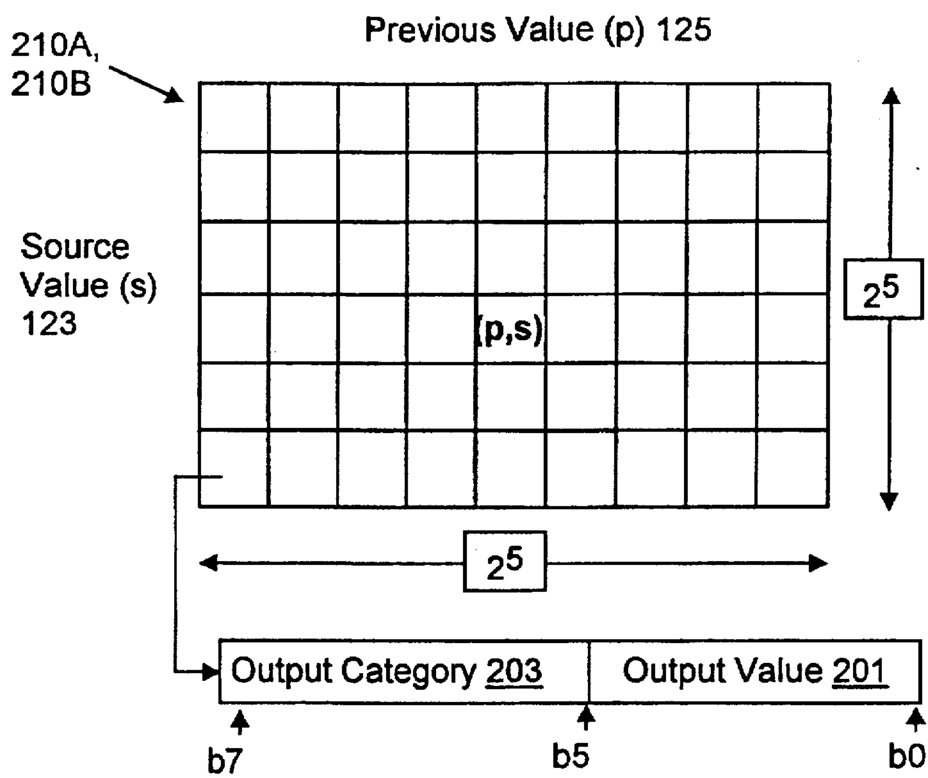
FIG. 6 is a block diagram illustrating the structure of the two lookup tables 210A, 210B stored in the lookup table memory 200 of FIG. 3.

Referring to FIG. 6, each entry 210[p,s]in the lookup tables 210A, 210B includes a 3-bit category 203 and a 5-bit output value 201. The 3-bit category 203 for an entry 210[p,s] captures the difference between the 5-bit source value (s) 123 and the 5-bit previous value (p) 125. Thus, for the set of entries 210[p,s] where "p" and "s" are identical or similar (e.g., if "p" and "s" are 16; or if "p" is 6 and "s" is 7) the 3-bit category 203 stored in those entries would be 0. In contrast, for entries 210[p,s] where the difference between "p" and "s" is large (e.g., if one is 0 and the other is 31), the 3-bit category 203 for those entries would be 7, or as large as possible. The 5-bit output value 201 represents a quantized version of the source value 123 that is used as a proxy for the actual source value 123 for all compression and decompression stages subsequent to the initial lookup. This quantized 5-bit value 201 is the same for all lookup table entries 210[p,s] with the same previous value (p) 125 and category value 203.

For example, consider one row (for p=16) of a lookup table 210A used in the preferred embodiment:

| previous val 125 | source val 123 | category 203 | output val 201 |
|---|---|---|---|
| 16 | 0 | 6 | 3 |
| 16 | 1 | 6 | 3 |
| 16 | 2 | 6 | 3 |
| 16 | 3 | 6 | 3 |
| 16 | 4 | 6 | 3 |
| 16 | 5 | 6 | 3 |
| 16 | 6 | 6 | 3 |
| 16 | 7 | 4 | 9 |
| 16 | 8 | 4 | 9 |
| 16 | 9 | 4 | 9 |
| 16 | 10 | 4 | 9 |
| 16 | 11 | 4 | 9 |
| 16 | 12 | 2 | 14 |
| 16 | 13 | 2 | 14 |
| 16 | 14 | 2 | 14 |
| 16 | 15 | 0 | 16 |
| 16 | 16 | 0 | 16 |
| 16 | 17 | 1 | 17 |
| 16 | 18 | 1 | 17 |
| 16 | 19 | 3 | 19 |
| 16 | 20 | 3 | 19 |
| 16 | 21 | 3 | 19 |
| 16 | 22 | 5 | 24 |
| 16 | 23 | 5 | 24 |
| 16 | 24 | 5 | 24 |
| 16 | 25 | 5 | 24 |
| 16 | 26 | 5 | 24 |
| 16 | 27 | 7 | 29 |
| 16 | 28 | 7 | 29 |
| 16 | 29 | 7 | 29 |
| 16 | 30 | 7 | 29 |
| 16 | 31 | 7 | 29 |

Note that there are more common output values 201 for high-numbered categories 203 than for low-numbered categories. This is due to the fact that the source pixel and previous pixel values 123, 125 represent the values of the same color element for neighboring pixels on the CCD 102. Because viewers of the image ultimately displayed from the decompressed data 107 are less likely to notice small alterations between the values of neighboring pixel elements when the original differences between those pixel elements was large, the lookup tables 210 use finer resolution in categories 203 and output values 201 for neighboring pixel elements (e.g., source 123 and previous 125 values) that were originally very close in value. Thus, the above example of a lookup table row assigns seven different source values 123 (i.e., 0–6), which are as different from the previous value "16" as is possible, the same category "6" and output value "3". In contrast, there are only two source values (15, 16), which are as similar to the previous value "16" as possible. These source values 123 are assigned the category "0" and output value "16". This design of the lookup tables 210A, 210B is extremely important as it allows an image to be compressed in such a way that important details are not lost.

Note that the categories are assigned so that the 0 category is at the point in the row where the previous value 125 and the source value 123 are most similar, and the other categories are assigned in increasing order on alternating sides of the 0 category. Another goal is to assign odd numbers of source values to the higher categories so that the difference between the source value and its associated output category 201 is kept as small as possible within a given category. Generally, the largest difference between the source and output value will be no larger than the category modulo 2. For example, none of the source values assigned the category 5 (i.e., the source values 22, 23, 24, 25, 26) differ by more than plus or minus 2 from their associated output category 24. In fact, for categories other than categories 6 and 7, the output value (i.e., the displayed value) will differ from its corresponding source value by no more than plus or minus 2. For the smaller categories (e.g., 0 and 1) the difference between the source value and its output value is never greater than 1. This means that the redisplayed image is very close in color to the original image.

Both of the tables 210A and 210B are constructed according to these principles; however there is a subtle but important difference between the contents of the two lookup tables 210A and 210B. The rows of 210B have fundamentally the same values as the rows of the table 210A; but represent a reflection of the rows of the table 210A about the values of s for which the category is 0. For example, consider the following row for the previous row value of "16" that is taken from an actual second lookup table 210B that is paired with the table 210A whose comparable row is shown above:

| previous val 125 | source val 123 | category 203 | output val 201 |
|---|---|---|---|
| 16 | 0 | 7 | 2 |
| 16 | 1 | 7 | 2 |
| 16 | 2 | 7 | 2 |
| 16 | 3 | 7 | 2 |
| 16 | 4 | 7 | 2 |
| 16 | 5 | 7 | 2 |
| 16 | 6 | 5 | 8 |
| 16 | 7 | 5 | 8 |
| 16 | 8 | 5 | 8 |
| 16 | 9 | 5 | 8 |
| 16 | 10 | 5 | 8 |
| 16 | 11 | 3 | 13 |
| 16 | 12 | 3 | 13 |
| 16 | 13 | 3 | 13 |
| 16 | 14 | 1 | 15 |
| 16 | 15 | 1 | 15 |
| 16 | 16 | 0 | 16 |
| 16 | 17 | 0 | 16 |
| 16 | 18 | 2 | 18 |
| 16 | 19 | 2 | 18 |
| 16 | 20 | 2 | 18 |
| 16 | 21 | 4 | 23 |
| 16 | 22 | 4 | 23 |
| 16 | 23 | 4 | 23 |
| 16 | 24 | 4 | 23 |
| 16 | 25 | 4 | 23 |
| 16 | 26 | 6 | 29 |
| 16 | 27 | 6 | 29 |

-continued

| previous val 125 | source val 123 | category 203 | output val 201 |
|---|---|---|---|
| 16 | 28 | 6 | 29 |
| 16 | 29 | 6 | 29 |
| 16 | 30 | 6 | 29 |
| 16 | 31 | 6 | 29 |

As will be described later, the SM1 uses the two tables 210A, 210B for alternating lookups. That is, when performing a lookup on a source value for a pixel P(i,j), the SM1 might use the table 210A; but when performing a lookup for the next pixel P(i+1, j), the SM1 would use the other table 210B. Because of the subtle differences between the mirrored tables, even if the previous value 125 and source values 123 are identical for the two pixels, the two tables might generate different output categories and values 203, 201. For example, for "p" equaling 16 and "s" equaling 15, the first table would read out a category 203 and output value 201 of 0 and 16, whereas the second table 210B would read out a 1 and a 15, respectively. However, because the differences between the tables is subtle, some p and s pairs result in the same category and output values being read out of the tables 210A and 210B (e.g. in the exemplary set of tables, p=16 and s=16 always are associated with category 203=0 and output value=16).

As a result of this two-table lookup process, some identical, adjacent pixels are compressed to different respective 9-bit category values 281 in the first stage of compression, which means that those adjacent pixels would be re-displayed as different values following decompression. This seems like a flaw in the present invention; but is actually an advantage that prevents color banding of the decompressed video data 107 that is generated by other video compression systems. This color banding occurs in the prior art due to the fact that these systems force many slightly differing neighboring pixels to the same exact value. Because even small groups of pixels with the same color data are readily detectible, color banding in the decompressed images is perceived by viewers. This problem is avoided by the present invention's use of two lookup tables 210A, 210B for alternating lookups.

Complete lookup tables 210A, 210B are shown respectively in Appendices A and B. In these table listings, each row includes all table values for a single previous value 125, which in the tables is called "prevRGB". Other information in these tables include the source value 123 ("inRGB") and the output value 201 and output category 203 that correspond to each pair of previous value 125 and output value 123. Note that these tables are used to compress the red, green, and blue color data of a sampled datum 117. Also note that some of the rows of the table 210B are not a perfect reflection of the corresponding rows of table 210A. These deviations from perfect reflectivity were made to locally optimize the tables for a specific implementation of the preferred embodiment; however, the present invention does not require these local optimizations.

Averager 124

Figure 7:
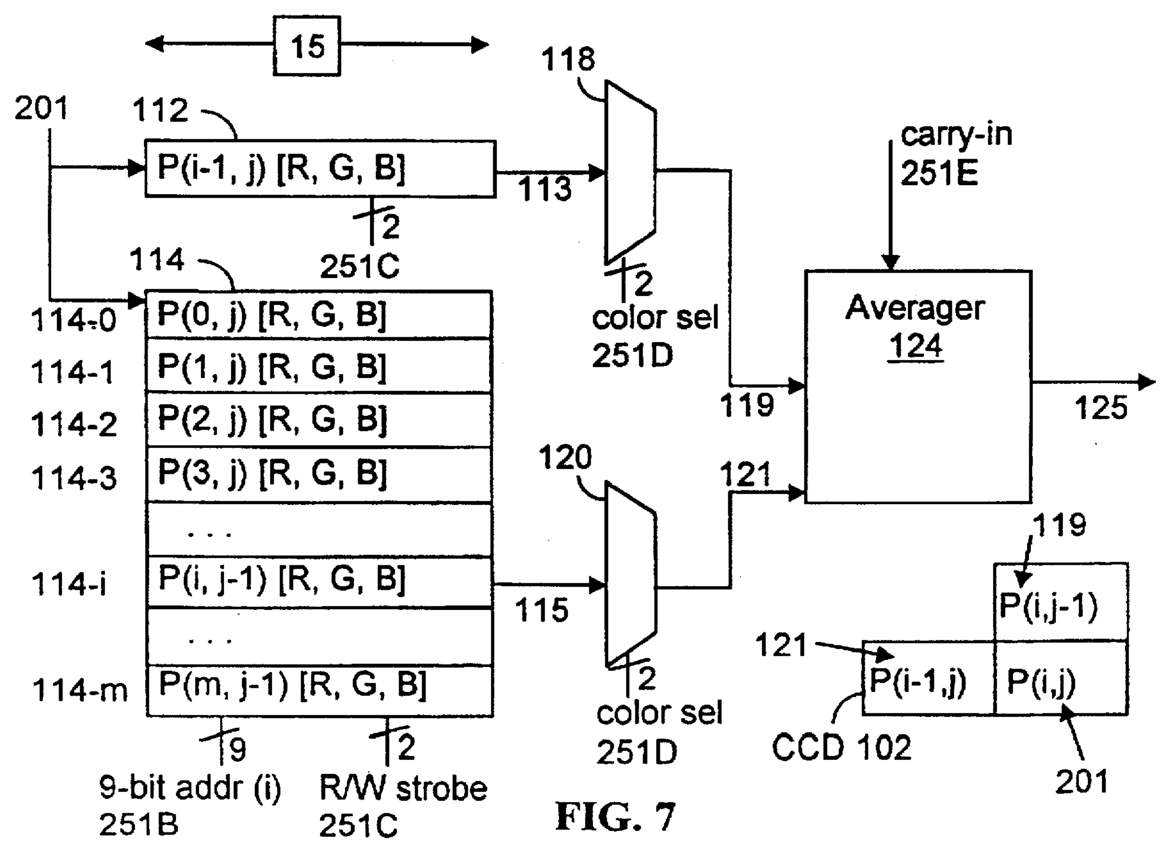
FIG. 7 is a block diagram illustrating the structure of the last value storage element 112 and one-row storage element 114 of FIG. 3 and their cooperation with the averager 124.

Referring to FIG. 7, there is shown a block diagram of the averager 124, the last value register 112 and the one-row storage 114. In the lower right of this figure there is also included a depiction of one section of the CCD 102 that shows the pixel being currently processed P(i,j) and the pixels P(i−1,j) and P(i, j−1) that are adjacent to the pixel P(i,j). These "adjacent" pixels are the pixels whose associated 5-bit RGB output values are averaged to produce the 5-bit previous value 125. Control signals 251 input to these elements include the R/VV strobe 251B, which is coupled to the last value register 112 and the one-row storage 114, the color select signal 251D, which is coupled to the MUXes 118, 120, and the carry-in signal 251E, which is tied to the averager 124. All of these control signals are generated by the SM1 at appropriate times during a stage 1 compression step.

Before sampling a new pixel P(i,j), the SM1 sets the 9-bit address 251B to i (i.e., the column index of the datum **103*i* being sampled) and outputs a read signal using the R/W strobe 251C. This causes the one-row storage 114 to output the RGB values 115 associated with the pixel P(i,j−1) (i.e. the pixel above the pixel P(i,j)) and causes the last value register 112 to output the RGB values 113 associated with the last sampled pixel P(i−1,j). The SM1 250 then sets the 2-bit color select signal 251D to cause the MUXes 118, 120 to select one color from their respective 15-bit inputs 113, 115. The 5-bit data 119, 121 output from the MUXes 118, 120 is input to the averager 124, which computes the average of the two values with or without a carry-in, depending on the state of the carry-in signal 241E provided by the SM1 250. For example, with a carry-in, the average of the two values 119 and 121** would be:

avg 125=(last_value 119+one_row_value 121 +1)/2.

Without a carry-in, the average of the two values would be:

avg 125 =(last_value+one_row_value)/2.

The SM1 250 alternates the state of the carry-in signal 241E for alternating sampled pixels. Thus, if the SM1 causes the averager 124 to use a carry-in to average the RGB data for the pixel P(i−1,j), it would not set the carry-in for the pixel P(i,j). This is another advantage of the present invention, which, along with the use of alternative lookup tables 210A, 210B, prevents the color banding that occurs in the prior art. In the preferred embodiment, the SM1 sets the carry-in 251E and the table select signal 251F so the carry-in is always used in conjunction with lookups into the second table 210B.

The embodiment shown in FIG. 7 presumes that the sub-sampler 116 has sampled every datum **103*i* in the video data stream 103. In other cases, e.g., where the sub-sampler samples only 50 percent or 25 percent of the video datums 103*i*, the adjacent pixel values 119 and 120 that are averaged do not represent the logical pixels directly above and to the left of the pixel whose data 103*i* was sampled (refer to FIGS. 5A and 5B). This fact is immaterial to the present invention, which averages whatever data 113 is stored in the last value register 112 (which represents the last sampled datum 117) and whatever data 115 is stored in the one-row storage with an address that is closest to the currently sampled pixel's column address (which represents the datum from the previous sampled row that is closest to being above the last sampled datum 117**).

Because the previous value 125 computed by the averager 124 represents an element value for a pixel that neighbors the pixel providing the source value 123, the resulting 3-bit category 203 read out by the lookup table 210 represents the categorical difference between the same color elements of two neighboring pixels. For example, assuming that the source value 123 corresponds to the red data value of a sampled pixel P1 and the previous value 125 corresponds to the red data value computed for a neighboring pixel P2, the 3-bit category 203 output by the lookup table represents the categorical difference between P1's and P2's red data values. This categorization of the degree of difference between adjacent pixel elements is an important first step in video compression, where high levels of compression are achieved by representing the similarities between adjacent pixels with compressed video data.

Once the 15-bit data from the last value register 112 and the one-row storage 114 is read out, the SM1 250 sets the R/W strobe 251C so that the 5-bit output value read out from the lookup memory 200 overwrites the appropriate 5-bits of the one-row storage at the 9-bit address (i) 251B and also overwrites the appropriate 5-bits of the last value segment.

To avoid problems in computing the previous value 125 for pixel data **103*i* associated with pixels that lie in the first row or first column of the CCD 102, at the beginning of a frame, the SM1 loads each 5-bit segment of the last value register 112 and the one-row storage 114 with the default value of 16 (the mid-point of the 5-bit color values). Similarly, at the beginning of a line of data other than the first line of a particular image, the SM1 250 loads each of the 5-bit RGB segments of the last value register 112** with 16.

Huffman Table 300

Figure 8:
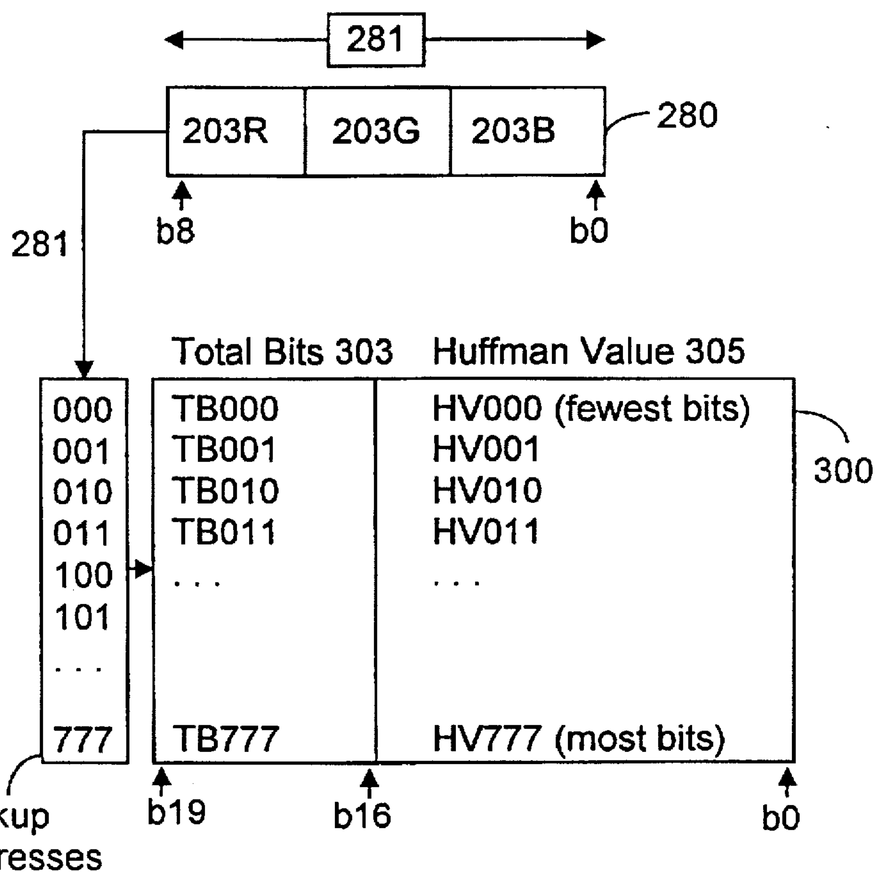
FIG. 8 is a block diagram illustrating the structure and cooperation of the 9-bit output register 280 and the Huffman table 300 of FIG. 3.

Referring to FIG. 8, there is shown a block diagram illustrating the structure of a Huffman table 300 as implemented in the present invention and the 9-bit register 280 that provides the 9-bit category data 281 that is used to perform the Huffman table lookup.

This 9-bit category data 281 represents combined category data for all three elements from a single pixel P(i,j). Among other things, each Huffman table lookup produces a variable-length Huffman value 305 that characterizes the 9-bit category 281 used for the lookup. In the preferred embodiment, the longest Huffman value is 13-bits, although Huffman values of as many as 16-bits could be used. Thus, each Huffman table lookup simultaneously encodes the combined category data for three pixel elements. This simultaneous processing (i.e., compression) of all three elements of a pixel is unknown in prior art video compression systems (e.g., systems using run-length encoding (RLE) and discrete cosine transforms (DCT)), where each pixel element is separately encoded. These combined categories 281 provide additional levels of compression because, in typical images, all three pixel elements tend to change very little from pixel to pixel for large portions of the image.

In the Huffman table 300, each of the $2^9$ possible 9-bit categories 281 is associated with a Huffman code, or value 305 whose total number of bits is inversely related to the likelihood of the occurrence of that 9-bit category 281. For example, because repetition is very common in video data (i.e., it is common for large areas of contiguous pixels to have the same color data), the Huffman code 305 with the fewest bits is typically associated in the present invention with the 9-bit value that is represented in octal as 000 (indicating there was no or nearly no difference between neighboring pixels' red, green and blue values). Similarly, the Huffman code 305 with the most bits is typically associated with the 9-bit value that is represented in octal as 777 (indicating there was the largest possible difference between neighboring pixels' red, green and blue values).

Beyond the general rule that the Huffman codes for more frequent categories have fewer bits than the Huffman codes for the less frequent categories, the present invention generally imposes no strict rules on the ordering of Huffman values that have the same number of bits. The only exception to this rule applies to the situation where, for processing purposes, two Huffman decode tables 430 (rather than one) are used to decode the Huffman data stream 105. This situation is discussed in reference to FIG. 11B.

The present invention can distribute the possible Huffman values (e.g., in the preferred embodiment there are $2^{13}$ possible Huffman values) among the 9-bit categories in a variety of ways. However, some ways of allocating Huffman codes are less conservative than others. For example, the more frequent 9-bit categories could be assigned Huffman values in such a way that there are too few remaining Huffman codes for the less frequent 9-bit categories. In such a situation, the present invention assigns the remaining 9-bit categories respective Huffman codes whose length is the maximum Huffman code length (e.g., 13-bits), whose numerical value is smaller than any of the Huffman codes for the more frequent categories (after left-justifying all of the Huffman codes to the maximum Huffman code length), and whose least significant 9-bits comprise the 9-bit category 281. Thus, when such a code is encountered during the decompression step, it can immediately be decoded to the correct 9-bit category. In the preferred embodiment this feature is disabled as each 9-bit category 281 is assigned one of the available $2^{13}$ Huffman values.

Each Huffman table entry **300*i* also has a 4-bit field that includes a Huffman bit count 303*i*. The Huffman bit count indicates to the SM1 250 how many of the 16 bits that could be used to represent Huffman values are actually used for the Huffman value 305*i*. Based on this Huffman bit count 303*i*, which is stored in the counter register 380A as part of the output step, described above, the SM2 knows how many Huffman value bits to shift into the output register 390. In the preferred embodiment, the Huffman data is left-justified in the data registers 380H and 380L so that it can be easily shifted out by the SM1 250**.

A full example of a Huffman table 430 used in an implementation of the preferred embodiment is shown in Appendix C. This example shows the Huffman values ("Huff") assigned to each of the 512 categories 281 ("array val") of the present invention and the number of bits ("bits") associated with those Huffman values. Note that all of the values shown in Appendix C are decimal values. Thus, the array values 1, 8 and 64 all correspond to category values where only one of the constituent 3-bit categories is 1. Consequently, these entries are associated with a small number of bits. The longest Huffman value in this table is 13 bits (associated with many values), while the shortest Huffman values is 2-bits (associated with the 9-bit category whose decimal value is 0).

Various methods of implementing Huffman tables for use in Huffman coding and decoding are well-known. These prior art methods typically use Huffman trees to decode the streams of variable length Huffman data output from the Huffman table. This is a slow process that limits the amount (i.e. resolution) of video data that can be processed in real time. The present invention completely eliminates the need for this slow, tree-based Huffman decoding by encoding as Huffman values 305 the 9-bit categories in such a way that only one or two tables lookups need be performed by the decoder 106 to decode the Huffman data 105.

For an illustration of the present invention's Huffman encoding technique, consider a situation where there are only four values Vi to be encoded (think of these values Vi as representing the $2^9$, 9-bit categories). Assume for the present example that the values V1, V2, V3 and V4 are most likely to occur in the order given (i.e., V1 is more likely to occur than V2 and so on). Thus, consistent with well-known Huffman coding principles, the Huffman value 305V1 for the input value V1 should have no more bits than the Huffman value 305V2, and so on. Subject to these constraints, the Huffman values 305 could be assigned in many different ways. One possible Huffman table 300 encoding the values Vi is as follows:

| Value (Address) | Total Bits | Huffman Value |
|---|---|---|
| V1 | 1 | 1 |
| V2 | 2 | 01 |
| V3 | 3 | 001 |
| V4 | 3 | 000 |

Figure 8B:
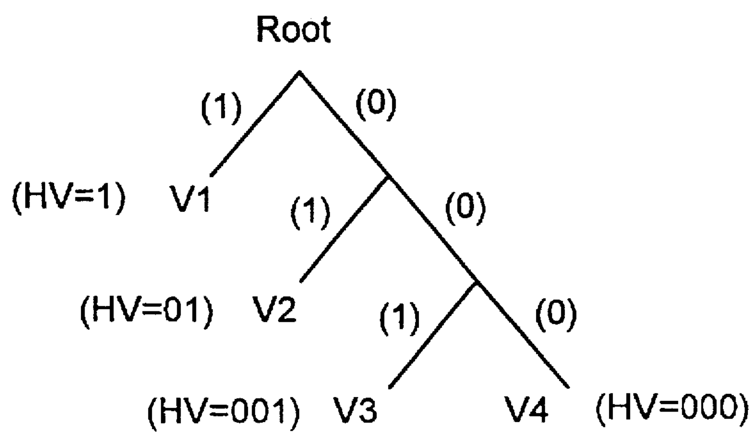
FIG. 8B illustrates a Huffman decode tree used in the prior art to decode variable-length Huffman codes.

Given this Huffman table 300, a traditional Huffman decoder would decode the resulting compressed video stream 105 using a three-level Huffman decode tree wherein the various Huffman values are distributed at different tree levels based on their total bits and contents. For example, the traditional decode tree corresponding to the above Huffman table is shown in FIG. 8B. Given the decode tree of FIG. 8B, the traditional decoder would analyze the video data stream 105 bit-by-bit, starting at the root node of the tree and taking the applicable tree branch based on the state (1 or 0) of the current bit. The value corresponding to the Huffman value being decoded is only discovered when the decoder reaches a leaf node. For example, to decode the Huffman value 001, the traditional Huffman decoder would perform the following steps:

1) read the first bit (0)
2) take the right hand branch;
3) read the next bit (0);
4) take the right hand branch;
5) read the next bit (1);
6) take the left hand branch (to a leaf); and
7) return the leaf value (V3).

In contrast to the prior art, the present invention represents the information needed to decode Huffman values 305 generated by a particular Huffman table 300 in a Huffman decode table 430. As will be discussed in reference to FIG. 11B, the Huffman decode table 430 is a logical construct that can be subdivided into two tables 430A and 430B; however, for the purposes of this discussion, it shall be assumed that the Huffman decode table 430 is a single table. The Huffman decode table 430 has $2^q$ entries, where q is the maximum length of a Huffman value (q is 13 in the preferred embodiment). Each entry **430*i* in the decode table 430 is associated with one Huffman value 305 and includes a Huffman bits field 432 that represents the number of bits in the associated Huffman value 305 and a decoded value field 434 that represents the decoded value or category associated with the same Huffman value 305. Because there are more Huffman table entries ($2^{13}$ in the preferred embodiment) than values 281 to be decoded ($2^9$ in the preferred embodiment), some of the Huffman values 305 are associated with more than one of the decode table entries. Each of the redundant entries associated with a particular Huffman value 305*i* has identical information (e.g. number of bits and decoded value) and has a lookup address that in its most significant bits matches the associated Huffman value 305*i*. For example, the Huffman decode table 430** related to the 4-entry Huffman table presented above (where q is 3) would look as follows:

Huffman Decode Table 430

| Lookup address | number of bits | decoded value |
|---|---|---|
| 000 | 3 | V4 |
| 001 | 3 | V3 |
| 010 | 2 | V2 |
| 011 | 2 | V2 |
| 100 | 1 | V1 |
| 101 | 1 | V1 |
| 110 | 1 | V1 |
| 111 | 1 | V1 |

Given this type of Huffman decode table 430, the decompressor 106 is able to decode compressed data chunks **105*i* q bits at a time (i.e., in a single lookup). For example, using the table 430 shown above, the decompressor 106 decodes any q-bit chunk that begins with a "1" to the input value V1 (because all of the entries associated with Huffman codes beginning with "1" are mapped to the same decoded value V1, the Huffman bits other than the first bit are irrelevant to the value returned by the lookup). Similarly, any q-bit chunk that begins with a "01" pattern is decoded to V2. Once it has decoded a q-bit chunk, the decompressor 106 shifts-out the number of bits used by that decode operation and does a lookup on the remaining bits of the chunk 105*i* until there are no unprocessed bits left. For example, the decompressor 106 would decompress the variable-length Huffman data stream 105*i*** (101001) in the following set of steps:

1) datum **105*i***=101001;
2) do a lookup into decode table using first three bits of the datum **105*i*** (101) and output the "decoded value" returned from table (V1);
3) shift the datum **105*i*** contents left by "number of bits" returned from table (1);
4) do a lookup into decode table using first three bits of the datum **105*i*** (010) and output the "decoded value" returned from table (V2);
5) shift the datum **105*i*** contents left by "number of bits" returned from table (2);
6) do a lookup into decode table using first three bits of the datum **105*i*** (010) and output the "decoded value" returned from table (V2); and
7) shift the datum **105*i*** contents left by "number of bits" returned from table (2).

The Huffman decode table 450 and decompression steps performed by the decompressor 106 will be discussed in greater depth below, in reference to FIGS. 11A and 11B.

Figure 9:
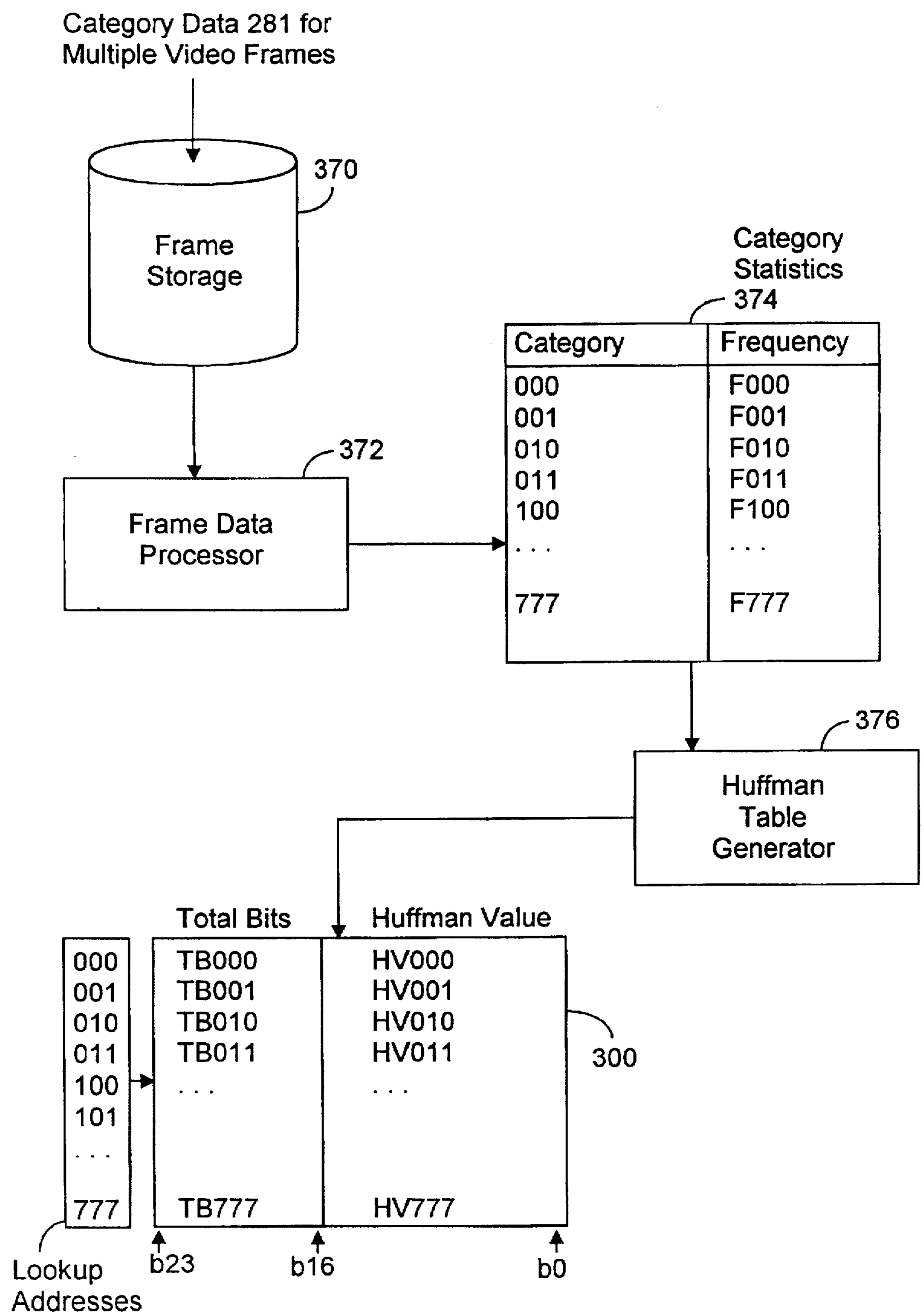
FIG. 9 is a diagram showing the structure of a preferred system for generating the Huffman data stored in the Huffman table of FIG. 7.

Referring to FIG. 9, there is shown an automated system that can be used to generate the Huffman tables 300 used in the present invention. This system includes a frame storage device 370 that stores the category data 281 from multiple video frames. The frame storage device is coupled to a frame data processor 372, which computes frequency statistics 374 (i.e., the number of occurrences) for each the 29 possible 9-bit categories 281 based on the category data from the frame storage. Based on the category statistics and the present invention's rules for generating Huffman values, the Huffman table generator 376 assigns low-bit Huffman values to the most-frequent 9-bit categories and high-bit Huffman values to the most infrequent 9-bit categories and writes the resulting total bit and Huffman value to a Huffman table 300 that can be used by the compressor 104. Of course, the inverse Huffman tables 430 used to decode the Huffman values defined in the Huffman table 300 can also be generated in this same process.

The category statistics tables used to generate the Huffman table shown in Appendix C is shown in Appendix D.

This frequency table shows the octal values of each 9-bit category 281 ("octal") and the relative likelihood ("cnt") of that 9-bit category occurring in an average frame. The other columns of this table show the corresponding decimal value of the 9-bit category ("dec real"), the number of huffman bits used to encode the category ("huff bit depth") and the huffman value ("huff value"). As expected, the "octal" 000 category is the most frequent, and the categories with only one bit equal to 1 (e.g. 001, 010, or 100) are among the next most frequent. Similarly, the value for the 767 category is the least frequent value.

Compression Method

Figures 1, 10:
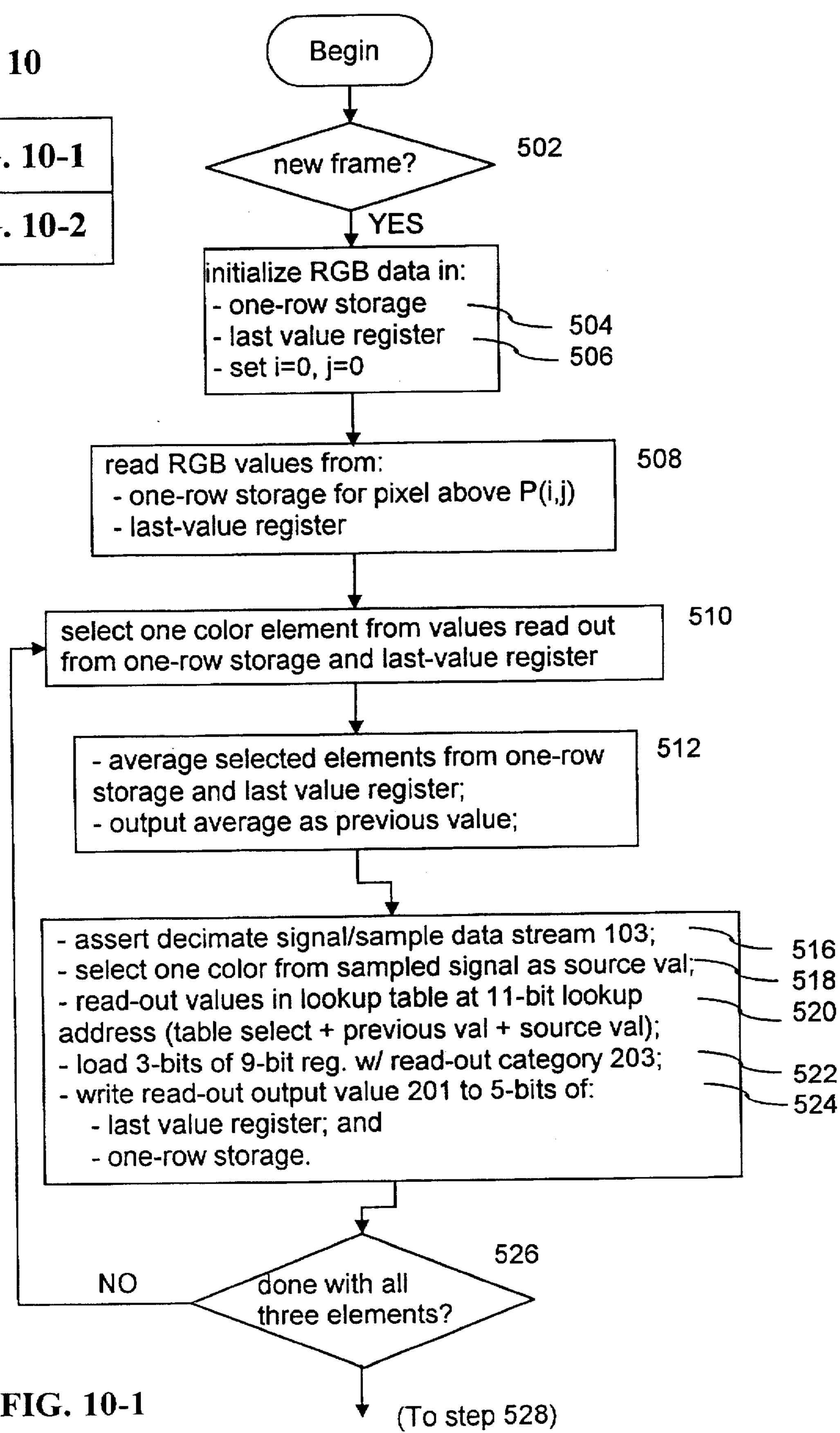
FIG. 10 is a flow diagram of the video data compression method implemented by the present invention.
Figures 2, 10:
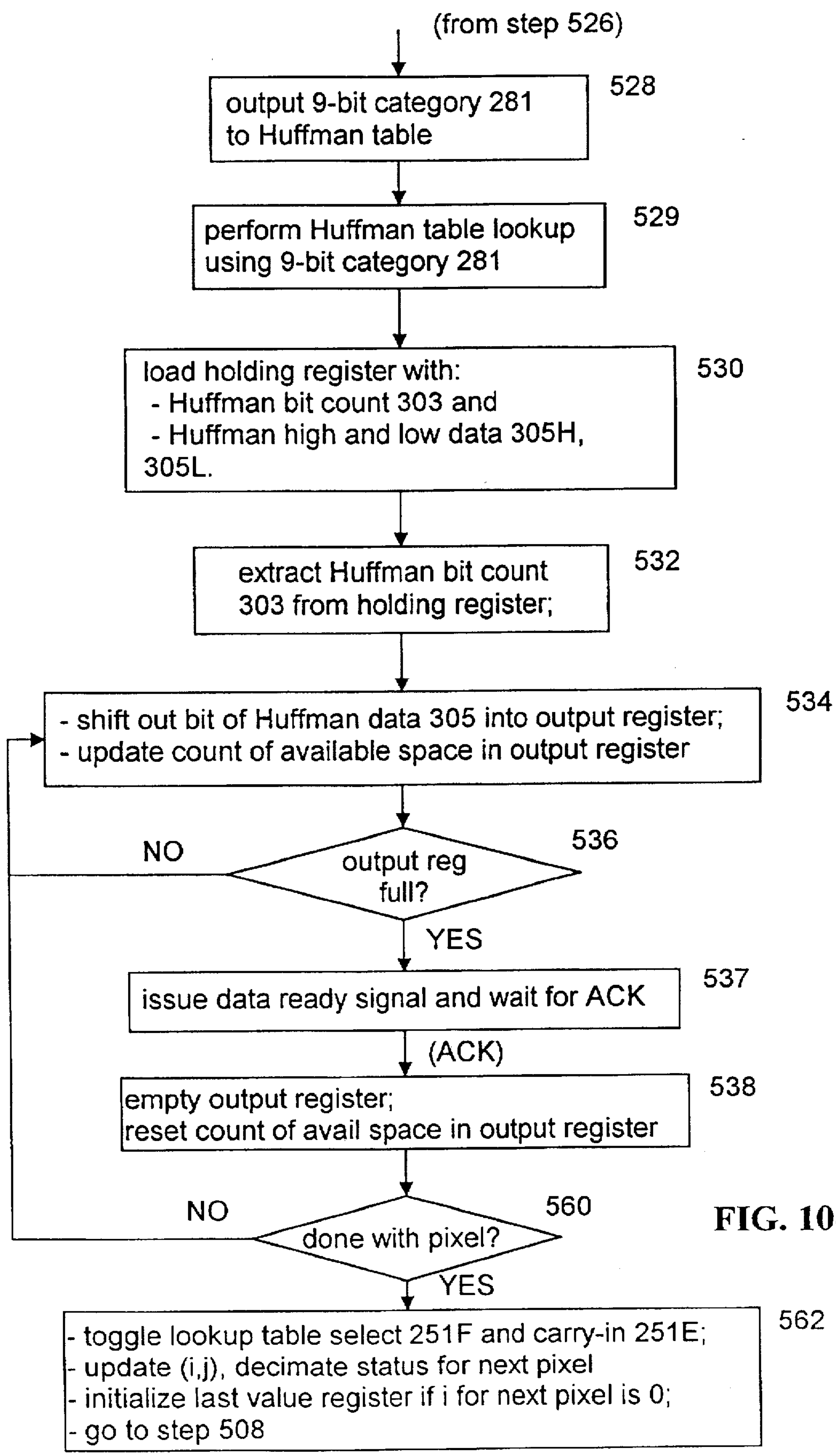

Referring to FIGS. 10-1 and 10-2, there is shown a flow chart of the video compression method of the present invention, which is implemented in the SM1 250. Because the structure of the elements involved in the compression and output steps have already been described, the present discussion will mostly focus on the overall flow of the data method.

The first step of the compression process is initiated when a new frame of data becomes available from the CCD 102, which is indicated to the SM1 via the color video control signal 257 (502). Upon receiving this signal 257, the SM1 initializes all entries **114*i* (R, G and B) of the one-row storage to 16 (the midpoint of the 5-bit color values) (504) and initializes the three, 5-bit last values 112R, 112G, and 112B in the last value register 112 to 16 (506). Once these values are initialized, the SM1 250 is ready to begin processing the color data for the first pixel in the data stream 103**.

As the first step in processing a pixel datum **103*i*, the SM1 250 initializes a read of the value 115 from the one-row storage 114 that is just above the current pixel being processed (508) and the last value 113 from the last value register 112. As discussed above, the value 115 read from the one-row storage 114 corresponds to a previous pixel that lies above the pixel that is to be processed in the current compression step. At this point, the SM1 250 issues the color select signal 251D to the MUXes 118, 120, causing them respectively to select one 5-bit element of the last value 113 and one-row value 115 (510). These selected values 119, 121 are then averaged by the averager 124 (512) using the value of the carry-in signal 251E output by the SM1, which maintains the same carry-in signal value 251E** for all color datums from a single pixel.

Once the previous value 125 has been output by the averager 124, the SM1 250 asserts the decimate signal 251, which causes the sub-sampler 116 to sample the video stream datum **103*i* and output a sampled datum 117*i* to the MUX 122 (516). The SM1 250 then asserts the color select signal 251D coupled to the MUX 122, upon which the MUX 122 outputs the selected 5-bit color data to the lookup table memory 200 as the 5-bit source value 123 (518). Simultaneously, the SM1 250 asserts the lookup table select signal 251F, which, with the source value 123 and the previous value 125 forms the 11-bit address of the 3-bit output category 203 and 5-bit output value 201 read out of the lookup table memory 200 (520). The SM1 250 then asserts the signal 251G, which causes the 9-bit register to store the 3-bit category read out by the lookup table memory 250 in the appropriate 3-bits of the 9-bit register 280 (522). Next, the SM1 250 asserts the read/write strobe 251C so the 5-bit output value 201 read out from the lookup table memory 200 is stored in the appropriate 5-bit segments of the last value register 112 and one-row storage 114 to be used to compress the next row of video data 103 (524). At this point, the SM1 250 repeats the steps (510) to (524) if there are remaining 5-bit color elements of the same pixel to be processed (526**-NO).

Once all of the element data for the current pixel has been processed (526-YES), the SM1 250 asserts the output signal 251G, upon which the 9-bit register 280 outputs the 9-bit category 281 to the Huffman table 300 (528). The Huffman table 300 then reads out the Huffman value 305 and Huffman bit count 303 from the entry addressed by the 9-bit category (529) in three 8-bit chunks in response to the read control signal 251H asserted by the SM1 250, which, prior to the first 8-bit read out, also issues the Huffman data ready signal 251H to the output state machine 350 (530).

Upon receiving the Huffman data ready signal 251I, the output state machine 350 extracts the Huffman bit count 303 from the counter register 380C (532) and shifts out the bits from the Huffman value 305 stored in the Holding register segment 380B and 380C (534). The SM2 350 then asserts the shift in control signal 351B, which tells the output register 390 to shift-in the Huffman value bit from the Holding register 380 (534). After each bit that is shifted into the output register 390, the SM2 350 updates its count of the available space in the output register (536). If the output register is not yet full (536-NO), the SM2 keeps shifting data into the output register 390 until the holding register 380 is empty. Once the output register 390 is full (536-YES) the SM2 350 issues the data ready signal 357 to the microprocessor that controls the camera 80 (537). If the camera's microprocessor is ready for the data, it returns the ACK signal 359, upon which the SM2 350 empties the output register, resets its count of available space in the output register 390 and continues to shift Huffman values into the output register 390 one-bit at a time (538). After processing the current pixel (560-YES), the SM1 250 resets the lookup select signal 251F and carry-in 251E to change the lookup table 210 and average function that are used to compress the next sampled pixel's data 117, increments the 9-bit address 251B to match the column index of the next pixel and updates internal state data (562). If sub-sampling at rates other than 100 percent is to be used, the SM2 also determines whether the decimate signal 251A is to be set for the next available datum **103*i* (562). The SM1 and SM2 repeat this process until all of the datums 103*i*** for a particular frame have been processed.

Having discussed the method and system of the compressor 104, the decompressor 106 of the present invention is now discussed.

Decompressor 106

Figure 11A:
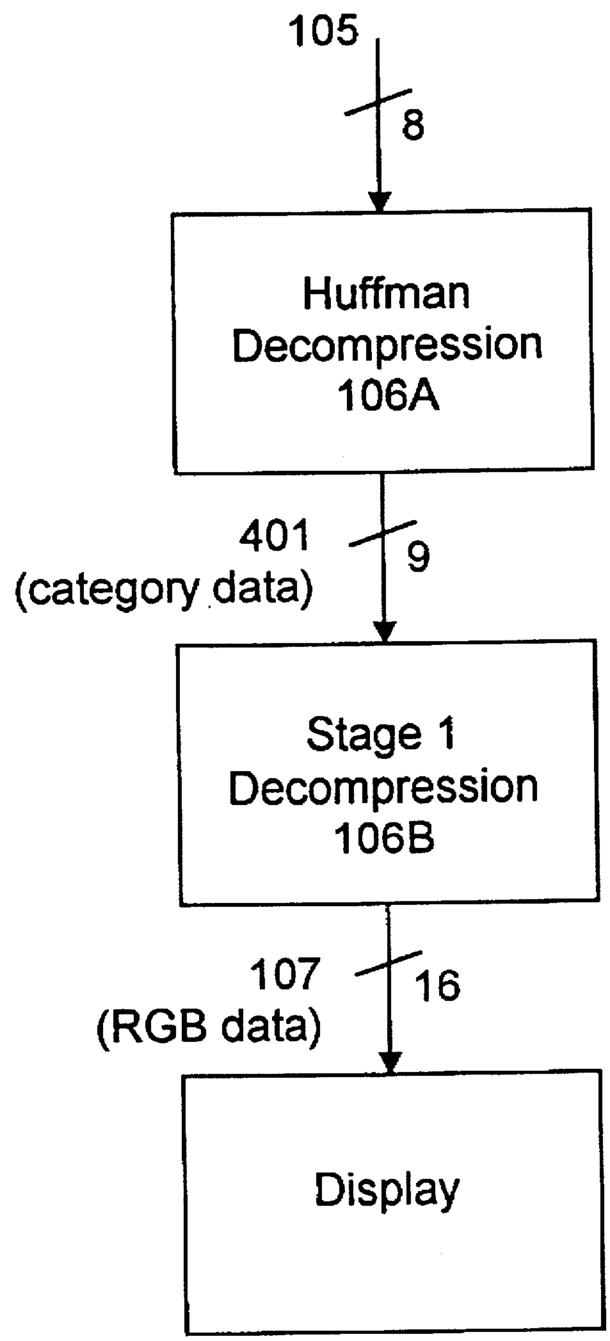
FIG. 11A is a functional block diagram of video decompression system of the present invention.

Referring to FIG. 11A, there is shown a functional block diagram of the decompression operation as it is implemented by the decompressor 106 of the present invention. In the first decompression stage 106A, the decompressor 106 reverses the Huffman coding that took place in the second stage of data compression by taking in the compressed video datums **105*i* in 8-bit chunks and converting different numbers of bits (corresponding to the variable Huffman values) from the compressed datums 105*i* into corresponding 9-bit category values 401*i*. Then, in the second decompression stage 106B, the decompressor 106, using inverse Huffman tables 410A and 410B outputs for each 9-bit category datum 401*i* an associated 15+1(=16)-bit video data value 107*i* that can be displayed as part of the reconstructed video stream 107. Note that the decompressor 106 of the present invention can be implemented in hardware or software. However, for the purposes of the present application, it shall be assumed that the decompressor 106 is being implemented in software running inside a computer that controls the display of the reconstructed data 107**.

Figure 11B:
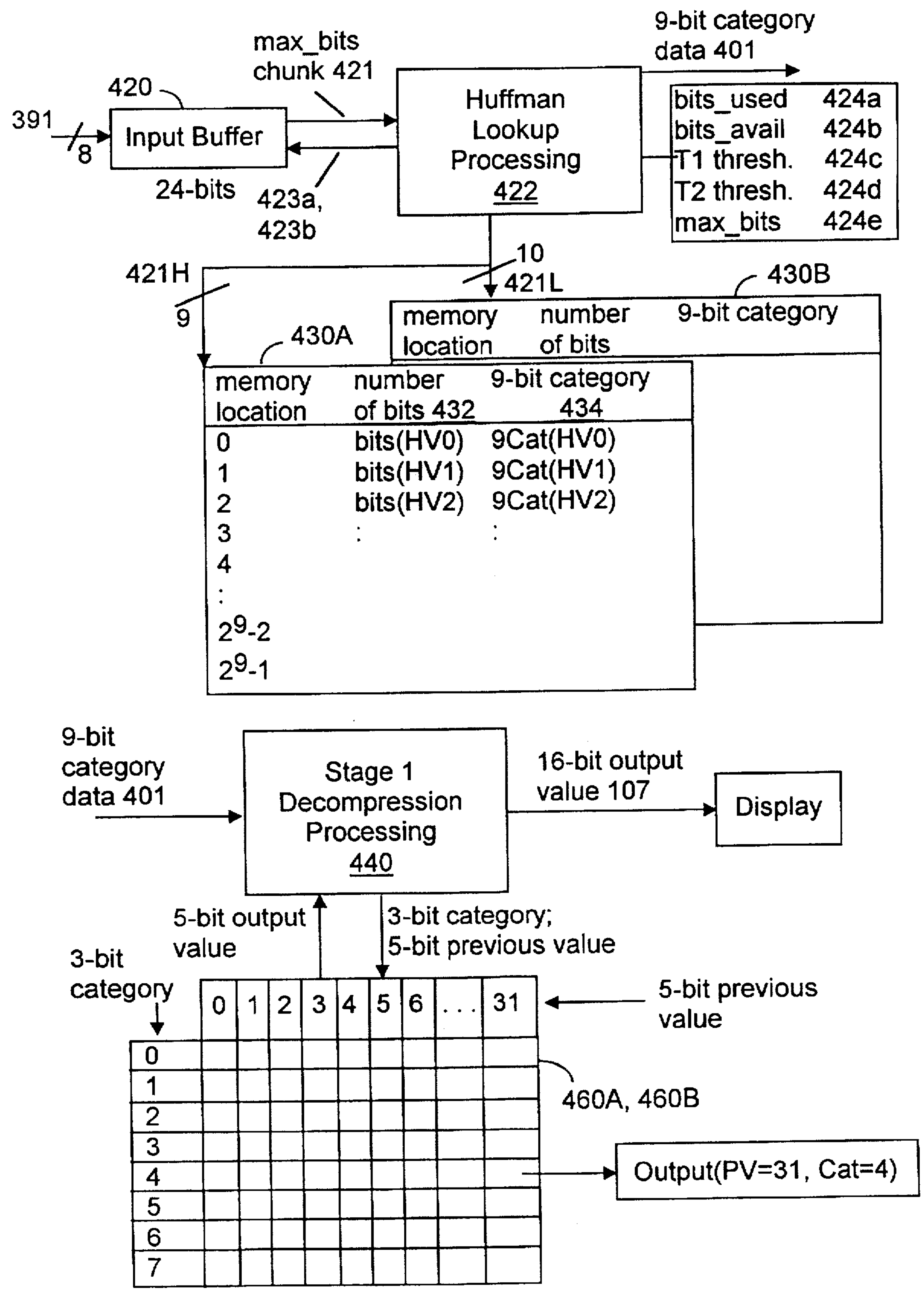
FIG. 11B is a block diagram illustrating the structure of the decompression system of the present invention.

Referring to FIG. 11B, there is shown a block diagram of the decompressor 106 that performs the two decompression stages described in reference to FIG. 11A. This decompressor 106 includes a 24-bit input buffer 420, a Huffman lookup processor 422, inverse Huffman tables 430A and 430B, a stage 1 decompression processor 440 and stage 1 decompression tables 460A and 460B.

The elements of FIG. 11B that perform the Huffman decompression steps are the input buffer 420, the inverse Huffman tables 430A, 430B and the Huffman lookup processor 422, which controls the other two elements. The input buffer 420 is a 24-bit buffer that receives the compressed datums **105*i* from the output buffer and various control signals 423 from the Huffman lookup processor 422. These control signals include a bits_used signal 423*a* and a send_bits signal 423*b*. The Huffman lookup processor 422 also has access to several status variables, including: bits_used 424*a*, bits_avail 424*b*, T1_threshold 424*c*, T2_threshold 424*d* and max_bits 424*e***.

At the beginning of a decompression step, the input buffer 420 supplies the Huffman lookup processor 422 with an appropriate (what is meant by "appropriate" is described below) chunk of compressed video data 421 of length "max_bits" **424*e*, which corresponds to the length of the longest Huffman value 305, whenever it receives the send_bits signal 423*b*. In the preferred embodiment max_bits 424*e* is set to 13-bits, but in other embodiments could vary between 9-bits (which would provide no compression) and 16-bits. In a process that is similar to that described in reference to FIG. 8, the Huffman lookup processor 422 decompresses the chunk 421 returned by the input buffer 420 by performing a lookup into one of the inverse Huffman tables 430A or 430B, which together compose the single logical Huffman decode table 430 described in reference to FIG. 8**.

As already described, the Huffman decompression method of the present invention uses a lookup technique wherein a chunk 421 of compressed data 105 is used to read out a 9-bit category value from an inverse Huffman table 430. This compressed data 105 is stored in the input buffer 420. Because the Huffman values of the present invention can be as long as 16-bits and because the output register 390 can package together Huffman data from two different pixels (e.g., the 8-bit output register might hold a 7-bit Huffman value and 1-bit from a second, 16-bit Huffman value), the input buffer 420 needs to be at least as large as the sum of the longest Huffman value (e.g., 16 bits) and the width of the output register minus 1 (e.g, 7-bits). These values ultimately depend on the architecture of the computer hosting the decompressor 106.

In the preferred embodiment, the table 430A includes $2^9$ entries and the table 430B includes $2^{10}$ entries. As previously described, each of these entries includes a number_of_bits field 432 that indicates the number of bits in the Huffman value that corresponds to that entry and a 9_bit_category field 434 that provides the Huffman value's associated 9-bit category 401. The present invention employs these two tables (with a total of $2^9+2^{10}=1536$ entries) to decode the 13-bit Huffman values 305 rather than a single 13-bit table (with a total of $2^{43}$ entries) as described in connection with FIG. 8 to save storage. These savings are important as they ensure that, regardless of the configuration of the computer executing the decompressor 106, all Huffman decoding data (i.e., the Huffman decode tables 430A and 430B) will be able to fit into the computer's cache memory, allowing for extremely fast lookups. The reason these two tables 430A and 430B can be substituted for a larger single table 430 is due to the way the present invention allocates the $2^{13}$ possible lookup addresses associated with 13-bit Huffman values to the $2^9$ possible 9-bit categories 281. How this allocation is accomplished will become apparent in conjunction with the following description of Huffman value decoding using the two tables 430A and 430B.

Given two Huffman decode tables 430A and 430B, the Huffman processor 422 performs a lookup on a chunk of compressed data 421 in three stages. First, the Huffman processor 422 determines whether the numerical value of the max-bits chunk 421 is greater than or equal to the Table 1 threshold (T1_thresh) **424*c*, which represents the smallest lookup address (i.e., Huffman value) that is in Table 430A. Note that for this and other comparisons, all Huffman values are assumed to be max-bits in length. Thus, each of the 9-bit addresses in the table 430A are evaluated as if they are left shifted and padded to 13-bits (max_bits) using zeros in the 4-least significant bit positions. I.e., the 9-bit addresses in the first table 430A** represent the most significant 9-bits of a 13-bit Huffman value. For example, the 9-bit address "101010101" would be evaluated as if it were "1010101010000".

If the max-bits chunk 421 is larger than the Table 1 threshold **424*c*, the Huffman processor 422 performs a table lookup in the table 430A using the nine most significant bits 421H of the chunk 421 as the lookup address. As described in reference to FIG. 8, the returned value 401 is the 9-bit value 281 associated with the Huffman value that maps to that address 421**.

If the numerical value of the max_bits chunk 421 is less than the Table 1 threshold **424*c* and is greater than or equal to a similar Table 2 threshold 424*d*, the Huffman processor 422 does a 13-bit lookup in the Table 430B using the least significant 10-bits 421L of the 13-bit chunk 421. This is only possible because, when two Huffman decode tables 430A, 430B are used, the present invention requires that Huffman values 305 be allocated to 9-bit categories in such a way that all of the 9-bit categories that fall into the second table have Huffman values whose "r" most significant bits (where "r" is the difference between max_bits 424*e* and the number of bits in the first table—e.g., 3 in the preferred embodiment) are all zeros. When this is true the 13-bit lookup can be performed into the 10-bit address space of the table 430B. As in the previous lookup, the returned 9-bit category 401** is associated with the Huffman value/address used for the lookup.

Actual examples of the 9-bit and 10-bit lookup tables 430A, 430B used in the preferred embodiment are shown in Appendix E. In these examples, the respective 9 or 10-bit lookup addresses of the tables 430A and 430B are represented by the "array val" field. Thus, the "array vals" for the table 430 are between 0 and 511 (corresponding to the 29 entries in table 430A) and the "array vals" for the table 430B are between 0 and 1023. The number of bits field 432 and 9-bit category field 434 from the respective tables 430A, 430B are encoded as a single decimal value "dec value". This "dec value" can be decoded by converting it to its 16-bit binary representation, wherein the least significant 9 bits (b0 to b8) are the 9-bit category 281, the next bit (b9) is a place holder, the next 5-bits (b10 to b14) provide the number of bits 432 and the MSB (b15) is not used. Thus, using Table 430A, for "array val"=64 (corresponding to a 9-bit address 001000000), "dec val"=16411, which has the binary representation: 0 10000 0 000011011. From this binary representation, it can be determined that the number of bits in the corresponding Huffman value is 8 ("01000") and the associated 9-bit category is 27 ("000011011"). One can verify this result by referring back to the Huffman table 300 shown in Appendix C.

When the numerical value of the max_bits chunk 421 is less than the Table 2 threshold **424*d*, the Huffman lookup processor 422 outputs the least significant 9-bits of the truncated chunk. As described in connection with FIG. 8, these 9-bits are written into the max-length Huffman 305 whenever the compressor cannot assign a Huffman value to an infrequent 9-bit category. Note that in the preferred embodiment, the Table 2 threshold 424*d* is set to 0, meaning that all of the 9-bit categories have Huffman values in one of the two tables 430A, 430B**.

The Huffman lookup processor 422 is a state machine that keeps track of and controls the progress of the Huffman decompression operation based partly on stored status data. One particularly important item of status data is the bits_used variable **424*a* that is continually updated by the Huffman lookup processor 422 to indicate how many bits of the compressed data currently stored in the input buffer 420 have already been processed (i.e., decompressed). The status data also includes a bits_avail variable 424*b* that indicates how many of the bits in the input buffer 420** remain to be processed.

Because the Huffman decompression method of the present invention uses a lookup technique wherein a multi-bit block of compressed data is used to read out a 9-bit category value from an inverse Huffman table 430, the Huffman lookup processor cannot perform a lookup until there is enough data in the input buffer 430 for the worst case Huffman value, which could be as long as 16-bits. Moreover, there is no guarantee that, just because the input buffer 420 has max_bits of stored data, that all of those bits belong to a single Huffman value. This is because the output register 390 can package multiple Huffman values together and can also package incomplete Huffman values. For example, assuming the output buffer 390 provides 8-bits of data at a time, one buffer of compressed data 105 might include a 7-bit Huffman value and one bit from a 16-bit Huffman value that corresponds to the next pixel.

Consequently after each lookup, the Huffman lookup processor 422 updates the bits_used and bits_avail variables **424*a*, 424*b* and issues the bits_used message 423*a* to the input buffer 420. Upon receiving this message, the input buffer makes the bits_used 424 unavailable for further processing. If at this point, bits_avail 424 is still greater than or equal to max_bits 424*e*, the Huffman lookup processor 422 performs another lookup on the remaining bits in the lookup buffer. If bits_avail 424*b* is less than max_bits 424*e*, the Huffman lookup processor 422 issues the get_bits message 423*b* to the input buffer, upon which the input buffer 420 loads another 8-bit chunk 105 from the output buffer 390 (in alternative embodiments, this could also be a 4 or 12 bit chunk) and passes the new bits on to the Huffman lookup processor 422 along with the other available bits in the input buffer 420**.

Once it has decompressed a Huffman datum from the compressed bit stream 105, the Huffman lookup processor 422 outputs the corresponding 9-bit category 401 to the stage 1 decompression processor 440. The decompression processor 440 then performs a lookup into the appropriate inverse category lookup table 460A, 460B using 3-bits of the 9-bit category 401 and 5-bits of the 15-bit previous value (computed by the decompressor 106 in the previous processing interval). Note that the inverse lookup tables 460A and 460B are respectively associated with the lookup tables 210A and 210B and are used in the same alternating pattern. As with the lookup tables 210, the value of the 5-bit previous pixel is set to 16 when the pixels being decoded are in the first row or first column of a frame. Using respective ones of the 5-bit previous values and 3-bit categories from the 9-bit combined category 401, the decompression processor 440 is able to generate the 5-bit RGB values for a decompressed video datum **107*i***, which is packaged as a 16-bit value that can be displayed as part of a video image.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

APPENDIX A

Lookup Table 210A

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| out | 0 | 1 | 1 | 2 | 2 | 2 | 3 | 3 | 3 | 3 | 3 | 4 | 4 | 4 | 4 | 4 | 5 | 5 | 5 | 5 | 5 | 6 | 6 | 6 | 6 | 6 | 7 | 7 | 7 | 7 | 7 | 7 |
| outRGB | 0 | 1 | 1 | 3 | 3 | 3 | 8 | 8 | 8 | 8 | 8 | 13 | 13 | 13 | 13 | 13 | 18 | 18 | 18 | 18 | 18 | 23 | 23 | 23 | 23 | 23 | 29 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| out | 0 | 0 | 1 | 1 | 2 | 2 | 2 | 3 | 3 | 3 | 3 | 3 | 4 | 4 | 4 | 4 | 4 | 5 | 5 | 5 | 5 | 5 | 6 | 6 | 6 | 6 | 6 | 7 | 7 | 7 | 7 | 7 |
| outRGB | 1 | 1 | 2 | 2 | 4 | 4 | 4 | 9 | 9 | 9 | 9 | 9 | 14 | 14 | 14 | 14 | 14 | 19 | 19 | 19 | 19 | 19 | 24 | 24 | 24 | 24 | 24 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 |
| out | 2 | 0 | 0 | 1 | 1 | 3 | 3 | 3 | 4 | 4 | 4 | 4 | 4 | 5 | 5 | 5 | 5 | 5 | 5 | 6 | 6 | 6 | 6 | 6 | 6 | 7 | 7 | 7 | 7 | 7 | 7 | 7 |
| outRGB | 1 | 2 | 2 | 3 | 3 | 5 | 5 | 5 | 10 | 10 | 10 | 10 | 10 | 15 | 15 | 15 | 15 | 15 | 15 | 22 | 22 | 22 | 22 | 22 | 22 | 28 | 28 | 28 | 28 | 28 | 28 | 28 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 |
| out | 2 | 2 | 0 | 0 | 1 | 1 | 3 | 3 | 3 | 4 | 4 | 4 | 4 | 4 | 5 | 5 | 5 | 5 | 5 | 6 | 6 | 6 | 6 | 6 | 6 | 7 | 7 | 7 | 7 | 7 | 7 | 7 |
| outRGB | 1 | 1 | 3 | 3 | 4 | 4 | 6 | 6 | 6 | 11 | 11 | 11 | 11 | 11 | 16 | 16 | 16 | 16 | 16 | 22 | 22 | 22 | 22 | 22 | 22 | 28 | 28 | 28 | 28 | 28 | 28 | 28 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |
| out | 2 | 2 | 2 | 0 | 0 | 1 | 1 | 3 | 3 | 3 | 4 | 4 | 4 | 4 | 4 | 5 | 5 | 5 | 5 | 5 | 6 | 6 | 6 | 6 | 6 | 6 | 7 | 7 | 7 | 7 | 7 | 7 |
| outRGB | 2 | 2 | 2 | 4 | 4 | 5 | 5 | 7 | 7 | 7 | 12 | 12 | 12 | 12 | 12 | 17 | 17 | 17 | 17 | 17 | 23 | 23 | 23 | 23 | 23 | 23 | 29 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 |
| out | 2 | 2 | 2 | 2 | 0 | 0 | 1 | 1 | 3 | 3 | 3 | 4 | 4 | 4 | 4 | 4 | 5 | 5 | 5 | 5 | 5 | 6 | 6 | 6 | 6 | 6 | 7 | 7 | 7 | 7 | 7 | 7 |
| outRGB | 3 | 3 | 3 | 3 | 5 | 5 | 6 | 6 | 8 | 8 | 8 | 13 | 13 | 13 | 13 | 13 | 18 | 18 | 18 | 18 | 18 | 23 | 23 | 23 | 23 | 23 | 29 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 |
| out | 2 | 2 | 2 | 2 | 2 | 0 | 0 | 1 | 1 | 3 | 3 | 3 | 4 | 4 | 4 | 4 | 4 | 5 | 5 | 5 | 5 | 5 | 6 | 6 | 6 | 6 | 6 | 7 | 7 | 7 | 7 | 7 |
| outRGB | 4 | 4 | 4 | 4 | 4 | 6 | 6 | 7 | 7 | 9 | 9 | 9 | 14 | 14 | 14 | 14 | 14 | 19 | 19 | 19 | 19 | 19 | 24 | 24 | 24 | 24 | 24 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 |
| out | 4 | 4 | 4 | 2 | 2 | 2 | 0 | 0 | 1 | 1 | 3 | 3 | 3 | 5 | 5 | 5 | 5 | 5 | 6 | 6 | 6 | 6 | 6 | 6 | 6 | 7 | 7 | 7 | 7 | 7 | 7 | 7 |
| outRGB | 1 | 1 | 1 | 5 | 5 | 5 | 7 | 7 | 8 | 8 | 10 | 10 | 10 | 15 | 15 | 15 | 15 | 15 | 21 | 21 | 21 | 21 | 21 | 21 | 21 | 28 | 28 | 28 | 28 | 28 | 28 | 28 |

- 44 -

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 |
| out | 4 | 4 | 4 | 4 | 2 | 2 | 2 | 0 | 0 | 1 | 1 | 3 | 3 | 3 | 5 | 5 | 5 | 5 | 5 | 6 | 6 | 6 | 6 | 6 | 6 | 6 | 7 | 7 | 7 | 7 | 7 | 7 |
| outRGB | 1 | 1 | 1 | 1 | 6 | 6 | 6 | 8 | 8 | 9 | 9 | 11 | 11 | 11 | 16 | 16 | 16 | 16 | 16 | 22 | 22 | 22 | 22 | 22 | 22 | 22 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 |
| out | 4 | 4 | 4 | 4 | 4 | 2 | 2 | 2 | 0 | 0 | 1 | 1 | 3 | 3 | 3 | 5 | 5 | 5 | 5 | 5 | 6 | 6 | 6 | 6 | 6 | 7 | 7 | 7 | 7 | 7 | 7 | 7 |
| outRGB | 2 | 2 | 2 | 2 | 2 | 7 | 7 | 7 | 9 | 9 | 10 | 10 | 12 | 12 | 12 | 17 | 17 | 17 | 17 | 17 | 22 | 22 | 22 | 22 | 22 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 |
| out | 4 | 4 | 4 | 4 | 4 | 4 | 2 | 2 | 2 | 0 | 0 | 1 | 1 | 3 | 3 | 3 | 5 | 5 | 5 | 5 | 5 | 6 | 6 | 6 | 6 | 6 | 7 | 7 | 7 | 7 | 7 | 7 |
| outRGB | 2 | 2 | 2 | 2 | 2 | 2 | 8 | 8 | 8 | 10 | 10 | 11 | 11 | 13 | 13 | 13 | 18 | 18 | 18 | 18 | 18 | 23 | 23 | 23 | 23 | 23 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 |
| out | 4 | 4 | 4 | 4 | 4 | 4 | 4 | 2 | 2 | 2 | 0 | 0 | 1 | 1 | 3 | 3 | 3 | 5 | 5 | 5 | 5 | 5 | 6 | 6 | 6 | 6 | 6 | 7 | 7 | 7 | 7 | 7 |
| outRGB | 3 | 3 | 3 | 3 | 3 | 3 | 3 | 9 | 9 | 9 | 11 | 11 | 12 | 12 | 14 | 14 | 14 | 19 | 19 | 19 | 19 | 19 | 24 | 24 | 24 | 24 | 24 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 |
| out | 6 | 6 | 6 | 4 | 4 | 4 | 4 | 4 | 2 | 2 | 2 | 0 | 0 | 1 | 1 | 3 | 3 | 3 | 5 | 5 | 5 | 5 | 5 | 5 | 5 | 7 | 7 | 7 | 7 | 7 | 7 | 7 |
| outRGB | 1 | 1 | 1 | 5 | 5 | 5 | 5 | 5 | 10 | 10 | 10 | 12 | 12 | 13 | 13 | 15 | 15 | 15 | 21 | 21 | 21 | 21 | 21 | 21 | 21 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 |
| out | 6 | 6 | 6 | 6 | 4 | 4 | 4 | 4 | 4 | 2 | 2 | 2 | 0 | 0 | 1 | 1 | 3 | 3 | 3 | 5 | 5 | 5 | 5 | 5 | 5 | 7 | 7 | 7 | 7 | 7 | 7 | 7 |
| outRGB | 1 | 1 | 1 | 1 | 6 | 6 | 6 | 6 | 6 | 11 | 11 | 11 | 13 | 13 | 14 | 14 | 16 | 16 | 16 | 21 | 21 | 21 | 21 | 21 | 21 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 |
| out | 6 | 6 | 6 | 6 | 6 | 4 | 4 | 4 | 4 | 4 | 2 | 2 | 2 | 0 | 0 | 1 | 1 | 3 | 3 | 3 | 5 | 5 | 5 | 5 | 5 | 7 | 7 | 7 | 7 | 7 | 7 | 7 |
| outRGB | 2 | 2 | 2 | 2 | 2 | 7 | 7 | 7 | 7 | 7 | 12 | 12 | 12 | 14 | 14 | 15 | 15 | 17 | 17 | 17 | 22 | 22 | 22 | 22 | 22 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 |
| out | 6 | 6 | 6 | 6 | 6 | 6 | 4 | 4 | 4 | 4 | 4 | 2 | 2 | 2 | 0 | 0 | 1 | 1 | 3 | 3 | 3 | 5 | 5 | 5 | 5 | 5 | 7 | 7 | 7 | 7 | 7 | 7 |
| outRGB | 2 | 2 | 2 | 2 | 2 | 2 | 8 | 8 | 8 | 8 | 8 | 13 | 13 | 13 | 15 | 15 | 16 | 16 | 18 | 18 | 18 | 23 | 23 | 23 | 23 | 23 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 |
| out | 6 | 6 | 6 | 6 | 6 | 6 | 6 | 4 | 4 | 4 | 4 | 4 | 2 | 2 | 2 | 0 | 0 | 1 | 1 | 3 | 3 | 3 | 5 | 5 | 5 | 5 | 5 | 7 | 7 | 7 | 7 | 7 |
| outRGB | 3 | 3 | 3 | 3 | 3 | 3 | 3 | 9 | 9 | 9 | 9 | 9 | 14 | 14 | 14 | 16 | 16 | 17 | 17 | 19 | 19 | 19 | 24 | 24 | 24 | 24 | 24 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |

- 45 -

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| prevRGB | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 |
| out | 6 | 6 | 6 | 6 | 6 | 6 | 4 | 4 | 4 | 4 | 4 | 4 | 4 | 2 | 2 | 2 | 0 | 0 | 1 | 1 | 3 | 3 | 3 | 5 | 5 | 5 | 5 | 5 | 7 | 7 | 7 | 7 |
| outRGB | 2 | 2 | 2 | 2 | 2 | 2 | 9 | 9 | 9 | 9 | 9 | 9 | 9 | 15 | 15 | 15 | 17 | 17 | 18 | 18 | 20 | 20 | 20 | 25 | 25 | 25 | 25 | 25 | 30 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 |
| out | 6 | 6 | 6 | 6 | 6 | 6 | 6 | 4 | 4 | 4 | 4 | 4 | 4 | 4 | 2 | 2 | 2 | 0 | 0 | 1 | 1 | 3 | 3 | 3 | 5 | 5 | 5 | 5 | 5 | 7 | 7 | 7 |
| outRGB | 3 | 3 | 3 | 3 | 3 | 3 | 3 | 10 | 10 | 10 | 10 | 10 | 10 | 10 | 16 | 16 | 16 | 18 | 18 | 19 | 19 | 21 | 21 | 21 | 26 | 26 | 26 | 26 | 26 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 |
| out | 7 | 7 | 7 | 7 | 7 | 6 | 6 | 6 | 6 | 6 | 4 | 4 | 4 | 4 | 4 | 2 | 2 | 2 | 0 | 0 | 1 | 1 | 3 | 3 | 3 | 5 | 5 | 5 | 5 | 5 | 5 | 5 |
| outRGB | 1 | 1 | 1 | 1 | 1 | 7 | 7 | 7 | 7 | 7 | 12 | 12 | 12 | 12 | 12 | 17 | 17 | 17 | 19 | 19 | 20 | 20 | 22 | 22 | 22 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 |
| out | 7 | 7 | 7 | 7 | 7 | 7 | 6 | 6 | 6 | 6 | 6 | 4 | 4 | 4 | 4 | 4 | 2 | 2 | 2 | 0 | 0 | 1 | 1 | 3 | 3 | 3 | 5 | 5 | 5 | 5 | 5 | 5 |
| outRGB | 2 | 2 | 2 | 2 | 2 | 2 | 8 | 8 | 8 | 8 | 8 | 13 | 13 | 13 | 13 | 13 | 18 | 18 | 18 | 20 | 20 | 21 | 21 | 23 | 23 | 23 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 |
| out | 7 | 7 | 7 | 7 | 7 | 7 | 6 | 6 | 6 | 6 | 6 | 6 | 4 | 4 | 4 | 4 | 4 | 2 | 2 | 2 | 0 | 0 | 1 | 1 | 3 | 3 | 3 | 5 | 5 | 5 | 5 | 5 |
| outRGB | 2 | 2 | 2 | 2 | 2 | 2 | 8 | 8 | 8 | 8 | 8 | 8 | 14 | 14 | 14 | 14 | 14 | 19 | 19 | 19 | 21 | 21 | 22 | 22 | 24 | 24 | 24 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 |
| out | 7 | 7 | 7 | 7 | 7 | 7 | 6 | 6 | 6 | 6 | 6 | 6 | 6 | 4 | 4 | 4 | 4 | 4 | 2 | 2 | 2 | 0 | 0 | 1 | 1 | 3 | 3 | 3 | 5 | 5 | 5 | 5 |
| outRGB | 2 | 2 | 2 | 2 | 2 | 2 | 9 | 9 | 9 | 9 | 9 | 9 | 9 | 15 | 15 | 15 | 15 | 15 | 20 | 20 | 20 | 22 | 22 | 23 | 23 | 25 | 25 | 25 | 30 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 |
| out | 7 | 7 | 7 | 7 | 7 | 7 | 7 | 6 | 6 | 6 | 6 | 6 | 6 | 6 | 4 | 4 | 4 | 4 | 4 | 2 | 2 | 2 | 0 | 0 | 1 | 1 | 3 | 3 | 3 | 5 | 5 | 5 |
| outRGB | 3 | 3 | 3 | 3 | 3 | 3 | 3 | 10 | 10 | 10 | 10 | 10 | 10 | 10 | 16 | 16 | 16 | 16 | 16 | 21 | 21 | 21 | 23 | 23 | 24 | 24 | 26 | 26 | 26 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 |
| out | 7 | 7 | 7 | 7 | 7 | 7 | 7 | 7 | 6 | 6 | 6 | 6 | 6 | 6 | 6 | 4 | 4 | 4 | 4 | 4 | 2 | 2 | 2 | 0 | 0 | 1 | 1 | 3 | 3 | 3 | 5 | 5 |
| outRGB | 3 | 3 | 3 | 3 | 3 | 3 | 3 | 3 | 11 | 11 | 11 | 11 | 11 | 11 | 11 | 17 | 17 | 17 | 17 | 17 | 22 | 22 | 22 | 24 | 24 | 25 | 25 | 27 | 27 | 27 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 |
| out | 7 | 7 | 7 | 7 | 7 | 6 | 6 | 6 | 6 | 6 | 5 | 5 | 5 | 5 | 5 | 5 | 4 | 4 | 4 | 4 | 4 | 2 | 2 | 2 | 0 | 0 | 1 | 1 | 3 | 3 | 3 | 3 |
| outRGB | 2 | 2 | 2 | 2 | 2 | 7 | 7 | 7 | 7 | 7 | 13 | 13 | 13 | 13 | 13 | 13 | 18 | 18 | 18 | 18 | 18 | 23 | 23 | 23 | 25 | 25 | 26 | 26 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 |

- 46 -

| out | 7 | 7 | 7 | 7 | 7 | 6 | 6 | 6 | 6 | 6 | 6 | 5 | 5 | 5 | 5 | 5 | 5 | 4 | 4 | 4 | 4 | 4 | 2 | 2 | 2 | 0 | 0 | 1 | 1 | 3 | 3 | 3 |
|---|---|---|---|---|---|---|---|---|---|---|---|---|---|---|---|---|---|---|---|---|---|---|---|---|---|---|---|---|---|---|---|---|
| outRGB | 2 | 2 | 2 | 2 | 2 | 8 | 8 | 8 | 8 | 8 | 8 | 14 | 14 | 14 | 14 | 14 | 14 | 19 | 19 | 19 | 19 | 19 | 24 | 24 | 24 | 26 | 26 | 27 | 27 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 |
| out | 7 | 7 | 7 | 7 | 7 | 7 | 6 | 6 | 6 | 6 | 6 | 6 | 5 | 5 | 5 | 5 | 5 | 5 | 4 | 4 | 4 | 4 | 4 | 2 | 2 | 2 | 0 | 0 | 1 | 1 | 3 | 3 |
| outRGB | 2 | 2 | 2 | 2 | 2 | 2 | 9 | 9 | 9 | 9 | 9 | 9 | 15 | 15 | 15 | 15 | 15 | 15 | 20 | 20 | 20 | 20 | 20 | 25 | 25 | 25 | 27 | 27 | 28 | 28 | 30 | 30 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 |
| out | 7 | 7 | 7 | 7 | 6 | 6 | 6 | 6 | 6 | 5 | 5 | 5 | 5 | 5 | 4 | 4 | 4 | 4 | 4 | 3 | 3 | 3 | 3 | 3 | 2 | 2 | 2 | 0 | 0 | 1 | 1 | 1 |
| outRGB | 1 | 1 | 1 | 1 | 6 | 6 | 6 | 6 | 6 | 11 | 11 | 11 | 11 | 11 | 16 | 16 | 16 | 16 | 16 | 21 | 21 | 21 | 21 | 21 | 26 | 26 | 26 | 28 | 28 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 |
| out | 7 | 7 | 7 | 7 | 7 | 6 | 6 | 6 | 6 | 6 | 5 | 5 | 5 | 5 | 5 | 4 | 4 | 4 | 4 | 4 | 3 | 3 | 3 | 3 | 3 | 2 | 2 | 2 | 0 | 0 | 1 | 1 |
| outRGB | 2 | 2 | 2 | 2 | 2 | 7 | 7 | 7 | 7 | 7 | 12 | 12 | 12 | 12 | 12 | 17 | 17 | 17 | 17 | 17 | 22 | 22 | 22 | 22 | 22 | 27 | 27 | 27 | 29 | 29 | 30 | 30 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 |
| out | 7 | 7 | 7 | 7 | 7 | 7 | 6 | 6 | 6 | 6 | 6 | 5 | 5 | 5 | 5 | 5 | 4 | 4 | 4 | 4 | 4 | 3 | 3 | 3 | 3 | 3 | 2 | 2 | 2 | 0 | 0 | 1 |
| outRGB | 2 | 2 | 2 | 2 | 2 | 2 | 8 | 8 | 8 | 8 | 8 | 13 | 13 | 13 | 13 | 13 | 18 | 18 | 18 | 18 | 18 | 23 | 23 | 23 | 23 | 23 | 28 | 28 | 28 | 30 | 30 | 31 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 |
| out | 7 | 7 | 7 | 7 | 7 | 7 | 6 | 6 | 6 | 6 | 6 | 5 | 5 | 5 | 5 | 5 | 4 | 4 | 4 | 4 | 4 | 3 | 3 | 3 | 3 | 2 | 2 | 2 | 1 | 1 | 0 | 0 |
| outRGB | 2 | 2 | 2 | 2 | 2 | 2 | 8 | 8 | 8 | 8 | 8 | 13 | 13 | 13 | 13 | 13 | 18 | 18 | 18 | 18 | 18 | 23 | 23 | 23 | 23 | 27 | 27 | 27 | 30 | 30 | 31 | 31 |

- 47 -

APPENDIX B

Lookup Table 210B

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| out 0 | 0 | 1 | 1 | 2 | 2 | 2 | 3 | 3 | 3 | 3 | 4 | 4 | 4 | 4 | 4 | 5 | 5 | 5 | 5 | 5 | 6 | 6 | 6 | 6 | 6 | 7 | 7 | 7 | 7 | 7 | 7 | |
| outRGB | 0 | 0 | 1 | 1 | 4 | 4 | 4 | 8 | 8 | 8 | 8 | 13 | 13 | 13 | 13 | 13 | 18 | 18 | 18 | 18 | 18 | 23 | 23 | 23 | 23 | 23 | 29 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| out 1 | 0 | 0 | 2 | 2 | 2 | 3 | 3 | 3 | 3 | 3 | 4 | 4 | 4 | 4 | 4 | 5 | 5 | 5 | 5 | 5 | 6 | 6 | 6 | 6 | 6 | 7 | 7 | 7 | 7 | 7 | 7 | |
| outRGB | 0 | 1 | 1 | 3 | 3 | 3 | 8 | 8 | 8 | 8 | 8 | 13 | 13 | 13 | 13 | 13 | 18 | 18 | 18 | 18 | 18 | 23 | 23 | 23 | 23 | 23 | 29 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 | 2 |
| out 1 | 1 | 0 | 0 | 2 | 2 | 2 | 3 | 3 | 3 | 3 | 3 | 4 | 4 | 4 | 4 | 4 | 5 | 5 | 5 | 5 | 5 | 6 | 6 | 6 | 6 | 6 | 7 | 7 | 7 | 7 | 7 | 7 |
| outRGB | 1 | 1 | 2 | 2 | 4 | 4 | 4 | 9 | 9 | 9 | 9 | 9 | 14 | 14 | 14 | 14 | 14 | 19 | 19 | 19 | 19 | 19 | 24 | 24 | 24 | 24 | 24 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 |
| out 1 | 1 | 1 | 0 | 0 | 2 | 2 | 2 | 3 | 3 | 3 | 3 | 3 | 4 | 4 | 4 | 4 | 4 | 5 | 5 | 5 | 5 | 5 | 6 | 6 | 6 | 6 | 6 | 7 | 7 | 7 | 7 | |
| outRGB | 2 | 2 | 2 | 3 | 3 | 5 | 5 | 5 | 10 | 10 | 10 | 10 | 10 | 15 | 15 | 15 | 15 | 15 | 20 | 20 | 20 | 20 | 20 | 25 | 25 | 25 | 25 | 25 | 30 | 30 | 30 | 30 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 | 4 |
| out 3 | 3 | 1 | 1 | 0 | 0 | 2 | 2 | 2 | 4 | 4 | 4 | 4 | 4 | 5 | 5 | 5 | 5 | 5 | 5 | 6 | 6 | 6 | 6 | 6 | 6 | 7 | 7 | 7 | 7 | 7 | 7 | |
| outRGB | 1 | 1 | 3 | 3 | 4 | 4 | 6 | 6 | 6 | 11 | 11 | 11 | 11 | 11 | 16 | 16 | 16 | 16 | 16 | 16 | 22 | 22 | 22 | 22 | 22 | 22 | 29 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 | 5 |
| out 3 | 3 | 3 | 1 | 1 | 0 | 0 | 2 | 2 | 2 | 4 | 4 | 4 | 4 | 4 | 5 | 5 | 5 | 5 | 5 | 5 | 6 | 6 | 6 | 6 | 6 | 6 | 7 | 7 | 7 | 7 | 7 | |
| outRGB | 2 | 2 | 2 | 4 | 4 | 5 | 5 | 7 | 7 | 7 | 12 | 12 | 12 | 12 | 12 | 17 | 17 | 17 | 17 | 17 | 17 | 23 | 23 | 23 | 23 | 23 | 23 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 | 6 |
| out 3 | 3 | 3 | 3 | 1 | 1 | 0 | 0 | 2 | 2 | 2 | 4 | 4 | 4 | 4 | 4 | 5 | 5 | 5 | 5 | 5 | 5 | 6 | 6 | 6 | 6 | 6 | 7 | 7 | 7 | 7 | 7 | |
| outRGB | 3 | 3 | 3 | 3 | 5 | 5 | 6 | 6 | 8 | 8 | 8 | 13 | 13 | 13 | 13 | 13 | 18 | 18 | 18 | 18 | 18 | 18 | 24 | 24 | 24 | 24 | 24 | 29 | 29 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 | 7 |
| out 5 | 5 | 3 | 3 | 3 | 1 | 1 | 0 | 0 | 2 | 2 | 2 | 4 | 4 | 4 | 4 | 4 | 6 | 6 | 6 | 6 | 6 | 6 | 6 | 7 | 7 | 7 | 7 | 7 | 7 | 7 | 7 | |
| outRGB | 1 | 1 | 4 | 4 | 4 | 6 | 6 | 7 | 7 | 9 | 9 | 9 | 14 | 14 | 14 | 14 | 14 | 20 | 20 | 20 | 20 | 20 | 20 | 20 | 28 | 28 | 28 | 28 | 28 | 28 | 28 | 28 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 | 8 |
| out 5 | 5 | 5 | 3 | 3 | 3 | 1 | 1 | 0 | 0 | 2 | 2 | 2 | 4 | 4 | 4 | 4 | 4 | 6 | 6 | 6 | 6 | 6 | 6 | 6 | 7 | 7 | 7 | 7 | 7 | 7 | 7 | |
| outRGB | 1 | 1 | 1 | 5 | 5 | 5 | 7 | 7 | 8 | 8 | 10 | 10 | 10 | 15 | 15 | 15 | 15 | 15 | 21 | 21 | 21 | 21 | 21 | 21 | 21 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 | 9 |
| out 5 | 5 | 5 | 5 | 3 | 3 | 3 | 1 | 1 | 0 | 0 | 2 | 2 | 2 | 4 | 4 | 4 | 4 | 4 | 6 | 6 | 6 | 6 | 6 | 6 | 6 | 7 | 7 | 7 | 7 | 7 | 7 | |
| outRGB | 1 | 1 | 1 | 1 | 6 | 6 | 6 | 8 | 8 | 9 | 9 | 11 | 11 | 11 | 16 | 16 | 16 | 16 | 16 | 22 | 22 | 22 | 22 | 22 | 22 | 22 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 | 10 |
| out 5 | 5 | 5 | 5 | 5 | 3 | 3 | 3 | 1 | 1 | 0 | 0 | 2 | 2 | 2 | 4 | 4 | 4 | 4 | 4 | 6 | 6 | 6 | 6 | 6 | 6 | 7 | 7 | 7 | 7 | 7 | 7 | |
| outRGB | 2 | 2 | 2 | 2 | 2 | 7 | 7 | 7 | 9 | 9 | 10 | 10 | 12 | 12 | 12 | 17 | 17 | 17 | 17 | 17 | 23 | 23 | 23 | 23 | 23 | 23 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 | 11 |
| out 5 | 5 | 5 | 5 | 5 | 5 | 3 | 3 | 3 | 1 | 1 | 0 | 0 | 2 | 2 | 2 | 4 | 4 | 4 | 4 | 4 | 6 | 6 | 6 | 6 | 6 | 7 | 7 | 7 | 7 | 7 | 7 | |
| outRGB | 3 | 3 | 3 | 3 | 3 | 3 | 8 | 8 | 8 | 10 | 10 | 11 | 11 | 13 | 13 | 13 | 18 | 18 | 18 | 18 | 18 | 23 | 23 | 23 | 23 | 23 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 | 12 |
| out 5 | 5 | 5 | 5 | 5 | 5 | 5 | 3 | 3 | 3 | 1 | 1 | 0 | 0 | 2 | 2 | 2 | 4 | 4 | 4 | 4 | 4 | 6 | 6 | 6 | 6 | 6 | 7 | 7 | 7 | 7 | 7 | |
| outRGB | 3 | 3 | 3 | 3 | 3 | 3 | 3 | 9 | 9 | 9 | 11 | 11 | 12 | 12 | 14 | 14 | 14 | 19 | 19 | 19 | 19 | 19 | 24 | 24 | 24 | 24 | 24 | 30 | 30 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 |
| out 7 | 7 | 7 | 5 | 5 | 5 | 5 | 5 | 3 | 3 | 3 | 1 | 1 | 0 | 0 | 2 | 2 | 2 | 4 | 4 | 4 | 4 | 4 | 4 | 4 | 6 | 6 | 6 | 5 | 6 | 6 | 6 | |
| outRGB | 1 | 1 | 1 | 5 | 5 | 5 | 5 | 5 | 10 | 10 | 10 | 12 | 12 | 13 | 13 | 15 | 15 | 15 | 21 | 21 | 21 | 21 | 21 | 21 | 21 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 | 14 |
| out 7 | 7 | 7 | 7 | 5 | 5 | 5 | 5 | 5 | 3 | 3 | 3 | 1 | 1 | 0 | 0 | 2 | 2 | 2 | 4 | 4 | 4 | 4 | 4 | 4 | 4 | 6 | 6 | 6 | 6 | 6 | 6 | |
| outRGB | 1 | 1 | 1 | 1 | 6 | 6 | 6 | 6 | 6 | 11 | 11 | 11 | 13 | 13 | 14 | 14 | 16 | 16 | 16 | 22 | 22 | 22 | 22 | 22 | 22 | 22 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 | 15 |
| out 7 | 7 | 7 | 7 | 7 | 5 | 5 | 5 | 5 | 5 | 3 | 3 | 3 | 1 | 1 | 0 | 0 | 2 | 2 | 2 | 4 | 4 | 4 | 4 | 4 | 6 | 6 | 6 | 6 | 6 | 6 | 6 | |
| outRGB | 2 | 2 | 2 | 2 | 2 | 7 | 7 | 7 | 7 | 7 | 12 | 12 | 12 | 14 | 14 | 15 | 15 | 17 | 17 | 17 | 22 | 22 | 22 | 22 | 22 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 | 16 |
| out 7 | 7 | 7 | 7 | 7 | 7 | 5 | 5 | 5 | 5 | 5 | 3 | 3 | 3 | 1 | 1 | 0 | 0 | 2 | 2 | 2 | 4 | 4 | 4 | 4 | 4 | 6 | 6 | 6 | 6 | 6 | 6 | |
| outRGB | 2 | 2 | 2 | 2 | 2 | 2 | 8 | 8 | 8 | 8 | 8 | 13 | 13 | 13 | 15 | 15 | 16 | 16 | 18 | 18 | 18 | 23 | 23 | 23 | 23 | 23 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |

- 49 -

| | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|
| prevRGB | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 | 17 |
| out 7 | 7 | 7 | 7 | 7 | 7 | 7 | 5 | 5 | 5 | 5 | 5 | 3 | 3 | 3 | 1 | 1 | 0 | 0 | 2 | 2 | 2 | 4 | 4 | 4 | 4 | 4 | 6 | 6 | 6 | 6 | 6 | |
| outRGB | 3 | 3 | 3 | 3 | 3 | 3 | 3 | 9 | 9 | 9 | 9 | 9 | 14 | 14 | 14 | 16 | 16 | 17 | 17 | 19 | 19 | 19 | 24 | 24 | 24 | 24 | 24 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 | 18 |
| out 7 | 7 | 7 | 7 | 7 | 7 | 7 | 5 | 5 | 5 | 5 | 5 | 5 | 3 | 3 | 3 | 1 | 1 | 0 | 0 | 2 | 2 | 2 | 4 | 4 | 4 | 4 | 4 | 6 | 6 | 6 | 6 | |
| outRGB | 3 | 3 | 3 | 3 | 3 | 3 | 3 | 10 | 10 | 10 | 10 | 10 | 10 | 15 | 15 | 15 | 17 | 17 | 18 | 18 | 20 | 20 | 20 | 25 | 25 | 25 | 25 | 25 | 30 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 | 19 |
| out 7 | 7 | 7 | 7 | 7 | 7 | 7 | 5 | 5 | 5 | 5 | 5 | 5 | 5 | 3 | 3 | 3 | 1 | 1 | 0 | 0 | 2 | 2 | 2 | 4 | 4 | 4 | 4 | 4 | 6 | 6 | 6 | |
| outRGB | 3 | 3 | 3 | 3 | 3 | 3 | 3 | 10 | 10 | 10 | 10 | 10 | 10 | 10 | 16 | 16 | 16 | 18 | 18 | 19 | 19 | 21 | 21 | 21 | 26 | 26 | 26 | 26 | 26 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 | 20 |
| out 7 | 7 | 7 | 7 | 7 | 6 | 6 | 6 | 6 | 6 | 5 | 5 | 5 | 5 | 5 | 3 | 3 | 3 | 1 | 1 | 0 | 0 | 2 | 2 | 2 | 4 | 4 | 4 | 4 | 4 | 4 | 4 | |
| outRGB | 2 | 2 | 2 | 2 | 2 | 7 | 7 | 7 | 7 | 7 | 12 | 12 | 12 | 12 | 12 | 17 | 17 | 17 | 19 | 19 | 20 | 20 | 22 | 22 | 22 | 28 | 28 | 28 | 28 | 28 | 28 | 28 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 | 21 |
| out 7 | 7 | 7 | 7 | 7 | 7 | 6 | 6 | 6 | 6 | 6 | 5 | 5 | 5 | 5 | 5 | 3 | 3 | 3 | 1 | 1 | 0 | 0 | 2 | 2 | 2 | 4 | 4 | 4 | 4 | 4 | 4 | |
| outRGB | 2 | 2 | 2 | 2 | 2 | 2 | 8 | 8 | 8 | 8 | 8 | 13 | 13 | 13 | 13 | 13 | 18 | 18 | 18 | 20 | 20 | 21 | 21 | 23 | 23 | 23 | 29 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 | 22 |
| out 7 | 7 | 7 | 7 | 7 | 7 | 7 | 6 | 6 | 6 | 6 | 6 | 5 | 5 | 5 | 5 | 5 | 3 | 3 | 3 | 1 | 1 | 0 | 0 | 2 | 2 | 2 | 4 | 4 | 4 | 4 | 4 | |
| outRGB | 3 | 3 | 3 | 3 | 3 | 3 | 3 | 9 | 9 | 9 | 9 | 9 | 14 | 14 | 14 | 14 | 14 | 19 | 19 | 19 | 21 | 21 | 22 | 22 | 24 | 24 | 24 | 29 | 29 | 29 | 29 | 29 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 | 23 |
| out 7 | 7 | 7 | 7 | 7 | 7 | 6 | 6 | 6 | 6 | 6 | 6 | 6 | 5 | 5 | 5 | 5 | 5 | 3 | 3 | 3 | 1 | 1 | 0 | 0 | 2 | 2 | 2 | 4 | 4 | 4 | 4 | |
| outRGB | 2 | 2 | 2 | 2 | 2 | 2 | 9 | 9 | 9 | 9 | 9 | 9 | 9 | 15 | 15 | 15 | 15 | 15 | 20 | 20 | 20 | 22 | 22 | 23 | 23 | 25 | 25 | 25 | 30 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 | 24 |
| out 7 | 7 | 7 | 7 | 7 | 7 | 7 | 6 | 6 | 6 | 6 | 6 | 6 | 6 | 5 | 5 | 5 | 5 | 5 | 3 | 3 | 3 | 1 | 1 | 0 | 0 | 2 | 2 | 2 | 4 | 4 | 4 | |
| outRGB | 3 | 3 | 3 | 3 | 3 | 3 | 3 | 10 | 10 | 10 | 10 | 10 | 10 | 10 | 16 | 16 | 16 | 16 | 16 | 21 | 21 | 21 | 23 | 23 | 24 | 24 | 26 | 26 | 26 | 30 | 30 | 30 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| prevRGB | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 | 25 |
| out 7 | 7 | 7 | 7 | 7 | 6 | 6 | 6 | 6 | 6 | 5 | 5 | 5 | 5 | 5 | 4 | 4 | 4 | 4 | 4 | 3 | 3 | 3 | 1 | 1 | 0 | 0 | 2 | 2 | 2 | 2 | 2 | |
| outRGB | 2 | 2 | 2 | 2 | 2 | 7 | 7 | 7 | 7 | 7 | 12 | 12 | 12 | 12 | 12 | 17 | 17 | 17 | 17 | 17 | 22 | 22 | 22 | 24 | 24 | 25 | 25 | 27 | 27 | 27 | 27 | 27 |
| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |

- 50 -

| prevRGB | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 26 | 25 |
|---|---|---|---|---|---|---|---|---|---|---|---|---|---|---|---|---|---|---|---|---|---|---|---|---|---|---|---|---|---|---|---|---|
| out 7 | 7 | 7 | 7 | 7 | 7 | 6 | 6 | 6 | 6 | 6 | 5 | 5 | 5 | 5 | 5 | 4 | 4 | 4 | 4 | 4 | 3 | 3 | 3 | 1 | 1 | 0 | 0 | 2 | 2 | 2 | 2 | |
| outRGB | 2 | 2 | 2 | 2 | 2 | 2 | 8 | 8 | 8 | 8 | 8 | 13 | 13 | 13 | 13 | 13 | 18 | 18 | 18 | 18 | 18 | 23 | 23 | 23 | 25 | 25 | 26 | 26 | 28 | 28 | 28 | 28 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 | 27 |
| out 7 | 7 | 7 | 7 | 7 | 7 | 6 | 6 | 6 | 6 | 6 | 6 | 5 | 5 | 5 | 5 | 5 | 4 | 4 | 4 | 4 | 4 | 3 | 3 | 3 | 1 | 1 | 0 | 0 | 2 | 2 | 2 | |
| outRGB | 2 | 2 | 2 | 2 | 2 | 2 | 8 | 8 | 8 | 8 | 8 | 8 | 14 | 14 | 14 | 14 | 14 | 19 | 19 | 19 | 19 | 19 | 24 | 24 | 24 | 26 | 26 | 27 | 27 | 29 | 29 | 29 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 | 28 |
| out 7 | 7 | 7 | 7 | 7 | 7 | 7 | 6 | 6 | 6 | 6 | 6 | 6 | 5 | 5 | 5 | 5 | 5 | 4 | 4 | 4 | 4 | 4 | 3 | 3 | 3 | 1 | 1 | 0 | 0 | 2 | 2 | |
| outRGB | 3 | 3 | 3 | 3 | 3 | 3 | 3 | 9 | 9 | 9 | 9 | 9 | 9 | 15 | 15 | 15 | 15 | 15 | 20 | 20 | 20 | 20 | 20 | 25 | 25 | 25 | 27 | 27 | 28 | 28 | 30 | 30 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 | 29 |
| out 7 | 7 | 7 | 7 | 7 | 7 | 7 | 6 | 6 | 6 | 6 | 6 | 6 | 5 | 5 | 5 | 5 | 5 | 5 | 4 | 4 | 4 | 4 | 4 | 3 | 3 | 3 | 1 | 1 | 0 | 0 | 2 | |
| outRGB | 3 | 3 | 3 | 3 | 3 | 3 | 3 | 9 | 9 | 9 | 9 | 9 | 9 | 16 | 16 | 16 | 16 | 16 | 16 | 21 | 21 | 21 | 21 | 21 | 26 | 26 | 26 | 28 | 28 | 29 | 29 | 30 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 | 30 |
| out 7 | 7 | 7 | 7 | 7 | 6 | 6 | 6 | 6 | 6 | 5 | 5 | 5 | 5 | 5 | 4 | 4 | 4 | 4 | 4 | 3 | 3 | 3 | 3 | 3 | 2 | 2 | 2 | 1 | 1 | 0 | 0 | |
| outRGB | 2 | 2 | 2 | 2 | 2 | 7 | 7 | 7 | 7 | 7 | 12 | 12 | 12 | 12 | 12 | 17 | 17 | 17 | 17 | 17 | 22 | 22 | 22 | 22 | 22 | 27 | 27 | 27 | 29 | 29 | 30 | 30 |

| inRGB | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| prevRGB | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 | 31 |
| out 7 | 7 | 7 | 7 | 7 | 7 | 6 | 6 | 6 | 6 | 6 | 5 | 5 | 5 | 5 | 5 | 4 | 4 | 4 | 4 | 4 | 3 | 3 | 3 | 3 | 3 | 2 | 2 | 2 | 1 | 1 | 0 | |
| outRGB | 2 | 2 | 2 | 2 | 2 | 2 | 8 | 8 | 8 | 8 | 8 | 13 | 13 | 13 | 13 | 13 | 18 | 18 | 18 | 18 | 18 | 23 | 23 | 23 | 23 | 23 | 28 | 28 | 28 | 30 | 30 | 31 |

APPENDIX C

Huffman Table 300

| array val | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| huff | 3 | 8 | 9 | 39 | 100 | 394 | 248 | 162 | 15 | 13 | 116 | 47 | 396 | 101 | 148 | 147 | 10 | 124 | 30 | 55 | 46 | 340 | 318 | 93 | 91 | 122 | 366 | 32 | 336 | 40 | 177 | 216 |
| bits | 2 | 4 | 5 | 8 | 10 | 13 | 13 | 13 | 5 | 5 | 10 | 8 | 13 | 10 | 13 | 13 | 5 | 10 | 7 | 10 | 8 | 13 | 13 | 13 | 10 | 10 | 13 | 8 | 13 | 8 | 13 | 13 |
| array val | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 |
| huff | 63 | 321 | 86 | 313 | 108 | 362 | 374 | 112 | 330 | 364 | 244 | 382 | 205 | 111 | 176 | 358 | 224 | 175 | 306 | 161 | 280 | 132 | 146 | 71 | 45 | 186 | 44 | 160 | 70 | 92 | 43 | 91 |
| bits | 10 | 13 | 10 | 13 | 10 | 13 | 13 | 13 | 13 | 13 | 13 | 13 | 13 | 10 | 13 | 13 | 13 | 13 | 13 | 13 | 13 | 13 | 13 | 13 | 13 | 13 | 13 | 13 | 13 | 13 | 13 | 13 |
| array val | 64 | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 | 90 | 91 | 92 | 93 | 94 | 95 |
| huff | 5 | 12 | 27 | 115 | 98 | 333 | 257 | 42 | 9 | 14 | 125 | 25 | 62 | 90 | 215 | 111 | 34 | 78 | 36 | 372 | 42 | 317 | 355 | 69 | 33 | 26 | 61 | 44 | 380 | 41 | 167 | 247 |
| bits | 3 | 5 | 7 | 10 | 10 | 13 | 13 | 13 | 4 | 5 | 10 | 7 | 10 | 10 | 13 | 13 | 8 | 10 | 8 | 13 | 8 | 13 | 13 | 13 | 8 | 7 | 10 | 8 | 13 | 8 | 13 | 13 |
| array val | 96 | 97 | 98 | 99 | 100 | 101 | 102 | 103 | 104 | 105 | 106 | 107 | 108 | 109 | 110 | 111 | 112 | 113 | 114 | 115 | 116 | 117 | 118 | 119 | 120 | 121 | 122 | 123 | 124 | 125 | 126 | 127 |
| huff | 371 | 320 | 57 | 344 | 103 | 386 | 50 | 110 | 379 | 68 | 265 | 72 | 261 | 92 | 145 | 287 | 185 | 159 | 241 | 196 | 214 | 131 | 109 | 90 | 158 | 204 | 41 | 184 | 40 | 213 | 39 | 264 |
| bits | 13 | 13 | 10 | 13 | 10 | 13 | 10 | 13 | 13 | 10 | 13 | 10 | 13 | 10 | 13 | 13 | 13 | 13 | 13 | 13 | 13 | 13 | 13 | 13 | 13 | 13 | 13 | 13 | 13 | 13 | 13 | 13 |
| array val | 128 | 129 | 130 | 131 | 132 | 133 | 134 | 135 | 136 | 137 | 138 | 139 | 140 | 141 | 142 | 143 | 144 | 145 | 146 | 147 | 148 | 149 | 150 | 151 | 152 | 153 | 154 | 155 | 156 | 157 | 158 | 159 |
| huff | 11 | 37 | 45 | 95 | 67 | 363 | 174 | 68 | 113 | 102 | 58 | 99 | 343 | 94 | 130 | 106 | 8 | 114 | 31 | 74 | 35 | 332 | 223 | 67 | 53 | 65 | 368 | 77 | 383 | 118 | 230 | 192 |
| bits | 5 | 8 | 8 | 10 | 10 | 13 | 13 | 13 | 10 | 10 | 10 | 10 | 13 | 10 | 13 | 13 | 5 | 10 | 7 | 10 | 8 | 13 | 13 | 13 | 10 | 10 | 13 | 10 | 13 | 10 | 13 | 13 |
| array val | 160 | 161 | 162 | 163 | 164 | 165 | 166 | 167 | 168 | 169 | 170 | 171 | 172 | 173 | 174 | 175 | 176 | 177 | 178 | 179 | 180 | 181 | 182 | 183 | 184 | 185 | 186 | 187 | 188 | 189 | 190 | 191 |
| huff | 96 | 335 | 126 | 361 | 112 | 325 | 310 | 66 | 286 | 326 | 240 | 334 | 253 | 88 | 144 | 305 | 329 | 239 | 342 | 107 | 353 | 106 | 279 | 38 | 89 | 256 | 143 | 129 | 142 | 141 | 37 | 36 |
| bits | 10 | 13 | 10 | 13 | 10 | 13 | 13 | 13 | 13 | 13 | 13 | 13 | 13 | 10 | 13 | 13 | 13 | 13 | 13 | 13 | 13 | 13 | 13 | 13 | 13 | 13 | 13 | 13 | 13 | 13 | 13 | 13 |
| array val | 192 | 193 | 194 | 195 | 196 | 197 | 198 | 199 | 200 | 201 | 202 | 203 | 204 | 205 | 206 | 207 | 208 | 209 | 210 | 211 | 212 | 213 | 214 | 215 | 216 | 217 | 218 | 219 | 220 | 221 | 222 | 223 |
| huff | 38 | 87 | 83 | 60 | 75 | 263 | 173 | 88 | 28 | 29 | 76 | 127 | 393 | 73 | 105 | 104 | 81 | 51 | 79 | 373 | 120 | 322 | 309 | 87 | 121 | 24 | 71 | 43 | 370 | 119 | 238 | 157 |
| bits | 8 | 10 | 10 | 10 | 10 | 13 | 13 | 13 | 7 | 7 | 10 | 10 | 13 | 10 | 13 | 13 | 10 | 10 | 10 | 13 | 10 | 13 | 13 | 13 | 10 | 7 | 10 | 8 | 13 | 10 | 13 | 13 |
| array val | 224 | 225 | 226 | 227 | 228 | 229 | 230 | 231 | 232 | 233 | 234 | 235 | 236 | 237 | 238 | 239 | 240 | 241 | 242 | 243 | 244 | 245 | 246 | 247 | 248 | 249 | 250 | 251 | 252 | 253 | 254 | 255 |
| huff | 348 | 365 | 392 | 395 | 64 | 52 | 354 | 65 | 384 | 104 | 289 | 97 | 302 | 85 | 229 | 268 | 255 | 243 | 254 | 203 | 222 | 237 | 156 | 128 | 236 | 288 | 172 | 284 | 155 | 272 | 86 | 235 |
| bits | 13 | 13 | 13 | 13 | 10 | 10 | 13 | 13 | 13 | 10 | 13 | 10 | 13 | 10 | 13 | 13 | 13 | 13 | 13 | 13 | 13 | 13 | 13 | 13 | 13 | 13 | 13 | 13 | 13 | 13 | 13 | 13 |
| array val | 256 | 257 | 258 | 259 | 260 | 261 | 262 | 263 | 264 | 265 | 266 | 267 | 268 | 269 | 270 | 271 | 272 | 273 | 274 | 275 | 276 | 277 | 278 | 279 | 280 | 281 | 282 | 283 | 284 | 285 | 286 | 287 |
| huff | 110 | 375 | 56 | 350 | 311 | 300 | 171 | 35 | 347 | 331 | 277 | 360 | 221 | 351 | 140 | 34 | 123 | 397 | 109 | 356 | 66 | 267 | 212 | 64 | 304 | 378 | 316 | 391 | 285 | 388 | 211 | 63 |
| bits | 10 | 13 | 10 | 13 | 13 | 13 | 13 | 13 | 13 | 13 | 13 | 13 | 13 | 13 | 13 | 13 | 10 | 13 | 10 | 13 | 10 | 13 | 13 | 13 | 13 | 13 | 13 | 13 | 13 | 13 | 13 | 13 |
| array val | 288 | 289 | 290 | 291 | 292 | 293 | 294 | 295 | 296 | 297 | 298 | 299 | 300 | 301 | 302 | 303 | 304 | 305 | 306 | 307 | 308 | 309 | 310 | 311 | 312 | 313 | 314 | 315 | 316 | 317 | 318 | 319 |
| huff | 89 | 338 | 107 | 352 | 117 | 328 | 339 | 127 | 210 | 308 | 183 | 291 | 228 | 294 | 182 | 33 | 346 | 209 | 376 | 202 | 387 | 126 | 315 | 166 | 246 | 234 | 201 | 165 | 195 | 125 | 85 | 32 |
| bits | 10 | 13 | 10 | 13 | 10 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 |

- 52 -

| array val | 320 | 321 | 322 | 323 | 324 | 325 | 326 | 327 | 328 | 329 | 330 | 331 | 332 | 333 | 334 | 335 | 336 | 337 | 338 | 339 | 340 | 341 | 342 | 343 | 344 | 345 | 346 | 347 | 348 | 349 | 350 | 351 |
|---|---|---|---|---|---|---|---|---|---|---|---|---|---|---|---|---|---|---|---|---|---|---|---|---|---|---|---|---|---|---|---|---|
| huff | 59 | 296 | 324 | 200 | 369 | 139 | 103 | 31 | 70 | 106 | 390 | 69 | 307 | 345 | 102 | 62 | 278 | 208 | 283 | 154 | 385 | 181 | 124 | 30 | 54 | 93 | 359 | 80 | 275 | 381 | 164 | 138 |
| bits | 10 | 13 | 13 | 13 | 13 | 13 | 13 | 13 | 10 | 10 | 13 | 10 | 13 | 13 | 13 | 13 | 13 | 13 | 13 | 13 | 13 | 13 | 13 | 13 | 10 | 10 | 13 | 10 | 13 | 13 | 13 | 13 |

| array val | 352 | 353 | 354 | 355 | 356 | 357 | 358 | 359 | 360 | 361 | 362 | 363 | 364 | 365 | 366 | 367 | 368 | 369 | 370 | 371 | 372 | 373 | 374 | 375 | 376 | 377 | 378 | 379 | 380 | 381 | 382 | 383 |
|---|---|---|---|---|---|---|---|---|---|---|---|---|---|---|---|---|---|---|---|---|---|---|---|---|---|---|---|---|---|---|---|---|
| huff | 191 | 233 | 260 | 262 | 274 | 199 | 250 | 123 | 377 | 62 | 295 | 84 | 301 | 105 | 252 | 293 | 122 | 242 | 198 | 266 | 207 | 299 | 64 | 227 | 190 | 337 | 220 | 314 | 101 | 327 | 29 | 259 |
| bits | 13 | 13 | 13 | 13 | 13 | 13 | 13 | 13 | 13 | 10 | 13 | 10 | 13 | 10 | 13 | 13 | 13 | 13 | 13 | 13 | 13 | 13 | 13 | 13 | 13 | 13 | 13 | 13 | 13 | 13 | 13 | 13 |

| array val | 384 | 385 | 386 | 387 | 388 | 389 | 390 | 391 | 392 | 393 | 394 | 395 | 396 | 397 | 398 | 399 | 400 | 401 | 402 | 403 | 404 | 405 | 406 | 407 | 408 | 409 | 410 | 411 | 412 | 413 | 414 | 415 |
|---|---|---|---|---|---|---|---|---|---|---|---|---|---|---|---|---|---|---|---|---|---|---|---|---|---|---|---|---|---|---|---|---|
| huff | 292 | 83 | 100 | 82 | 28 | 61 | 27 | 26 | 153 | 99 | 81 | 60 | 59 | 25 | 24 | 58 | 389 | 98 | 273 | 121 | 232 | 97 | 23 | 22 | 189 | 188 | 80 | 120 | 96 | 79 | 21 | 20 |
| bits | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 |

| array val | 416 | 417 | 418 | 419 | 420 | 421 | 422 | 423 | 424 | 425 | 426 | 427 | 428 | 429 | 430 | 431 | 432 | 433 | 434 | 435 | 436 | 437 | 438 | 439 | 440 | 441 | 442 | 443 | 444 | 445 | 446 | 447 |
|---|---|---|---|---|---|---|---|---|---|---|---|---|---|---|---|---|---|---|---|---|---|---|---|---|---|---|---|---|---|---|---|---|
| huff | 367 | 194 | 312 | 152 | 357 | 119 | 271 | 19 | 282 | 226 | 57 | 180 | 151 | 219 | 218 | 118 | 319 | 117 | 349 | 137 | 341 | 245 | 323 | 179 | 56 | 170 | 178 | 150 | 206 | 136 | 135 | 78 |
| bits | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 |

| array val | 448 | 449 | 450 | 451 | 452 | 453 | 454 | 455 | 456 | 457 | 458 | 459 | 460 | 461 | 462 | 463 | 464 | 465 | 466 | 467 | 468 | 469 | 470 | 471 | 472 | 473 | 474 | 475 | 476 | 477 | 478 | 479 |
|---|---|---|---|---|---|---|---|---|---|---|---|---|---|---|---|---|---|---|---|---|---|---|---|---|---|---|---|---|---|---|---|---|
| huff | 163 | 77 | 18 | 17 | 55 | 16 | 15 | 14 | 290 | 298 | 54 | 76 | 53 | 75 | 13 | 12 | 225 | 52 | 95 | 11 | 51 | 10 | 9 | 8 | 269 | 270 | 116 | 197 | 50 | 193 | 7 | 49 |
| bits | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 |

| array val | 480 | 481 | 482 | 483 | 484 | 485 | 486 | 487 | 488 | 489 | 490 | 491 | 492 | 493 | 494 | 495 | 496 | 497 | 498 | 499 | 500 | 501 | 502 | 503 | 504 | 505 | 506 | 507 | 508 | 509 | 510 | 511 |
|---|---|---|---|---|---|---|---|---|---|---|---|---|---|---|---|---|---|---|---|---|---|---|---|---|---|---|---|---|---|---|---|---|
| huff | 169 | 115 | 74 | 6 | 48 | 47 | 5 | 4 | 217 | 303 | 114 | 231 | 113 | 258 | 73 | 168 | 134 | 3 | 187 | 2 | 46 | 72 | 1 | 0 | 149 | 276 | 249 | 297 | 133 | 281 | 94 | 251 |
| bits | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 | 13 |

APPENDIX D

Category Statistics

| dec real | octal | | | huff bit depth | huff value | cnt |
|---|---|---|---|---|---|---|
| 0 | 0 | 0 | 0 | 2 | 3 | 1 |
| 64 | 1 | 0 | 0 | 3 | 5 | 2 |
| 1 | 0 | 0 | 1 | 4 | 8 | 3 |
| 72 | 1 | 1 | 0 | 4 | 9 | 4 |
| 8 | 0 | 1 | 0 | 5 | 15 | 5 |
| 73 | 1 | 1 | 1 | 5 | 14 | 6 |
| 9 | 0 | 1 | 1 | 5 | 13 | 7 |
| 65 | 1 | 0 | 1 | 5 | 12 | 8 |
| 128 | 2 | 0 | 0 | 5 | 11 | 9 |
| 16 | 0 | 2 | 0 | 5 | 10 | 10 |
| 2 | 0 | 0 | 2 | 5 | 9 | 11 |
| 144 | 2 | 2 | 0 | 5 | 8 | 12 |
| 146 | 2 | 2 | 2 | 7 | 31 | 13 |
| 18 | 0 | 2 | 2 | 7 | 30 | 14 |
| 201 | 3 | 1 | 1 | 7 | 29 | 15 |
| 200 | 3 | 1 | 0 | 7 | 28 | 16 |
| 66 | 1 | 0 | 2 | 7 | 27 | 17 |
| 89 | 1 | 3 | 1 | 7 | 26 | 18 |
| 75 | 1 | 1 | 3 | 7 | 25 | 19 |
| 217 | 3 | 3 | 1 | 7 | 24 | 20 |
| 11 | 0 | 1 | 3 | 8 | 47 | 21 |
| 20 | 0 | 2 | 4 | 8 | 46 | 22 |
| 130 | 2 | 0 | 2 | 8 | 45 | 23 |
| 91 | 1 | 3 | 3 | 8 | 44 | 24 |
| 219 | 3 | 3 | 3 | 8 | 43 | 25 |
| 84 | 1 | 2 | 4 | 8 | 42 | 26 |
| 93 | 1 | 3 | 5 | 8 | 41 | 27 |
| 29 | 0 | 3 | 5 | 8 | 40 | 28 |
| 3 | 0 | 0 | 3 | 8 | 39 | 29 |
| 192 | 3 | 0 | 0 | 8 | 38 | 30 |
| 129 | 2 | 0 | 1 | 8 | 37 | 31 |
| 82 | 1 | 2 | 2 | 8 | 36 | 32 |
| 148 | 2 | 2 | 4 | 8 | 35 | 33 |
| 80 | 1 | 2 | 0 | 8 | 34 | 34 |
| 88 | 1 | 3 | 0 | 8 | 33 | 35 |
| 27 | 0 | 3 | 3 | 8 | 32 | 36 |
| 203 | 3 | 1 | 3 | 10 | 127 | 37 |
| 162 | 2 | 4 | 2 | 10 | 126 | 38 |
| 74 | 1 | 1 | 2 | 10 | 125 | 39 |
| 17 | 0 | 2 | 1 | 10 | 124 | 40 |
| 272 | 4 | 2 | 0 | 10 | 123 | 41 |
| 25 | 0 | 3 | 1 | 10 | 122 | 42 |
| 216 | 3 | 3 | 0 | 10 | 121 | 43 |
| 212 | 3 | 2 | 4 | 10 | 120 | 44 |
| 221 | 3 | 3 | 5 | 10 | 119 | 45 |
| 157 | 2 | 3 | 5 | 10 | 118 | 46 |
| 292 | 4 | 4 | 4 | 10 | 117 | 47 |
| 10 | 0 | 1 | 2 | 10 | 116 | 48 |
| 67 | 1 | 0 | 3 | 10 | 115 | 49 |
| 145 | 2 | 2 | 1 | 10 | 114 | 50 |
| 136 | 2 | 1 | 0 | 10 | 113 | 51 |
| 164 | 2 | 4 | 4 | 10 | 112 | 52 |
| 45 | 0 | 5 | 5 | 10 | 111 | 53 |
| 256 | 4 | 0 | 0 | 10 | 110 | 54 |
| 274 | 4 | 2 | 2 | 10 | 109 | 55 |
| 36 | 0 | 4 | 4 | 10 | 108 | 56 |
| 290 | 4 | 4 | 2 | 10 | 107 | 57 |
| 329 | 5 | 1 | 1 | 10 | 106 | 58 |
| 365 | 5 | 5 | 5 | 10 | 105 | 59 |
| 233 | 3 | 5 | 1 | 10 | 104 | 60 |
| 100 | 1 | 4 | 4 | 10 | 103 | 61 |
| 137 | 2 | 1 | 1 | 10 | 102 | 62 |
| 13 | 0 | 1 | 5 | 10 | 101 | 63 |
| 4 | 0 | 0 | 4 | 10 | 100 | 64 |
| 139 | 2 | 1 | 3 | 10 | 99 | 65 |

| dec real | octal | | | huff bit depth | huff value | cnt |
|---|---|---|---|---|---|---|
| 68 | 1 | 0 | 4 | 10 | 98 | 66 |
| 235 | 3 | 5 | 3 | 10 | 97 | 67 |
| 160 | 2 | 4 | 0 | 10 | 96 | 68 |
| 131 | 2 | 0 | 3 | 10 | 95 | 69 |
| 141 | 2 | 1 | 5 | 10 | 94 | 70 |
| 345 | 5 | 3 | 1 | 10 | 93 | 71 |
| 109 | 1 | 5 | 5 | 10 | 92 | 72 |
| 24 | 0 | 3 | 0 | 10 | 91 | 73 |
| 77 | 1 | 1 | 5 | 10 | 90 | 74 |
| 288 | 4 | 4 | 0 | 10 | 89 | 75 |
| 173 | 2 | 5 | 5 | 10 | 88 | 76 |
| 193 | 3 | 0 | 1 | 10 | 87 | 77 |
| 34 | 0 | 4 | 2 | 10 | 86 | 78 |
| 237 | 3 | 5 | 5 | 10 | 85 | 79 |
| 363 | 5 | 5 | 3 | 10 | 84 | 80 |
| 194 | 3 | 0 | 2 | 10 | 83 | 81 |
| 361 | 5 | 5 | 1 | 10 | 82 | 82 |
| 208 | 3 | 2 | 0 | 10 | 81 | 83 |
| 347 | 5 | 3 | 3 | 10 | 80 | 84 |
| 210 | 3 | 2 | 2 | 10 | 79 | 85 |
| 81 | 1 | 2 | 1 | 10 | 78 | 86 |
| 155 | 2 | 3 | 3 | 10 | 77 | 87 |
| 202 | 3 | 1 | 2 | 10 | 76 | 88 |
| 196 | 3 | 0 | 4 | 10 | 75 | 89 |
| 147 | 2 | 2 | 3 | 10 | 74 | 90 |
| 205 | 3 | 1 | 5 | 10 | 73 | 91 |
| 107 | 1 | 5 | 3 | 10 | 72 | 92 |
| 218 | 3 | 3 | 2 | 10 | 71 | 93 |
| 328 | 5 | 1 | 0 | 10 | 70 | 94 |
| 331 | 5 | 1 | 3 | 10 | 69 | 95 |
| 105 | 1 | 5 | 1 | 10 | 68 | 96 |
| 132 | 2 | 0 | 4 | 10 | 67 | 97 |
| 276 | 4 | 2 | 4 | 10 | 66 | 98 |
| 153 | 2 | 3 | 1 | 10 | 65 | 99 |
| 228 | 3 | 4 | 4 | 10 | 64 | 100 |
| 32 | 0 | 4 | 0 | 10 | 63 | 101 |
| 76 | 1 | 1 | 4 | 10 | 62 | 102 |
| 90 | 1 | 3 | 2 | 10 | 61 | 103 |
| 195 | 3 | 0 | 3 | 10 | 60 | 104 |
| 320 | 5 | 0 | 0 | 10 | 59 | 105 |
| 138 | 2 | 1 | 2 | 10 | 58 | 106 |
| 98 | 1 | 4 | 2 | 10 | 57 | 107 |
| 258 | 4 | 0 | 2 | 10 | 56 | 108 |
| 19 | 0 | 2 | 3 | 10 | 55 | 109 |
| 344 | 5 | 3 | 0 | 10 | 54 | 110 |
| 152 | 2 | 3 | 0 | 10 | 53 | 111 |
| 229 | 3 | 4 | 5 | 10 | 52 | 112 |
| 209 | 3 | 2 | 1 | 10 | 51 | 113 |
| 102 | 1 | 4 | 6 | 10 | 50 | 114 |
| 273 | 4 | 2 | 1 | 13 | 397 | 115 |
| 12 | 0 | 1 | 4 | 13 | 396 | 116 |
| 227 | 3 | 4 | 3 | 13 | 395 | 117 |
| 5 | 0 | 0 | 5 | 13 | 394 | 118 |
| 204 | 3 | 1 | 4 | 13 | 393 | 119 |
| 226 | 3 | 4 | 2 | 13 | 392 | 120 |
| 283 | 4 | 3 | 3 | 13 | 391 | 121 |
| 330 | 5 | 1 | 2 | 13 | 390 | 122 |
| 400 | 6 | 2 | 0 | 13 | 389 | 123 |
| 285 | 4 | 3 | 5 | 13 | 388 | 124 |
| 308 | 4 | 6 | 4 | 13 | 387 | 125 |
| 101 | 1 | 4 | 5 | 13 | 386 | 126 |
| 340 | 5 | 2 | 4 | 13 | 385 | 127 |
| 232 | 3 | 5 | 0 | 13 | 384 | 128 |
| 156 | 2 | 3 | 4 | 13 | 383 | 129 |
| 43 | 0 | 5 | 3 | 13 | 382 | 130 |
| 349 | 5 | 3 | 5 | 13 | 381 | 131 |
| 92 | 1 | 3 | 4 | 13 | 380 | 132 |
| 104 | 1 | 5 | 0 | 13 | 379 | 133 |
| 281 | 4 | 3 | 1 | 13 | 378 | 134 |
| 360 | 5 | 5 | 0 | 13 | 377 | 135 |
| 306 | 4 | 6 | 2 | 13 | 376 | 136 |

| dec real | octal | | | huff bit depth | huff value | cnt |
|---|---|---|---|---|---|---|
| 257 | 4 | 0 | 1 | 13 | 375 | 137 |
| 38 | 0 | 4 | 6 | 13 | 374 | 138 |
| 211 | 3 | 2 | 3 | 13 | 373 | 139 |
| 83 | 1 | 2 | 3 | 13 | 372 | 140 |
| 96 | 1 | 4 | 0 | 13 | 371 | 141 |
| 220 | 3 | 3 | 4 | 13 | 370 | 142 |
| 324 | 5 | 0 | 4 | 13 | 369 | 143 |
| 154 | 2 | 3 | 2 | 13 | 368 | 144 |
| 416 | 6 | 4 | 0 | 13 | 367 | 145 |
| 26 | 0 | 3 | 2 | 13 | 366 | 146 |
| 225 | 3 | 4 | 1 | 13 | 365 | 147 |
| 41 | 0 | 5 | 1 | 13 | 364 | 148 |
| 133 | 2 | 0 | 5 | 13 | 363 | 149 |
| 37 | 0 | 4 | 5 | 13 | 362 | 150 |
| 163 | 2 | 4 | 3 | 13 | 361 | 151 |
| 267 | 4 | 1 | 3 | 13 | 360 | 152 |
| 346 | 5 | 3 | 2 | 13 | 359 | 153 |
| 47 | 0 | 5 | 7 | 13 | 358 | 154 |
| 420 | 6 | 4 | 4 | 13 | 357 | 155 |
| 275 | 4 | 2 | 3 | 13 | 356 | 156 |
| 86 | 1 | 2 | 6 | 13 | 355 | 157 |
| 230 | 3 | 4 | 6 | 13 | 354 | 158 |
| 180 | 2 | 6 | 4 | 13 | 353 | 159 |
| 291 | 4 | 4 | 3 | 13 | 352 | 160 |
| 269 | 4 | 1 | 5 | 13 | 351 | 161 |
| 259 | 4 | 0 | 3 | 13 | 350 | 162 |
| 434 | 6 | 6 | 2 | 13 | 349 | 163 |
| 224 | 3 | 4 | 0 | 13 | 348 | 164 |
| 264 | 4 | 1 | 0 | 13 | 347 | 165 |
| 304 | 4 | 6 | 0 | 13 | 346 | 166 |
| 333 | 5 | 1 | 5 | 13 | 345 | 167 |
| 99 | 1 | 4 | 3 | 13 | 344 | 168 |
| 140 | 2 | 1 | 4 | 13 | 343 | 169 |
| 178 | 2 | 6 | 2 | 13 | 342 | 170 |
| 436 | 6 | 6 | 4 | 13 | 341 | 171 |
| 21 | 0 | 2 | 5 | 13 | 340 | 172 |
| 294 | 4 | 4 | 6 | 13 | 339 | 173 |
| 289 | 4 | 4 | 1 | 13 | 338 | 174 |
| 377 | 5 | 7 | 1 | 13 | 337 | 175 |
| 28 | 0 | 3 | 4 | 13 | 336 | 176 |
| 161 | 2 | 4 | 1 | 13 | 335 | 177 |
| 171 | 2 | 5 | 3 | 13 | 334 | 178 |
| 69 | 1 | 0 | 5 | 13 | 333 | 179 |
| 149 | 2 | 2 | 5 | 13 | 332 | 180 |
| 265 | 4 | 1 | 1 | 13 | 331 | 181 |
| 40 | 0 | 5 | 0 | 13 | 330 | 182 |
| 176 | 2 | 6 | 0 | 13 | 329 | 183 |
| 293 | 4 | 4 | 5 | 13 | 328 | 184 |
| 381 | 5 | 7 | 5 | 13 | 327 | 185 |
| 169 | 2 | 5 | 1 | 13 | 326 | 186 |
| 165 | 2 | 4 | 5 | 13 | 325 | 187 |
| 322 | 5 | 0 | 2 | 13 | 324 | 188 |
| 438 | 6 | 6 | 6 | 13 | 323 | 189 |
| 213 | 3 | 2 | 5 | 13 | 322 | 190 |
| 33 | 0 | 4 | 1 | 13 | 321 | 191 |
| 97 | 1 | 4 | 1 | 13 | 320 | 192 |
| 432 | 6 | 6 | 0 | 13 | 319 | 193 |
| 22 | 0 | 2 | 6 | 13 | 318 | 194 |
| 85 | 1 | 2 | 5 | 13 | 317 | 195 |
| 282 | 4 | 3 | 2 | 13 | 316 | 196 |
| 310 | 4 | 6 | 6 | 13 | 315 | 197 |
| 379 | 5 | 7 | 3 | 13 | 314 | 198 |
| 35 | 0 | 4 | 3 | 13 | 313 | 199 |
| 418 | 6 | 4 | 2 | 13 | 312 | 200 |
| 260 | 4 | 0 | 4 | 13 | 311 | 201 |
| 166 | 2 | 4 | 6 | 13 | 310 | 202 |
| 214 | 3 | 2 | 6 | 13 | 309 | 203 |
| 297 | 4 | 5 | 1 | 13 | 308 | 204 |
| 332 | 5 | 1 | 4 | 13 | 307 | 205 |
| 50 | 0 | 6 | 2 | 13 | 306 | 206 |
| 175 | 2 | 5 | 7 | 13 | 305 | 207 |

| dec real | octal | | | huff bit depth | huff value | cnt |
|---|---|---|---|---|---|---|
| 280 | 4 | 3 | 0 | 13 | 304 | 208 |
| 489 | 7 | 5 | 1 | 13 | 303 | 209 |
| 236 | 3 | 5 | 4 | 13 | 302 | 210 |
| 364 | 5 | 5 | 4 | 13 | 301 | 211 |
| 261 | 4 | 0 | 5 | 13 | 300 | 212 |
| 373 | 5 | 6 | 5 | 13 | 299 | 213 |
| 457 | 7 | 1 | 1 | 13 | 298 | 214 |
| 507 | 7 | 7 | 3 | 13 | 297 | 215 |
| 321 | 5 | 0 | 1 | 13 | 296 | 216 |
| 362 | 5 | 5 | 2 | 13 | 295 | 217 |
| 301 | 4 | 5 | 5 | 13 | 294 | 218 |
| 367 | 5 | 5 | 7 | 13 | 293 | 219 |
| 384 | 6 | 0 | 0 | 13 | 292 | 220 |
| 299 | 4 | 5 | 3 | 13 | 291 | 221 |
| 456 | 7 | 1 | 0 | 13 | 290 | 222 |
| 234 | 3 | 5 | 2 | 13 | 289 | 223 |
| 249 | 3 | 7 | 1 | 13 | 288 | 224 |
| 111 | 1 | 5 | 7 | 13 | 287 | 225 |
| 168 | 2 | 5 | 0 | 13 | 286 | 226 |
| 284 | 4 | 3 | 4 | 13 | 285 | 227 |
| 251 | 3 | 7 | 3 | 13 | 284 | 228 |
| 338 | 5 | 2 | 2 | 13 | 283 | 229 |
| 424 | 6 | 5 | 0 | 13 | 282 | 230 |
| 509 | 7 | 7 | 5 | 13 | 281 | 231 |
| 52 | 0 | 6 | 4 | 13 | 280 | 232 |
| 182 | 2 | 6 | 6 | 13 | 279 | 233 |
| 336 | 5 | 2 | 0 | 13 | 278 | 234 |
| 266 | 4 | 1 | 2 | 13 | 277 | 235 |
| 505 | 7 | 7 | 1 | 13 | 276 | 236 |
| 348 | 5 | 3 | 4 | 13 | 275 | 237 |
| 356 | 5 | 4 | 4 | 13 | 274 | 238 |
| 402 | 6 | 2 | 2 | 13 | 273 | 239 |
| 253 | 3 | 7 | 5 | 13 | 272 | 240 |
| 422 | 6 | 4 | 6 | 13 | 271 | 241 |
| 473 | 7 | 3 | 1 | 13 | 270 | 242 |
| 472 | 7 | 3 | 0 | 13 | 269 | 243 |
| 239 | 3 | 5 | 7 | 13 | 268 | 244 |
| 277 | 4 | 2 | 5 | 13 | 267 | 245 |
| 371 | 5 | 6 | 3 | 13 | 266 | 246 |
| 106 | 1 | 5 | 2 | 13 | 265 | 247 |
| 127 | 1 | 7 | 7 | 13 | 264 | 248 |
| 197 | 3 | 0 | 5 | 13 | 263 | 249 |
| 355 | 5 | 4 | 3 | 13 | 262 | 250 |
| 108 | 1 | 5 | 4 | 13 | 261 | 251 |
| 354 | 5 | 4 | 2 | 13 | 260 | 252 |
| 383 | 5 | 7 | 7 | 13 | 259 | 253 |
| 493 | 7 | 5 | 5 | 13 | 258 | 254 |
| 70 | 1 | 0 | 6 | 13 | 257 | 255 |
| 185 | 2 | 7 | 1 | 13 | 256 | 256 |
| 240 | 3 | 6 | 0 | 13 | 255 | 257 |
| 242 | 3 | 6 | 2 | 13 | 254 | 258 |
| 172 | 2 | 5 | 4 | 13 | 253 | 259 |
| 366 | 5 | 5 | 6 | 13 | 252 | 260 |
| 511 | 7 | 7 | 7 | 13 | 251 | 261 |
| 358 | 5 | 4 | 6 | 13 | 250 | 262 |
| 506 | 7 | 7 | 2 | 13 | 249 | 263 |
| 6 | 0 | 0 | 6 | 13 | 248 | 264 |
| 95 | 1 | 3 | 7 | 13 | 247 | 265 |
| 312 | 4 | 7 | 0 | 13 | 246 | 266 |
| 437 | 6 | 6 | 5 | 13 | 245 | 267 |
| 42 | 0 | 5 | 2 | 13 | 244 | 268 |
| 241 | 3 | 6 | 1 | 13 | 243 | 269 |
| 369 | 5 | 6 | 1 | 13 | 242 | 270 |
| 114 | 1 | 6 | 2 | 13 | 241 | 271 |
| 170 | 2 | 5 | 2 | 13 | 240 | 272 |
| 177 | 2 | 6 | 1 | 13 | 239 | 273 |
| 222 | 3 | 3 | 6 | 13 | 238 | 274 |
| 245 | 3 | 6 | 5 | 13 | 237 | 275 |
| 248 | 3 | 7 | 0 | 13 | 236 | 276 |
| 255 | 3 | 7 | 7 | 13 | 235 | 277 |
| 313 | 4 | 7 | 1 | 13 | 234 | 278 |

| dec real | octal | | | huff bit depth | huff value | cnt |
|---|---|---|---|---|---|---|
| 353 | 5 | 4 | 1 | 13 | 233 | 279 |
| 404 | 6 | 2 | 4 | 13 | 232 | 280 |
| 491 | 7 | 5 | 3 | 13 | 231 | 281 |
| 158 | 2 | 3 | 6 | 13 | 230 | 282 |
| 238 | 3 | 5 | 6 | 13 | 229 | 283 |
| 300 | 4 | 5 | 4 | 13 | 228 | 284 |
| 375 | 5 | 6 | 7 | 13 | 227 | 285 |
| 425 | 6 | 5 | 1 | 13 | 226 | 286 |
| 464 | 7 | 2 | 0 | 13 | 225 | 287 |
| 48 | 0 | 6 | 0 | 13 | 224 | 288 |
| 150 | 2 | 2 | 6 | 13 | 223 | 289 |
| 244 | 3 | 6 | 4 | 13 | 222 | 290 |
| 268 | 4 | 1 | 4 | 13 | 221 | 291 |
| 378 | 5 | 7 | 2 | 13 | 220 | 292 |
| 429 | 6 | 5 | 5 | 13 | 219 | 293 |
| 430 | 6 | 5 | 6 | 13 | 218 | 294 |
| 488 | 7 | 5 | 0 | 13 | 217 | 295 |
| 31 | 0 | 3 | 7 | 13 | 216 | 296 |
| 78 | 1 | 1 | 6 | 13 | 215 | 297 |
| 116 | 1 | 6 | 4 | 13 | 214 | 298 |
| 125 | 1 | 7 | 5 | 13 | 213 | 299 |
| 278 | 4 | 2 | 6 | 13 | 212 | 300 |
| 286 | 4 | 3 | 6 | 13 | 211 | 301 |
| 296 | 4 | 5 | 0 | 13 | 210 | 302 |
| 305 | 4 | 6 | 1 | 13 | 209 | 303 |
| 337 | 5 | 2 | 1 | 13 | 208 | 304 |
| 372 | 5 | 6 | 4 | 13 | 207 | 305 |
| 444 | 6 | 7 | 4 | 13 | 206 | 306 |
| 44 | 0 | 5 | 4 | 13 | 205 | 307 |
| 121 | 1 | 7 | 1 | 13 | 204 | 308 |
| 243 | 3 | 6 | 3 | 13 | 203 | 309 |
| 307 | 4 | 6 | 3 | 13 | 202 | 310 |
| 314 | 4 | 7 | 2 | 13 | 201 | 311 |
| 323 | 5 | 0 | 3 | 13 | 200 | 312 |
| 357 | 5 | 4 | 5 | 13 | 199 | 313 |
| 370 | 5 | 6 | 2 | 13 | 198 | 314 |
| 475 | 7 | 3 | 3 | 13 | 197 | 315 |
| 115 | 1 | 6 | 3 | 13 | 196 | 316 |
| 316 | 4 | 7 | 4 | 13 | 195 | 317 |
| 417 | 6 | 4 | 1 | 13 | 194 | 318 |
| 477 | 7 | 3 | 5 | 13 | 193 | 319 |
| 159 | 2 | 3 | 7 | 13 | 192 | 320 |
| 352 | 5 | 4 | 0 | 13 | 191 | 321 |
| 376 | 5 | 7 | 0 | 13 | 190 | 322 |
| 408 | 6 | 3 | 0 | 13 | 189 | 323 |
| 409 | 6 | 3 | 1 | 13 | 188 | 324 |
| 498 | 7 | 6 | 2 | 13 | 187 | 325 |
| 57 | 0 | 7 | 1 | 13 | 186 | 326 |
| 112 | 1 | 6 | 0 | 13 | 185 | 327 |
| 123 | 1 | 7 | 3 | 13 | 184 | 328 |
| 298 | 4 | 5 | 2 | 13 | 183 | 329 |
| 302 | 4 | 5 | 6 | 13 | 182 | 330 |
| 341 | 5 | 2 | 5 | 13 | 181 | 331 |
| 427 | 6 | 5 | 3 | 13 | 180 | 332 |
| 439 | 6 | 6 | 7 | 13 | 179 | 333 |
| 442 | 6 | 7 | 2 | 13 | 178 | 334 |
| 30 | 0 | 3 | 6 | 13 | 177 | 335 |
| 46 | 0 | 5 | 6 | 13 | 176 | 336 |
| 49 | 0 | 6 | 1 | 13 | 175 | 337 |
| 134 | 2 | 0 | 6 | 13 | 174 | 338 |
| 198 | 3 | 0 | 6 | 13 | 173 | 339 |
| 250 | 3 | 7 | 2 | 13 | 172 | 340 |
| 262 | 4 | 0 | 6 | 13 | 171 | 341 |
| 441 | 6 | 7 | 1 | 13 | 170 | 342 |
| 480 | 7 | 4 | 0 | 13 | 169 | 343 |
| 495 | 7 | 5 | 7 | 13 | 168 | 344 |
| 94 | 1 | 3 | 6 | 13 | 167 | 345 |
| 311 | 4 | 6 | 7 | 13 | 166 | 346 |
| 315 | 4 | 7 | 3 | 13 | 165 | 347 |
| 350 | 5 | 3 | 6 | 13 | 164 | 348 |
| 448 | 7 | 0 | 0 | 13 | 163 | 349 |

| dec real | octal | | | huff bit depth | huff value | cnt |
|---|---|---|---|---|---|---|
| 7 | 0 | 0 | 7 | 13 | 162 | 350 |
| 51 | 0 | 6 | 3 | 13 | 161 | 351 |
| 59 | 0 | 7 | 3 | 13 | 160 | 352 |
| 113 | 1 | 6 | 1 | 13 | 159 | 353 |
| 120 | 1 | 7 | 0 | 13 | 158 | 354 |
| 223 | 3 | 3 | 7 | 13 | 157 | 355 |
| 246 | 3 | 6 | 6 | 13 | 156 | 356 |
| 252 | 3 | 7 | 4 | 13 | 155 | 357 |
| 339 | 5 | 2 | 3 | 13 | 154 | 358 |
| 392 | 6 | 1 | 0 | 13 | 153 | 359 |
| 419 | 6 | 4 | 3 | 13 | 152 | 360 |
| 428 | 6 | 5 | 4 | 13 | 151 | 361 |
| 443 | 6 | 7 | 3 | 13 | 150 | 362 |
| 504 | 7 | 7 | 0 | 13 | 149 | 363 |
| 14 | 0 | 1 | 6 | 13 | 148 | 364 |
| 15 | 0 | 1 | 7 | 13 | 147 | 365 |
| 54 | 0 | 6 | 6 | 13 | 146 | 366 |
| 110 | 1 | 5 | 6 | 13 | 145 | 367 |
| 174 | 2 | 5 | 6 | 13 | 144 | 368 |
| 186 | 2 | 7 | 2 | 13 | 143 | 369 |
| 188 | 2 | 7 | 4 | 13 | 142 | 370 |
| 189 | 2 | 7 | 5 | 13 | 141 | 371 |
| 270 | 4 | 1 | 6 | 13 | 140 | 372 |
| 325 | 5 | 0 | 5 | 13 | 139 | 373 |
| 351 | 5 | 3 | 7 | 13 | 138 | 374 |
| 435 | 6 | 6 | 3 | 13 | 137 | 375 |
| 445 | 6 | 7 | 5 | 13 | 136 | 376 |
| 446 | 6 | 7 | 6 | 13 | 135 | 377 |
| 496 | 7 | 6 | 0 | 13 | 134 | 378 |
| 508 | 7 | 7 | 4 | 13 | 133 | 379 |
| 53 | 0 | 6 | 5 | 13 | 132 | 380 |
| 117 | 1 | 6 | 5 | 13 | 131 | 381 |
| 142 | 2 | 1 | 6 | 13 | 130 | 382 |
| 187 | 2 | 7 | 3 | 13 | 129 | 383 |
| 247 | 3 | 6 | 7 | 13 | 128 | 384 |
| 295 | 4 | 4 | 7 | 13 | 127 | 385 |
| 309 | 4 | 6 | 5 | 13 | 126 | 386 |
| 317 | 4 | 7 | 5 | 13 | 125 | 387 |
| 342 | 5 | 2 | 6 | 13 | 124 | 388 |
| 359 | 5 | 4 | 7 | 13 | 123 | 389 |
| 368 | 5 | 6 | 0 | 13 | 122 | 390 |
| 403 | 6 | 2 | 3 | 13 | 121 | 391 |
| 411 | 6 | 3 | 3 | 13 | 120 | 392 |
| 421 | 6 | 4 | 5 | 13 | 119 | 393 |
| 431 | 6 | 5 | 7 | 13 | 118 | 394 |
| 433 | 6 | 6 | 1 | 13 | 117 | 395 |
| 474 | 7 | 3 | 2 | 13 | 116 | 396 |
| 481 | 7 | 4 | 1 | 13 | 115 | 397 |
| 490 | 7 | 5 | 2 | 13 | 114 | 398 |
| 492 | 7 | 5 | 4 | 13 | 113 | 399 |
| 39 | 0 | 4 | 7 | 13 | 112 | 400 |
| 79 | 1 | 1 | 7 | 13 | 111 | 401 |
| 103 | 1 | 4 | 7 | 13 | 110 | 402 |
| 118 | 1 | 6 | 6 | 13 | 109 | 403 |
| 143 | 2 | 1 | 7 | 13 | 108 | 404 |
| 179 | 2 | 6 | 3 | 13 | 107 | 405 |
| 181 | 2 | 6 | 5 | 13 | 106 | 406 |
| 206 | 3 | 1 | 6 | 13 | 105 | 407 |
| 207 | 3 | 1 | 7 | 13 | 104 | 408 |
| 326 | 5 | 0 | 6 | 13 | 103 | 409 |
| 334 | 5 | 1 | 6 | 13 | 102 | 410 |
| 380 | 5 | 7 | 4 | 13 | 101 | 411 |
| 386 | 6 | 0 | 2 | 13 | 100 | 412 |
| 393 | 6 | 1 | 1 | 13 | 99 | 413 |
| 401 | 6 | 2 | 1 | 13 | 98 | 414 |
| 405 | 6 | 2 | 5 | 13 | 97 | 415 |
| 412 | 6 | 3 | 4 | 13 | 96 | 416 |
| 466 | 7 | 2 | 2 | 13 | 95 | 417 |
| 510 | 7 | 7 | 6 | 13 | 94 | 418 |
| 23 | 0 | 2 | 7 | 13 | 93 | 419 |
| 61 | 0 | 7 | 5 | 13 | 92 | 420 |

| dec real | octal | | | huff bit depth | huff value | cnt |
|---|---|---|---|---|---|---|
| 63 | 0 | 7 | 7 | 13 | 91 | 421 |
| 119 | 1 | 6 | 7 | 13 | 90 | 422 |
| 184 | 2 | 7 | 0 | 13 | 89 | 423 |
| 199 | 3 | 0 | 7 | 13 | 88 | 424 |
| 215 | 3 | 2 | 7 | 13 | 87 | 425 |
| 254 | 3 | 7 | 6 | 13 | 86 | 426 |
| 318 | 4 | 7 | 6 | 13 | 85 | 427 |
| 374 | 5 | 6 | 6 | 13 | 84 | 428 |
| 385 | 6 | 0 | 1 | 13 | 83 | 429 |
| 387 | 6 | 0 | 3 | 13 | 82 | 430 |
| 394 | 6 | 1 | 2 | 13 | 81 | 431 |
| 410 | 6 | 3 | 2 | 13 | 80 | 432 |
| 413 | 6 | 3 | 5 | 13 | 79 | 433 |
| 447 | 6 | 7 | 7 | 13 | 78 | 434 |
| 449 | 7 | 0 | 1 | 13 | 77 | 435 |
| 459 | 7 | 1 | 3 | 13 | 76 | 436 |
| 461 | 7 | 1 | 5 | 13 | 75 | 437 |
| 482 | 7 | 4 | 2 | 13 | 74 | 438 |
| 494 | 7 | 5 | 6 | 13 | 73 | 439 |
| 501 | 7 | 6 | 5 | 13 | 72 | 440 |
| 55 | 0 | 6 | 7 | 13 | 71 | 441 |
| 60 | 0 | 7 | 4 | 13 | 70 | 442 |
| 87 | 1 | 2 | 7 | 13 | 69 | 443 |
| 135 | 2 | 0 | 7 | 13 | 68 | 444 |
| 151 | 2 | 2 | 7 | 13 | 67 | 445 |
| 167 | 2 | 4 | 7 | 13 | 66 | 446 |
| 231 | 3 | 4 | 7 | 13 | 65 | 447 |
| 279 | 4 | 2 | 7 | 13 | 64 | 448 |
| 287 | 4 | 3 | 7 | 13 | 63 | 449 |
| 335 | 5 | 1 | 7 | 13 | 62 | 450 |
| 389 | 6 | 0 | 5 | 13 | 61 | 451 |
| 395 | 6 | 1 | 3 | 13 | 60 | 452 |
| 396 | 6 | 1 | 4 | 13 | 59 | 453 |
| 399 | 6 | 1 | 7 | 13 | 58 | 454 |
| 426 | 6 | 5 | 2 | 13 | 57 | 455 |
| 440 | 6 | 7 | 0 | 13 | 56 | 456 |
| 452 | 7 | 0 | 4 | 13 | 55 | 457 |
| 458 | 7 | 1 | 2 | 13 | 54 | 458 |
| 460 | 7 | 1 | 4 | 13 | 53 | 459 |
| 465 | 7 | 2 | 1 | 13 | 52 | 460 |
| 468 | 7 | 2 | 4 | 13 | 51 | 461 |
| 476 | 7 | 3 | 4 | 13 | 50 | 462 |
| 479 | 7 | 3 | 7 | 13 | 49 | 463 |
| 484 | 7 | 4 | 4 | 13 | 48 | 464 |
| 485 | 7 | 4 | 5 | 13 | 47 | 465 |
| 500 | 7 | 6 | 4 | 13 | 46 | 466 |
| 56 | 0 | 7 | 0 | 13 | 45 | 467 |
| 58 | 0 | 7 | 2 | 13 | 44 | 468 |
| 62 | 0 | 7 | 6 | 13 | 43 | 469 |
| 71 | 1 | 0 | 7 | 13 | 42 | 470 |
| 122 | 1 | 7 | 2 | 13 | 41 | 471 |
| 124 | 1 | 7 | 4 | 13 | 40 | 472 |
| 126 | 1 | 7 | 6 | 13 | 39 | 473 |
| 183 | 2 | 6 | 7 | 13 | 38 | 474 |
| 190 | 2 | 7 | 6 | 13 | 37 | 475 |
| 191 | 2 | 7 | 7 | 13 | 36 | 476 |
| 263 | 4 | 0 | 7 | 13 | 35 | 477 |
| 271 | 4 | 1 | 7 | 13 | 34 | 478 |
| 303 | 4 | 5 | 7 | 13 | 33 | 479 |
| 319 | 4 | 7 | 7 | 13 | 32 | 480 |
| 327 | 5 | 0 | 7 | 13 | 31 | 481 |
| 343 | 5 | 2 | 7 | 13 | 30 | 482 |
| 382 | 5 | 7 | 6 | 13 | 29 | 483 |
| 388 | 6 | 0 | 4 | 13 | 28 | 484 |
| 390 | 6 | 0 | 6 | 13 | 27 | 485 |
| 391 | 6 | 0 | 7 | 13 | 26 | 486 |
| 397 | 6 | 1 | 5 | 13 | 25 | 487 |
| 398 | 6 | 1 | 6 | 13 | 24 | 488 |
| 406 | 6 | 2 | 6 | 13 | 23 | 489 |
| 407 | 6 | 2 | 7 | 13 | 22 | 490 |
| 414 | 6 | 3 | 6 | 13 | 21 | 491 |

| dec real | octal | | | huff bit depth | huff value | cnt |
|---|---|---|---|---|---|---|
| 415 | 6 | 3 | 7 | 13 | 20 | 492 |
| 423 | 6 | 4 | 7 | 13 | 19 | 493 |
| 450 | 7 | 0 | 2 | 13 | 18 | 494 |
| 451 | 7 | 0 | 3 | 13 | 17 | 495 |
| 453 | 7 | 0 | 5 | 13 | 16 | 496 |
| 454 | 7 | 0 | 6 | 13 | 15 | 497 |
| 455 | 7 | 0 | 7 | 13 | 14 | 498 |
| 462 | 7 | 1 | 6 | 13 | 13 | 499 |
| 463 | 7 | 1 | 7 | 13 | 12 | 500 |
| 467 | 7 | 2 | 3 | 13 | 11 | 501 |
| 469 | 7 | 2 | 5 | 13 | 10 | 502 |
| 470 | 7 | 2 | 6 | 13 | 9 | 503 |
| 471 | 7 | 2 | 7 | 13 | 8 | 504 |
| 478 | 7 | 3 | 6 | 13 | 7 | 505 |
| 483 | 7 | 4 | 3 | 13 | 6 | 506 |
| 486 | 7 | 4 | 6 | 13 | 5 | 507 |
| 487 | 7 | 4 | 7 | 13 | 4 | 508 |
| 497 | 7 | 6 | 1 | 13 | 3 | 509 |
| 499 | 7 | 6 | 3 | 13 | 2 | 510 |
| 502 | 7 | 6 | 6 | 13 | 1 | 511 |
| 503 | 7 | 6 | 7 | 13 | 0 | 512 |

APPENDIX E

Huffman Decode Table 430A

| | | | | | | | | | | | | | | | |
|---|---|---|---|---|---|---|---|---|---|---|---|---|---|---|---|
| array val 0<br>dec value 0 | 1<br>0 | 2<br>0 | 3<br>0 | 4<br>0 | 5<br>0 | 6<br>0 | 7<br>0 | 8<br>0 | 9<br>0 | 10<br>0 | 11<br>0 | 12<br>0 | 13<br>0 | 14<br>0 | 15<br>0 |
| array val 16<br>dec value 0 | 17<br>0 | 18<br>0 | 19<br>0 | 20<br>0 | 21<br>0 | 22<br>0 | 23<br>0 | 24<br>0 | 25<br>0 | 26<br>0 | 27<br>0 | 28<br>0 | 29<br>0 | 30<br>0 | 31<br>0 |
| array val 32<br>dec value 0 | 33<br>0 | 34<br>0 | 35<br>0 | 36<br>0 | 37<br>0 | 38<br>0 | 39<br>0 | 40<br>0 | 41<br>0 | 42<br>0 | 43<br>0 | 44<br>0 | 45<br>0 | 46<br>0 | 47<br>0 |
| array val 48<br>dec value 0 | 49<br>0 | 50<br>0 | 51<br>0 | 52<br>0 | 53<br>0 | 54<br>0 | 55<br>0 | 56<br>0 | 57<br>0 | 58<br>0 | 59<br>0 | 60<br>0 | 61<br>0 | 62<br>0 | 63<br>0 |
| array val 64<br>dec value 16411 | 65<br>16411 | 66<br>16472 | 67<br>16472 | 68<br>16464 | 69<br>16464 | 70<br>16532 | 71<br>16532 | 72<br>16466 | 73<br>16466 | 74<br>16513 | 75<br>16513 | 76<br>16576 | 77<br>16576 | 78<br>16387 | 79<br>16387 |
| array val 80<br>dec value 16413 | 81<br>16413 | 82<br>16477 | 83<br>16477 | 84<br>16468 | 85<br>16468 | 86<br>16603 | 87<br>16603 | 88<br>16475 | 89<br>16475 | 90<br>16514 | 91<br>16514 | 92<br>16404 | 93<br>16404 | 94<br>16395 | 95<br>16395 |
| array val 96<br>dec value 14553 | 97<br>14553 | 98<br>14553 | 99<br>14553 | 100<br>14411 | 101<br>14411 | 102<br>14411 | 103<br>14411 | 104<br>14425 | 105<br>14425 | 106<br>14425 | 107<br>14425 | 108<br>14402 | 109<br>14402 | 110<br>14402 | 111<br>14402 |
| array val 112<br>dec value 14536 | 113<br>14536 | 114<br>14536 | 115<br>14536 | 116<br>14537 | 117<br>14537 | 118<br>14537 | 119<br>14537 | 120<br>14354 | 121<br>14354 | 122<br>14354 | 123<br>14354 | 124<br>14482 | 125<br>14482 | 126<br>14482 | 127<br>14482 |
| array val 128<br>dec value 10384 | 129<br>10384 | 130<br>10384 | 131<br>10384 | 132<br>10384 | 133<br>10384 | 134<br>10384 | 135<br>10384 | 136<br>10384 | 137<br>10384 | 138<br>10384 | 139<br>10384 | 140<br>10384 | 141<br>10384 | 142<br>10384 | 143<br>10384 |
| array val 144<br>dec value 10242 | 145<br>10242 | 146<br>10242 | 147<br>10242 | 148<br>10242 | 149<br>10242 | 150<br>10242 | 151<br>10242 | 152<br>10242 | 153<br>10242 | 154<br>10242 | 155<br>10242 | 156<br>10242 | 157<br>10242 | 158<br>10242 | 159<br>10242 |
| array val 160<br>dec value 10256 | 161<br>10256 | 162<br>10256 | 163<br>10256 | 164<br>10256 | 165<br>10256 | 166<br>10256 | 167<br>10256 | 168<br>10256 | 169<br>10256 | 170<br>10256 | 171<br>10256 | 172<br>10256 | 173<br>10256 | 174<br>10256 | 175<br>10256 |
| array val 176<br>dec value 10368 | 177<br>10368 | 178<br>10368 | 179<br>10368 | 180<br>10368 | 181<br>10368 | 182<br>10368 | 183<br>10368 | 184<br>10368 | 185<br>10368 | 186<br>10368 | 187<br>10368 | 188<br>10368 | 189<br>10368 | 190<br>10368 | 191<br>10368 |
| array val 192<br>dec value 10305 | 193<br>10305 | 194<br>10305 | 195<br>10305 | 196<br>10305 | 197<br>10305 | 198<br>10305 | 199<br>10305 | 200<br>10305 | 201<br>10305 | 202<br>10305 | 203<br>10305 | 204<br>10305 | 205<br>10305 | 206<br>10305 | 207<br>10305 |

- 62 -

| | | | | | | | | | | | | | | | | |
|---|---|---|---|---|---|---|---|---|---|---|---|---|---|---|---|---|
| array val | 208 | 209 | 210 | 211 | 212 | 213 | 214 | 215 | 216 | 217 | 218 | 219 | 220 | 221 | 222 | 223 |
| dec value | 10249 | 10249 | 10249 | 10249 | 10249 | 10249 | 10249 | 10249 | 10249 | 10249 | 10249 | 10249 | 10249 | 10249 | 10249 | 10249 |
| array val | 224 | 225 | 226 | 227 | 228 | 229 | 230 | 231 | 232 | 233 | 234 | 235 | 236 | 237 | 238 | 239 |
| dec value | 10313 | 10313 | 10313 | 10313 | 10313 | 10313 | 10313 | 10313 | 10313 | 10313 | 10313 | 10313 | 10313 | 10313 | 10313 | 10313 |
| array val | 240 | 241 | 242 | 243 | 244 | 245 | 246 | 247 | 248 | 249 | 250 | 251 | 252 | 253 | 254 | 255 |
| dec value | 10248 | 10248 | 10248 | 10248 | 10248 | 10248 | 10248 | 10248 | 10248 | 10248 | 10248 | 10248 | 10248 | 10248 | 10248 | 10248 |
| array val | 256 | 257 | 258 | 259 | 260 | 261 | 262 | 263 | 264 | 265 | 266 | 267 | 268 | 269 | 270 | 271 |
| dec value | 8193 | 8193 | 8193 | 8193 | 8193 | 8193 | 8193 | 8193 | 8193 | 8193 | 8193 | 8193 | 8193 | 8193 | 8193 | 8193 |
| array val | 272 | 273 | 274 | 275 | 276 | 277 | 278 | 279 | 280 | 281 | 282 | 283 | 284 | 285 | 286 | 287 |
| dec value | 8193 | 8193 | 8193 | 8193 | 8193 | 8193 | 8193 | 8193 | 8193 | 8193 | 8193 | 8193 | 8193 | 8193 | 8193 | 8193 |
| array val | 288 | 289 | 290 | 291 | 292 | 293 | 294 | 295 | 296 | 297 | 298 | 299 | 300 | 301 | 302 | 303 |
| dec value | 8264 | 8264 | 8264 | 8264 | 8264 | 8264 | 8264 | 8264 | 8264 | 8264 | 8264 | 8264 | 8264 | 8264 | 8264 | 8264 |
| array val | 304 | 305 | 306 | 307 | 308 | 309 | 310 | 311 | 312 | 313 | 314 | 315 | 316 | 317 | 318 | 319 |
| dec value | 8264 | 8264 | 8264 | 8264 | 8264 | 8264 | 8264 | 8264 | 8264 | 8264 | 8264 | 8264 | 8264 | 8264 | 8264 | 8264 |
| array val | 320 | 321 | 322 | 323 | 324 | 325 | 326 | 327 | 328 | 329 | 330 | 331 | 332 | 333 | 334 | 335 |
| dec value | 6208 | 6208 | 6208 | 6208 | 6208 | 6208 | 6208 | 6208 | 6208 | 6208 | 6208 | 6208 | 6208 | 6208 | 6208 | 6208 |
| array val | 336 | 337 | 338 | 339 | 340 | 341 | 342 | 343 | 344 | 345 | 346 | 347 | 348 | 349 | 350 | 351 |
| dec value | 6208 | 6208 | 6208 | 6208 | 6208 | 6208 | 6208 | 6208 | 6208 | 6208 | 6208 | 6208 | 6208 | 6208 | 6208 | 6208 |
| array val | 352 | 353 | 354 | 355 | 356 | 357 | 358 | 359 | 360 | 361 | 362 | 363 | 364 | 365 | 366 | 367 |
| dec value | 6208 | 6208 | 6208 | 6208 | 6208 | 6208 | 6208 | 6208 | 6208 | 6208 | 6208 | 6208 | 6208 | 6208 | 6208 | 6208 |
| array val | 368 | 369 | 370 | 371 | 372 | 373 | 374 | 375 | 376 | 377 | 378 | 379 | 380 | 381 | 382 | 383 |
| dec value | 6208 | 6208 | 6208 | 6208 | 6208 | 6208 | 6208 | 6208 | 6208 | 6208 | 6208 | 6208 | 6208 | 6208 | 6208 | 6208 |
| array val | 384 | 385 | 386 | 387 | 388 | 389 | 390 | 391 | 392 | 393 | 394 | 395 | 396 | 397 | 398 | 399 |
| dec value | 4096 | 4096 | 4096 | 4096 | 4096 | 4096 | 4096 | 4096 | 4096 | 4096 | 4096 | 4096 | 4096 | 4096 | 4096 | 4096 |
| array val | 400 | 401 | 402 | 403 | 404 | 405 | 406 | 407 | 408 | 409 | 410 | 411 | 412 | 413 | 414 | 415 |
| dec value | 4096 | 4096 | 4096 | 4096 | 4096 | 4096 | 4096 | 4096 | 4096 | 4096 | 4096 | 4096 | 4096 | 4096 | 4096 | 4096 |
| array val | 416 | 417 | 418 | 419 | 420 | 421 | 422 | 423 | 424 | 425 | 426 | 427 | 428 | 429 | 430 | 431 |
| dec value | 4096 | 4096 | 4096 | 4096 | 4096 | 4096 | 4096 | 4096 | 4096 | 4096 | 4096 | 4096 | 4096 | 4096 | 4096 | 4096 |
| array val | 432 | 433 | 434 | 435 | 436 | 437 | 438 | 439 | 440 | 441 | 442 | 443 | 444 | 445 | 446 | 447 |
| dec value | 4096 | 4096 | 4096 | 4096 | 4096 | 4096 | 4096 | 4096 | 4096 | 4096 | 4096 | 4096 | 4096 | 4096 | 4096 | 4096 |
| array val | 448 | 449 | 450 | 451 | 452 | 453 | 454 | 455 | 456 | 457 | 458 | 459 | 460 | 461 | 462 | 463 |

| | | | | | | | | | | | | | | | | |
|---|---|---|---|---|---|---|---|---|---|---|---|---|---|---|---|---|
| dec value | 4096 | 4096 | 4096 | 4096 | 4096 | 4096 | 4096 | 4096 | 4096 | 4096 | 4096 | 4096 | 4096 | 4096 | 4096 | 4096 |
| array val | 464 | 465 | 466 | 467 | 468 | 469 | 470 | 471 | 472 | 473 | 474 | 475 | 476 | 477 | 478 | 479 |
| dec value | 4096 | 4096 | 4096 | 4096 | 4096 | 4096 | 4096 | 4096 | 4096 | 4096 | 4096 | 4096 | 4096 | 4096 | 4096 | 4096 |
| array val | 480 | 481 | 482 | 483 | 484 | 485 | 486 | 487 | 488 | 489 | 490 | 491 | 492 | 493 | 494 | 495 |
| dec value | 4096 | 4096 | 4096 | 4096 | 4096 | 4096 | 4096 | 4096 | 4096 | 4096 | 4096 | 4096 | 4096 | 4096 | 4096 | 4096 |
| array val | 496 | 497 | 498 | 499 | 500 | 501 | 502 | 503 | 504 | 505 | 506 | 507 | 508 | 509 | 510 | 511 |
| dec value | 4096 | 4096 | 4096 | 4096 | 4096 | 4096 | 4096 | 4096 | 4096 | 4096 | 4096 | 4096 | 4096 | 4096 | 4096 | 4096 |

Huffman Decode Table 430B

| | | | | | | | | | | | | | | | | | |
|---|---|---|---|---|---|---|---|---|---|---|---|---|---|---|---|---|---|
| array val | 0 | 1 | 2 | 3 | 4 | 5 | 6 | 7 | 8 | 9 | 10 | 11 | 12 | 13 | 14 | 15 | |
| dec value | 0 | 27127 | 27126 | 27123 | 27121 | 27111 | 27110 | 27107 | 27102 | 27095 | 27094 | 27093 | 27091 | 27087 | 27086 | 27079 | |
| array val | 16 | 17 | 18 | 19 | 20 | 21 | 22 | 23 | 24 | 25 | 26 | 27 | 28 | 29 | 30 | 31 | |
| dec value | 27078 | 27077 | 27075 | 27074 | 27047 | 27039 | 27038 | 27031 | 27030 | 27022 | 27021 | 27015 | 27014 | 27012 | 27006 | 26967 | 26951 |
| array val | 32 | 33 | 34 | 35 | 36 | 37 | 38 | 39 | 40 | 41 | 42 | 43 | 44 | 45 | 46 | 47 | |
| dec value | 26943 | 26927 | 26895 | 26887 | 26815 | 26814 | 26807 | 26750 | 26748 | 26746 | 26695 | 26686 | 26682 | 26680 | 27124 | 27109 | |
| array val | 48 | 49 | 50 | 51 | 52 | 53 | 54 | 55 | 56 | 57 | 58 | 59 | 60 | 61 | 62 | 63 | |
| dec value | 27108 | 27103 | 27100 | 27092 | 27089 | 27084 | 27082 | 27076 | 27064 | 27050 | 27023 | 27020 | 27019 | 27013 | 26959 | 26911 | |
| array val | 64 | 65 | 66 | 67 | 68 | 69 | 70 | 71 | 72 | 73 | 74 | 75 | 76 | 77 | 78 | 79 | |
| dec value | 26903 | 26855 | 26791 | 26775 | 26759 | 26711 | 26684 | 26679 | 27125 | 27118 | 27106 | 27085 | 27083 | 27073 | 27071 | 27037 | |
| array val | 80 | 81 | 82 | 83 | 84 | 85 | 86 | 87 | 88 | 89 | 90 | 91 | 92 | 93 | 94 | 95 | |
| dec value | 27034 | 27018 | 27011 | 27009 | 26998 | 26942 | 26878 | 26839 | 26823 | 26808 | 26743 | 26687 | 26685 | 26647 | 27134 | 27090 | |
| array val | 96 | 97 | 98 | 99 | 100 | 101 | 102 | 103 | 104 | 105 | 106 | 107 | 108 | 109 | 110 | 111 | |
| dec value | 27036 | 27029 | 27025 | 27017 | 27010 | 27004 | 26958 | 26950 | 26831 | 26830 | 26805 | 26803 | 26767 | 26742 | 26727 | 26703 | |
| array val | 112 | 113 | 114 | 115 | 116 | 117 | 118 | 119 | 120 | 121 | 122 | 123 | 124 | 125 | 126 | 127 | |
| dec value | 26663 | 27116 | 27114 | 27105 | 27098 | 27057 | 27055 | 27045 | 27035 | 27027 | 26992 | 26983 | 26966 | 26941 | 26933 | 26919 | |
| array val | 128 | 129 | 130 | 131 | 132 | 133 | 134 | 135 | 136 | 137 | 138 | 139 | 140 | 141 | 142 | 143 | |
| dec value | 26871 | 26811 | 26766 | 26741 | 26877 | 27132 | 27120 | 27070 | 27069 | 27059 | 26975 | 26949 | 26894 | 26813 | 26812 | 26810 | |
| array val | 144 | 145 | 146 | 147 | 148 | 149 | 150 | 151 | 152 | 153 | 154 | 155 | 156 | 157 | 158 | 159 | |
| dec value | 26798 | 26734 | 26678 | 26639 | 26638 | 27128 | 27067 | 27052 | 27043 | 27016 | 26963 | 26876 | 26870 | 26847 | 26744 | 26737 | |

- 64 -

| | | | | | | | | | | | | | | | | |
|---|---|---|---|---|---|---|---|---|---|---|---|---|---|---|---|---|
| array val | 160 | 161 | 162 | 163 | 164 | 165 | 166 | 167 | 168 | 169 | 170 | 171 | 172 | 173 | 174 | 175 |
| dec value | 26683 | 26675 | 26631 | 27072 | 26974 | 26939 | 26935 | 26718 | 27119 | 27104 | 27065 | 26886 | 26874 | 26822 | 26758 | 26673 |
| array val | 176 | 177 | 178 | 179 | 180 | 181 | 182 | 183 | 184 | 185 | 186 | 187 | 188 | 189 | 190 | 191 |
| dec value | 26670 | 26654 | 27066 | 27063 | 27051 | 26965 | 26926 | 26922 | 26747 | 26736 | 26681 | 27122 | 27033 | 27032 | 27000 | 26976 |
| array val | 192 | 193 | 194 | 195 | 196 | 197 | 198 | 199 | 200 | 201 | 202 | 203 | 204 | 205 | 206 | 207 |
| dec value | 26783 | 27101 | 27041 | 26940 | 26739 | 27099 | 26994 | 26981 | 26947 | 26938 | 26931 | 26867 | 26745 | 26668 | 27068 | 26996 |
| array val | 208 | 209 | 210 | 211 | 212 | 213 | 214 | 215 | 216 | 217 | 218 | 219 | 220 | 221 | 222 | 223 |
| dec value | 26961 | 26929 | 26920 | 26910 | 26902 | 26749 | 26740 | 26702 | 26655 | 27112 | 27054 | 27053 | 27002 | 26892 | 26868 | 26774 |
| array val | 224 | 225 | 226 | 227 | 228 | 229 | 230 | 231 | 232 | 233 | 234 | 235 | 236 | 237 | 238 | 239 |
| dec value | 26672 | 27088 | 27049 | 26999 | 26924 | 26862 | 26782 | 27115 | 27028 | 26977 | 26937 | 26879 | 26872 | 26869 | 26846 | 26801 |
| array val | 240 | 241 | 242 | 243 | 244 | 245 | 246 | 247 | 248 | 249 | 250 | 251 | 252 | 253 | 254 | 255 |
| dec value | 26794 | 26738 | 26993 | 26865 | 26666 | 27061 | 26936 | 26719 | 26630 | 27130 | 26982 | 27135 | 26990 | 26796 | 26866 | 26864 |
| array val | 256 | 257 | 258 | 259 | 260 | 261 | 262 | 263 | 264 | 265 | 266 | 267 | 268 | 269 | 270 | 271 |
| dec value | 26809 | 26694 | 27117 | 27007 | 26978 | 26732 | 26979 | 26821 | 26751 | 26730 | 26995 | 26901 | 26863 | 27096 | 27097 | 27046 |
| array val | 272 | 273 | 274 | 275 | 276 | 277 | 278 | 279 | 280 | 281 | 282 | 283 | 284 | 285 | 286 | 287 |
| dec value | 26877 | 27026 | 26980 | 26972 | 27129 | 26890 | 26960 | 26806 | 26676 | 27133 | 27048 | 26962 | 26875 | 26908 | 26792 | 26735 |
| array val | 288 | 289 | 290 | 291 | 292 | 293 | 294 | 295 | 296 | 297 | 298 | 299 | 300 | 301 | 302 | 303 |
| dec value | 26873 | 26858 | 27080 | 26923 | 27008 | 26991 | 26925 | 26986 | 26945 | 27131 | 27081 | 26997 | 26885 | 26988 | 26860 | 27113 |
| array val | 304 | 305 | 306 | 307 | 308 | 309 | 310 | 311 | 312 | 313 | 314 | 315 | 316 | 317 | 318 | 319 |
| dec value | 26904 | 26799 | 26674 | 26956 | 26921 | 26838 | 26790 | 26884 | 27042 | 26659 | 27003 | 26934 | 26906 | 26709 | 26646 | 27056 |
| array val | 320 | 321 | 322 | 323 | 324 | 325 | 326 | 327 | 328 | 329 | 330 | 331 | 332 | 333 | 334 | 335 |
| dec value | 26721 | 26657 | 26837 | 27062 | 26946 | 26789 | 26793 | 27005 | 26917 | 26800 | 26664 | 26889 | 26773 | 26693 | 26795 | 26785 |
| array val | 336 | 337 | 338 | 339 | 340 | 341 | 342 | 343 | 344 | 345 | 346 | 347 | 348 | 349 | 350 | 351 |
| dec value | 26852 | 27001 | 26913 | 26918 | 26645 | 27060 | 26802 | 26764 | 26723 | 26957 | 26928 | 26888 | 26848 | 27058 | 26883 | 26893 |
| array val | 352 | 353 | 354 | 355 | 356 | 357 | 358 | 359 | 360 | 361 | 362 | 363 | 364 | 365 | 366 | 367 |
| dec value | 26915 | 26804 | 26854 | 26710 | 26899 | 27044 | 26871 | 26970 | 26891 | 26787 | 26661 | 26757 | 26665 | 26849 | 26650 | 27040 |
| array val | 368 | 369 | 370 | 371 | 372 | 373 | 374 | 375 | 376 | 377 | 378 | 379 | 380 | 381 | 382 | 383 |
| dec value | 26778 | 26948 | 26844 | 26720 | 26707 | 26835 | 26662 | 26881 | 26930 | 26984 | 26905 | 26728 | 26716 | 26973 | 26667 | 26780 |
| array val | 384 | 385 | 386 | 387 | 388 | 389 | 390 | 391 | 392 | 393 | 394 | 395 | 396 | 397 | 398 | 399 |
| dec value | 26856 | 26964 | 26725 | 26932 | 26909 | 27024 | 26954 | 26907 | 26850 | 26828 | 26629 | 26851 | 26636 | 26897 | 26897 | 26897 |
| array val | 400 | 401 | 402 | 403 | 404 | 405 | 406 | 407 | 408 | 409 | 410 | 411 | 412 | 413 | 414 | 415 |

| | | | | | | | | | | | | | | | | |
|---|---|---|---|---|---|---|---|---|---|---|---|---|---|---|---|---|
| dec value | 20582 | 20582 | 20582 | 20582 | 20582 | 20582 | 20582 | 20582 | 20689 | 20689 | 20689 | 20689 | 20689 | 20689 | 20689 | 20689 |
| array val | 416 | 417 | 418 | 419 | 420 | 421 | 422 | 423 | 424 | 425 | 426 | 427 | 428 | 429 | 430 | 431 |
| dec value | 20709 | 20709 | 20709 | 20709 | 20709 | 20709 | 20709 | 20709 | 20632 | 20632 | 20632 | 20632 | 20632 | 20632 | 20632 | 20632 |
| array val | 432 | 433 | 434 | 435 | 436 | 437 | 438 | 439 | 440 | 441 | 442 | 443 | 444 | 445 | 446 | 447 |
| dec value | 20824 | 20824 | 20824 | 20824 | 20824 | 20824 | 20824 | 20824 | 20499 | 20499 | 20499 | 20499 | 20499 | 20499 | 20499 | 20499 |
| array val | 448 | 449 | 450 | 451 | 452 | 453 | 454 | 455 | 456 | 457 | 458 | 459 | 460 | 461 | 462 | 463 |
| dec value | 20738 | 20738 | 20738 | 20738 | 20738 | 20738 | 20738 | 20738 | 20578 | 20578 | 20578 | 20578 | 20578 | 20578 | 20578 | 20578 |
| array val | 464 | 465 | 466 | 467 | 468 | 469 | 470 | 471 | 472 | 473 | 474 | 475 | 476 | 477 | 478 | 479 |
| dec value | 20618 | 20618 | 20618 | 20618 | 20618 | 20618 | 20618 | 20618 | 20800 | 20800 | 20800 | 20800 | 20800 | 20800 | 20800 | 20800 |
| array val | 480 | 481 | 482 | 483 | 484 | 485 | 486 | 487 | 488 | 489 | 490 | 491 | 492 | 493 | 494 | 495 |
| dec value | 20675 | 20675 | 20675 | 20675 | 20675 | 20675 | 20675 | 20675 | 20570 | 20570 | 20570 | 20570 | 20570 | 20570 | 20570 | 20570 |
| array val | 496 | 497 | 498 | 499 | 500 | 501 | 502 | 503 | 504 | 505 | 506 | 507 | 508 | 509 | 510 | 511 |
| dec value | 20556 | 20556 | 20556 | 20556 | 20556 | 20556 | 20556 | 20556 | 20512 | 20512 | 20512 | 20512 | 20512 | 20512 | 20512 | 20512 |
| array val | 512 | 513 | 514 | 515 | 516 | 517 | 518 | 519 | 520 | 521 | 522 | 523 | 524 | 525 | 526 | 527 |
| dec value | 20708 | 20708 | 20708 | 20708 | 20708 | 20708 | 20708 | 20708 | 20633 | 20633 | 20633 | 20633 | 20633 | 20633 | 20633 | 20633 |
| array val | 528 | 529 | 530 | 531 | 532 | 533 | 534 | 535 | 536 | 537 | 538 | 539 | 540 | 541 | 542 | 543 |
| dec value | 20756 | 20756 | 20756 | 20756 | 20756 | 20756 | 20756 | 20756 | 20612 | 20612 | 20612 | 20612 | 20612 | 20612 | 20612 | 20612 |
| array val | 544 | 545 | 546 | 547 | 548 | 549 | 550 | 551 | 552 | 553 | 554 | 555 | 556 | 557 | 558 | 559 |
| dec value | 20585 | 20585 | 20585 | 20585 | 20585 | 20585 | 20585 | 20585 | 20811 | 20811 | 20811 | 20811 | 20811 | 20811 | 20811 | 20811 |
| array val | 560 | 561 | 562 | 563 | 564 | 565 | 566 | 567 | 568 | 569 | 570 | 571 | 572 | 573 | 574 | 575 |
| dec value | 20808 | 20808 | 20808 | 20808 | 20808 | 20808 | 20808 | 20808 | 20698 | 20698 | 20698 | 20698 | 20698 | 20698 | 20698 | 20698 |
| array val | 576 | 577 | 578 | 579 | 580 | 581 | 582 | 583 | 584 | 585 | 586 | 587 | 588 | 589 | 590 | 591 |
| dec value | 20587 | 20587 | 20587 | 20587 | 20587 | 20587 | 20587 | 20587 | 20685 | 20685 | 20685 | 20685 | 20685 | 20685 | 20685 | 20685 |
| array val | 592 | 593 | 594 | 595 | 596 | 597 | 598 | 599 | 600 | 601 | 602 | 603 | 604 | 605 | 606 | 607 |
| dec value | 20627 | 20627 | 20627 | 20627 | 20627 | 20627 | 20627 | 20627 | 20676 | 20676 | 20676 | 20676 | 20676 | 20676 | 20676 | 20676 |
| array val | 608 | 609 | 610 | 611 | 612 | 613 | 614 | 615 | 616 | 617 | 618 | 619 | 620 | 621 | 622 | 623 |
| dec value | 20682 | 20682 | 20682 | 20682 | 20682 | 20682 | 20682 | 20682 | 20635 | 20635 | 20635 | 20635 | 20635 | 20635 | 20635 | 20635 |
| array val | 624 | 625 | 626 | 627 | 628 | 629 | 630 | 631 | 632 | 633 | 634 | 635 | 636 | 637 | 638 | 639 |
| dec value | 20561 | 20561 | 20561 | 20561 | 20561 | 20561 | 20561 | 20561 | 20690 | 20690 | 20690 | 20690 | 20690 | 20690 | 20690 | 20690 |
| array val | 640 | 641 | 642 | 643 | 644 | 645 | 646 | 647 | 648 | 649 | 650 | 651 | 652 | 653 | 654 | 655 |
| dec value | 20827 | 20827 | 20827 | 20827 | 20827 | 20827 | 20827 | 20827 | 20688 | 20688 | 20688 | 20688 | 20688 | 20688 | 20688 | 20688 |

- 66 -

| array val | 656 | 657 | 658 | 659 | 660 | 661 | 662 | 663 | 664 | 665 | 666 | 667 | 668 | 669 | 670 | 671 |
|---|---|---|---|---|---|---|---|---|---|---|---|---|---|---|---|---|
| dec value | 20841 | 20841 | 20841 | 20841 | 20841 | 20841 | 20841 | 20841 | 20674 | 20674 | 20674 | 20674 | 20674 | 20674 | 20674 | 20674 |
| array val | 672 | 673 | 674 | 675 | 676 | 677 | 678 | 679 | 680 | 681 | 682 | 683 | 684 | 685 | 686 | 687 |
| dec value | 20843 | 20843 | 20843 | 20843 | 20843 | 20843 | 20843 | 20843 | 20717 | 20717 | 20717 | 20717 | 20717 | 20717 | 20717 | 20717 |
| array val | 688 | 689 | 690 | 691 | 692 | 693 | 694 | 695 | 696 | 697 | 698 | 699 | 700 | 701 | 702 | 703 |
| dec value | 20514 | 20514 | 20514 | 20514 | 20514 | 20514 | 20514 | 20514 | 20673 | 20673 | 20673 | 20673 | 20673 | 20673 | 20673 | 20673 |
| array val | 704 | 705 | 706 | 707 | 708 | 709 | 710 | 711 | 712 | 713 | 714 | 715 | 716 | 717 | 718 | 719 |
| dec value | 20653 | 20653 | 20653 | 20653 | 20653 | 20653 | 20653 | 20653 | 20768 | 20768 | 20768 | 20768 | 20768 | 20768 | 20768 | 20768 |
| array val | 720 | 721 | 722 | 723 | 724 | 725 | 726 | 727 | 728 | 729 | 730 | 731 | 732 | 733 | 734 | 735 |
| dec value | 20557 | 20557 | 20557 | 20557 | 20557 | 20557 | 20557 | 20557 | 20504 | 20504 | 20504 | 20504 | 20504 | 20504 | 20504 | 20504 |
| array val | 736 | 737 | 738 | 739 | 740 | 741 | 742 | 743 | 744 | 745 | 746 | 747 | 748 | 749 | 750 | 751 |
| dec value | 20589 | 20589 | 20589 | 20589 | 20589 | 20589 | 20589 | 20589 | 20825 | 20825 | 20825 | 20825 | 20825 | 20825 | 20825 | 20825 |
| array val | 752 | 753 | 754 | 755 | 756 | 757 | 758 | 759 | 760 | 761 | 762 | 763 | 764 | 765 | 766 | 767 |
| dec value | 20621 | 20621 | 20621 | 20621 | 20621 | 20621 | 20621 | 20621 | 20611 | 20611 | 20611 | 20611 | 20611 | 20611 | 20611 | 20611 |
| array val | 768 | 769 | 770 | 771 | 772 | 773 | 774 | 775 | 776 | 777 | 778 | 779 | 780 | 781 | 782 | 783 |
| dec value | 20640 | 20640 | 20640 | 20640 | 20640 | 20640 | 20640 | 20640 | 20715 | 20715 | 20715 | 20715 | 20715 | 20715 | 20715 | 20715 |
| array val | 784 | 785 | 786 | 787 | 788 | 789 | 790 | 791 | 792 | 793 | 794 | 795 | 796 | 797 | 798 | 799 |
| dec value | 20548 | 20548 | 20548 | 20548 | 20548 | 20548 | 20548 | 20548 | 20619 | 20619 | 20619 | 20619 | 20619 | 20619 | 20619 | 20619 |
| array val | 800 | 801 | 802 | 803 | 804 | 805 | 806 | 807 | 808 | 809 | 810 | 811 | 812 | 813 | 814 | 815 |
| dec value | 20484 | 20484 | 20484 | 20484 | 20484 | 20484 | 20484 | 20484 | 20493 | 20493 | 20493 | 20493 | 20493 | 20493 | 20493 | 20493 |
| array val | 816 | 817 | 818 | 819 | 820 | 821 | 822 | 823 | 824 | 825 | 826 | 827 | 828 | 829 | 830 | 831 |
| dec value | 20617 | 20617 | 20617 | 20617 | 20617 | 20617 | 20617 | 20617 | 20580 | 20580 | 20580 | 20580 | 20580 | 20580 | 20580 | 20580 |
| array val | 832 | 833 | 834 | 835 | 836 | 837 | 838 | 839 | 840 | 841 | 842 | 843 | 844 | 845 | 846 | 847 |
| dec value | 20713 | 20713 | 20713 | 20713 | 20713 | 20713 | 20713 | 20713 | 20845 | 20845 | 20845 | 20845 | 20845 | 20845 | 20845 | 20845 |
| array val | 848 | 849 | 850 | 851 | 852 | 853 | 854 | 855 | 856 | 857 | 858 | 859 | 860 | 861 | 862 | 863 |
| dec value | 20809 | 20809 | 20809 | 20809 | 20809 | 20809 | 20809 | 20809 | 20770 | 20770 | 20770 | 20770 | 20770 | 20770 | 20770 | 20770 |
| array val | 864 | 865 | 866 | 867 | 868 | 869 | 870 | 871 | 872 | 873 | 874 | 875 | 876 | 877 | 878 | 879 |
| dec value | 20516 | 20516 | 20516 | 20516 | 20516 | 20516 | 20516 | 20516 | 20754 | 20754 | 20754 | 20754 | 20754 | 20754 | 20754 | 20754 |
| array val | 880 | 881 | 882 | 883 | 884 | 885 | 886 | 887 | 888 | 889 | 890 | 891 | 892 | 893 | 894 | 895 |
| dec value | 20736 | 20736 | 20736 | 20736 | 20736 | 20736 | 20736 | 20736 | 20525 | 20525 | 20525 | 20525 | 20525 | 20525 | 20525 | 20525 |

- 67 -

| | | | | | | | | | | | | | | | | |
|---|---|---|---|---|---|---|---|---|---|---|---|---|---|---|---|---|
| array val | 896 | 897 | 898 | 899 | 900 | 901 | 902 | 903 | 904 | 905 | 906 | 907 | 908 | 909 | 910 | 911 |
| dec value | 20644 | 20644 | 20644 | 20644 | 20644 | 20644 | 20644 | 20644 | 20616 | 20616 | 20616 | 20616 | 20616 | 20616 | 20616 | 20616 |
| array val | 912 | 913 | 914 | 915 | 916 | 917 | 918 | 919 | 920 | 921 | 922 | 923 | 924 | 925 | 926 | 927 |
| dec value | 20625 | 20625 | 20625 | 20625 | 20625 | 20625 | 20625 | 20625 | 20547 | 20547 | 20547 | 20547 | 20547 | 20547 | 20547 | 20547 |
| array val | 928 | 929 | 930 | 931 | 932 | 933 | 934 | 935 | 936 | 937 | 938 | 939 | 940 | 941 | 942 | 943 |
| dec value | 20490 | 20490 | 20490 | 20490 | 20490 | 20490 | 20490 | 20490 | 20772 | 20772 | 20772 | 20772 | 20772 | 20772 | 20772 | 20772 |
| array val | 944 | 945 | 946 | 947 | 948 | 949 | 950 | 951 | 952 | 953 | 954 | 955 | 956 | 957 | 958 | 959 |
| dec value | 20637 | 20637 | 20637 | 20637 | 20637 | 20637 | 20637 | 20637 | 20701 | 20701 | 20701 | 20701 | 20701 | 20701 | 20701 | 20701 |
| array val | 960 | 961 | 962 | 963 | 964 | 965 | 966 | 967 | 968 | 969 | 970 | 971 | 972 | 973 | 974 | 975 |
| dec value | 20692 | 20692 | 20692 | 20692 | 20692 | 20692 | 20692 | 20692 | 20696 | 20696 | 20696 | 20696 | 20696 | 20696 | 20696 | 20696 |
| array val | 976 | 977 | 978 | 979 | 980 | 981 | 982 | 983 | 984 | 985 | 986 | 987 | 988 | 989 | 990 | 991 |
| dec value | 20505 | 20505 | 20505 | 20505 | 20505 | 20505 | 20505 | 20505 | 20752 | 20752 | 20752 | 20752 | 20752 | 20752 | 20752 | 20752 |
| array val | 992 | 993 | 994 | 995 | 996 | 997 | 998 | 999 | 1000 | 1001 | 1002 | 1003 | 1004 | 1005 | 1006 | 1007 |
| dec value | 20497 | 20497 | 20497 | 20497 | 20497 | 20497 | 20497 | 20497 | 20554 | 20554 | 20554 | 20554 | 20554 | 20554 | 20554 | 20554 |
| array val | 1008 | 1009 | 1010 | 1011 | 1012 | 1013 | 1014 | 1015 | 1016 | 1017 | 1018 | 1019 | 1020 | 1021 | 1022 | 1023 |
| dec value | 20642 | 20642 | 20642 | 20642 | 20642 | 20642 | 20642 | 20642 | 20683 | 20683 | 20683 | 20683 | 20683 | 20683 | 20683 | 20683 |

What is claimed is:

1. A video compression system for compressing a digital video stream of N-bit datums, each of said datums corresponding to one pixel in a video image with an associated column index (i) and row index (j) and including Q M-bit subcomponents representing respective source values of Q elements of said one pixel, said datums appearing in said stream in raster order, said, system comprising:

a first lookup table with at least $2^{2M}$ first entries, each of said first entries storing a P-bit first category value and a M-bit first output value and being uniquely associated with a M-bit previous value and M-bit source value, said first lookup table being configured to read out a first particular entry's first category and output values upon receiving as a readout address said first particular entry's associated previous and source values and a first table select signal, said read out first category representing a compressed version of said associated source value;

a second lookup table with at least $2^{2M}$ second entries, each of said second entries storing a P-bit second category value and a M-bit second output value and being uniquely associated with a M-bit previous value and M-bit source value, said second lookup table being configured to read out a second particular entry's second category and output values upon receiving as a readout address said second particular entry's associated previous and source values and a second table select signal, the rows of said second lookup table being a reflection of corresponding rows of said first lookup table about the columns of said corresponding first table rows for which said first category is 0; said read out second category representing a compressed version of said associated source value;

an address circuit coupled to said lookup tables that computes and provides said previous value, said address circuit being configured to compute said previous value as a function of output values of selected previous pixel elements according to a first formula when said first table select signal is available and according to a second formula when said second table select signal is available;

an output circuit coupled to said lookup tables that is configured to receive and store said P-bit category values for all of said Q elements of said one pixel, said output circuit also being configured to output a single Q×P-bit combined category representing said Q category values for said one pixel; and a first state machine that controls and coordinates operations of said lookup tables, said address circuit, and said output circuit, said first state machine being configured to provide said first table select signal and said second table select signal so that said first and second lookup tables and said first and second formulas are used to readout said category and output values for alternating pixels, thereby reducing color banding in said video images reconstructed from said combined category information, and to cause said output circuit to store and output said Q×P-bit combined category for said one pixel.

2. The video compression system of claim 1, wherein said address circuit comprises:

a last value register with Q last value segments coupled to said lookup tables, said last value register being configured to write into a selected one of said Q last value segments said output value read out from either one of said tables and read out said last value segments;

one-row storage with at least i entries, each having Q one-row segments, said one-row storage being configured to write into a selected one of said i entries at a selected one of said Q one-row segments said output value read out from either one of said tables;

a selector coupled to said last value register and said one-row storage that selects said one of said Q one-row segments and said one of said Q last value segments;

an averager that averages a M-bit last value selected from one of said read out last value segments and a particular 5-bit value read out by said one row storage, said particular value corresponding to the output value associated with one selected element of a pixel having the same column index (i) as and a row index (j−1) that is one less than the row index (j) of the most recent pixel represented in said data stream, said last value and said particular value representing the same pixel element type.

3. The video compression system of claim 1, wherein said elements comprise red, green and blue pixel elements and each of said M-bit subcomponents encodes the intensity of a respective one of said pixel elements, further comprising:

a set of multiplexers, each of said multiplexers being coupled to three inputs carrying M-bit red, green and blue information and a RGB select signal generated by said first state machine that determines which of said information signals is selected and output by said multiplexer; said set of multiplexers including:

a first multiplexer coupled to the output of said last value register that provides said M-bit last value; and a second multiplexer coupled to the output of said one-row storage that provides said M-bit particular output value.

4. The video compression system of claim 3, further comprising:

a sub-sampler that is configured to eliminate a fixed percentage of datums from said video stream before said datums are processed, said sub-sampler having an input coupled to said video stream and an output coupled to a third multiplexer;

said third multiplexer having an additional input coupled to said RGB select signals and an output coupled to said input table so that said third multiplexer passes one of the red, green or blue information as said source value.

5. The video compression system of claim 1, further comprising:

a Huffman encode table having at least $2^{Q \times P}$ entries, each of said entries including:

a Huffman data field for storing a variable-length Huffman value for one of said combined categories; and a Huffman bits field for storing a Huffman bit count representing the total bits in said Huffman value;

said Huffman encode table being coupled to said output circuit and being configured to read out a Huffman value and Huffman bit count associated with said combined category output by said output circuit;

said Huffman values being allocated to ones of said combined categories so that said ones more likely to occur in a video frame are allocated in said Huffman encode table with Huffman values having fewer bits, said Huffman encode table thereby providing additional data compression of data in said video frame above that provided by said first lookup table.

6. The video compression system of claim 5, further comprising:

a Huffman decode table that is configured to receive and decode a compressed data stream in X-bit chunks, where X represents the number of bits in the longest of said Huffman values, said compressed data stream including plural compressed datums, each of which corresponds to one of said Huffman values read out from said Huffman encode table, each said chunk including at least one Huffman value aligned with the most significant bit position of said chunk;

said Huffman decode table having at least $2^X$ entries, each including said combined category and said Huffman bits data associated with a Huffman value that is mapped to said entry's X-bit address;

said Huffman decode table also being configured to read out said combined category and said Huffman bits data in said entry indexed by said fixed-length chunk input to said Huffman decode table, said Huffman decode table being structured so that a set of Huffman decode table entries with a said X-bit address whose most significant Z bits matches a Z-bit Huffman value include the same said combined data and said Huffman bits data, said same data being associated in said Huffman encode table with said Z-bit Huffman value;

such that said same data is read out from any one of said entries when said most significant Z bits of said fixed length chunk match said Z bits, thereby allowing Huffman data to be decoded in a single lookup.

7. The compression system of claim 6, wherein said Huffman encode table comprises a first and second Huffman decode table;

said first Huffman decode table having $2^B$ entries addressable by B-bit addresses that correspond to the most significant B bits of said X-bit lookup addresses, each of said B-bit addresses addressing a respective first Huffman decode table entry whose combined data and Huffman bits data are the same as said entry in said Huffman encode table addressed by an X-bit lookup address with the same most significant B bits; and said second Huffman decode table having $2^C$ entries addressable by C-bit addresses that correspond to the least significant C bits of said X-bit lookup addresses; each of said C-bit addresses addressing a respective second Huffman decode table entry whose combined data and Huffman bits data are the same as said entry in said Huffman encode table addressed by an X-bit lookup address with the same least significant C bits and most significant (X–C) bits that are all zero, C being less than X, and the sum of $2^C$ and $2^B$ being less than $2^X$;

said first and second Huffman decode tables thereby occupying less space than said Huffman decode table; said Huffman values being selected so that all Huffman values that are mapped to X-bit addresses in said second table have (X–C) most significant bits that are all zero.

8. The compression system of claim 6, further comprising:

first and second lookup decode tables corresponding to said first and second lookup tables, said lookup decode tables being configured to output an M-bit output value to a lookup address including a P-bit category output by said Huffman decode table as part of said combined categories and a corresponding M-bit output value from a previously-decompressed neighboring pixel;

said first and second lookup decode tables respectively being used to convert said P-bit categories for alternating pixels, said lookup decode tables corresponding respectively to said first and second lookup tables;

said M-bit output values for a single pixel being collected into a N-bit reconstructed pixel datum that can be displayed as part of a reconstructed video stream.

* * * * *